(12) United States Patent
Hooper et al.

(10) Patent No.: US 8,598,490 B2
(45) Date of Patent: Dec. 3, 2013

(54) METHODS AND SYSTEMS FOR LASER PROCESSING A WORKPIECE USING A PLURALITY OF TAILORED LASER PULSE SHAPES

(75) Inventors: Andrew Hooper, Portland, OR (US); David Barsic, Portland, OR (US); Kelly J. Bruland, Portland, OR (US); Daragh S. Finn, Beaverton, OR (US); Lynn Sheehan, Vancouver, WA (US); Xiaoyuan Peng, Portland, OR (US); Yasu Osako, Lake Oswego, OR (US); Jim Dumestre, Tigard, OR (US); William J. Jordens, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 195 days.

(21) Appl. No.: 13/076,810

(22) Filed: Mar. 31, 2011

(65) Prior Publication Data

US 2011/0298156 A1    Dec. 8, 2011

Related U.S. Application Data

(63) Continuation-in-part of application No. 12/060,076, filed on Mar. 31, 2008.

(51) Int. Cl.
*H01L 21/78* (2006.01)

(52) U.S. Cl.
USPC ............... 219/121.69; 219/121.77; 438/463; 264/400; 264/482

(58) Field of Classification Search
USPC ............ 438/68, 110, 113, 463; 264/400, 482; 219/121.69, 121.77; 372/25
See application file for complete search history.

(56) References Cited

U.S. PATENT DOCUMENTS

| 5,004,890 A | 4/1991 | Lim |
| 5,376,770 A | 12/1994 | Kuhl et al. |

(Continued)

FOREIGN PATENT DOCUMENTS

| CN | 101103500 A | 1/2008 |
| WO | 2008014331 A2 | 1/2008 |

OTHER PUBLICATIONS

Notification of Transmittal of the International Search Report and the Written Opinion of the International Searching Authority, or the Declaration for PCT/US2012/030368, filed Mar. 23, 2012.

(Continued)

*Primary Examiner* — Samuel M Heinrich
(74) *Attorney, Agent, or Firm* — Stoel Rives LLP

(57) ABSTRACT

Tailored laser pulse shapes are used for processing workpieces. Laser dicing of semiconductor device wafers on die-attach film (DAF), for example, may use different tailored laser pulse shapes for scribing device layers down to a semiconductor substrate, dicing the semiconductor substrate, cutting the underlying DAF, and/or post processing of the upper die edges to increase die break strength. Different mono-shape laser pulse trains may be used for respective recipe steps or passes of a laser beam over a scribe line. In another embodiment, scribing a semiconductor device wafer includes only a single pass of a laser beam along a scribe line using a mixed-shape laser pulse train that includes at least two laser pulses that are different than one another. In addition, or in other embodiments, one or more tailored pulse shapes may be selected and provided to the workpiece on-the-fly. The selection may be based on sensor feedback.

27 Claims, 29 Drawing Sheets

(56) References Cited

U.S. PATENT DOCUMENTS

| | | | |
|---|---|---|---|
| 5,642,374 A | 6/1997 | Wakabayashi et al. | |
| 6,054,235 A | 4/2000 | Bryan et al. | |
| 6,243,405 B1 | 6/2001 | Borneis et al. | |
| 6,281,471 B1 | 8/2001 | Smart | |
| 6,479,788 B1 | 11/2002 | Arai et al. | |
| 6,574,250 B2 | 6/2003 | Sun et al. | |
| 6,595,985 B1 | 7/2003 | Tobinick | |
| 6,661,820 B1 | 12/2003 | Camilleri et al. | |
| 6,693,031 B2 * | 2/2004 | Advocate et al. | 438/665 |
| 6,727,458 B2 | 4/2004 | Smart | |
| 6,961,355 B1 | 11/2005 | Yin et al. | |
| 7,126,746 B2 | 10/2006 | Sun et al. | |
| 7,173,212 B1 | 2/2007 | Semak | |
| 7,241,669 B2 * | 7/2007 | Swenson et al. | 438/463 |
| 7,244,906 B2 | 7/2007 | Jordens et al. | |
| 7,348,516 B2 | 3/2008 | Sun et al. | |
| 7,428,253 B2 | 9/2008 | Murison et al. | |
| 7,817,685 B2 | 10/2010 | Osako et al. | |
| 2002/0167581 A1 | 11/2002 | Cordingley et al. | |
| 2005/0067388 A1 | 3/2005 | Sun et al. | |
| 2005/0272184 A1 | 12/2005 | Hiramatsu et al. | |
| 2006/0126678 A1 | 6/2006 | Sun et al. | |
| 2006/0159138 A1 | 7/2006 | Deladurantaye et al. | |
| 2007/0045253 A1 | 3/2007 | Jordens et al. | |
| 2008/0067155 A1 | 3/2008 | Gu | |
| 2008/0164240 A1 | 7/2008 | Cordingley et al. | |
| 2008/0181269 A1 | 7/2008 | Osako et al. | |
| 2008/0203071 A1 | 8/2008 | Sun et al. | |
| 2009/0126870 A1 | 5/2009 | Zadoyan et al. | |
| 2009/0245301 A1 | 10/2009 | Peng et al. | |
| 2009/0245302 A1 | 10/2009 | Baird et al. | |
| 2010/0009550 A1 | 1/2010 | Tsujikawa et al. | |
| 2010/0276405 A1 | 11/2010 | Cho et al. | |
| 2011/0210105 A1 | 9/2011 | Romashko et al. | |

OTHER PUBLICATIONS

Office Action of Mar. 17, 2011, for U.S. Appl. No. 12/060,076, filed Mar. 31, 2008.
Office Action mailed Jun. 6, 2012, for U.S. Appl. No. 12/753,659, filed Apr. 2, 2010.
Office Action mailed Nov. 21, 2012, for U.S. Appl. No. 12/753,659, filed Apr. 2, 2010.
Office Action, mailed Jul. 27, 2011 for U.S. Appl. No. 12/060,076, filed Mar. 31, 2008.
Notice of Allowance and Fee(s) due mailed Feb. 28, 2013, for U.S. Appl. No. 12/753,659, filed Apr. 2, 2010.
Notice of Allowance and Fee(s) due mailed May 14, 2013, for U.S. Appl. No. 12/060,076, filed Mar. 31, 2008.

* cited by examiner $t_1$ = rise time
$t_2-t_1$ = spike time
$t_3-t_2$ = plateau time
$t_4-t_3$ = fall time
P1 = max amplitude
P2 = first plateau amplitude
P1, P2 adjustable $t_1$ = rise time
$t_2-t_1$ = first plateau time
$t_3-t_2$ = spike time
$t_4-t_3$ = second plateau time
$t_5-t_4$ = fall time
P1 = max amplitude
P2 = first plateau amplitude
P3 = second plateau time
P1, P2, P3 adjustable

METHODS AND SYSTEMS FOR LASER PROCESSING A WORKPIECE USING A PLURALITY OF TAILORED LASER PULSE SHAPES

RELATED APPLICATION

This application is a continuation-in-part of U.S. patent application Ser. No. 12/060,076, titled "Methods and Systems for Dynamically Generating Tailored Laser Pulses," filed Mar. 31, 2008, which is hereby incorporated by references herein.

TECHNICAL FIELD

This disclosure relates to laser processing systems. In particular, this disclosure relates to laser systems and methods for micromachining (e.g., scribing or dicing) semiconductor devices and/or severing electrically conductive links with laser pulses having shaped temporal profiles.

BACKGROUND INFORMATION

Integrated circuits (ICs) are generally fabricated in an array on or in a semiconductor substrate. ICs generally include several layers formed over the substrate. One or more of the layers may be removed along scribing lanes or streets using a mechanical saw or a laser. After scribing, the substrate may be throughcut, sometimes called diced, using a saw or laser to separate the circuit components from one another.

Laser processing systems employed for processing dynamic random access memory (DRAM) and other devices commonly use a Q-switched diode pumped solid state laser. When processing memory devices for memory repair applications, for example, a single laser pulse is commonly employed to sever an electrically conductive link structure. In another industrial application, Q-switched diode pumped solid state lasers are used to trim resistance values of discrete and embedded components.

Some laser processing systems use different operating modes to perform different functions. For example, the ESI Model 9830 available from Electro Scientific Industries, Inc. of Portland, Oreg., the assignee of the present patent application, uses a diode pumped Q-switched neodymium-doped yttrium vandate (Nd:YVO$_4$) laser operating at a pulse repetition frequency of approximately 50 kHz for laser processing of semiconductor memory and related devices. This laser system provides a pulsed laser output for processing link structures and a continuous wave (CW) laser output for scanning beam-to-work targets. As another example, the ESI Model 9835, also available from Electro Scientific Industries, Inc., uses a diode pumped Q-switched, frequency-tripled Nd:YVO$_4$ laser for laser processing semiconductor memory and related devices. This laser system uses a first pulsed laser output at a PRF of approximately 50 kHz for processing link structures and a second pulsed laser output at a PRF of approximately 90 kHz for scanning beam-to-work targets. In some systems, higher PRFs (e.g., approximately 100 kHz) are also possible. Generally, the pulse widths of laser pulses generated by such laser systems are functionally dependent on the PRF selected and are not independently adjustable based on differences between target structures or other process variables.

FIGS. 1A and 1B are example temporal pulse shapes of laser pulses generated by typical solid state lasers. The pulse shown in FIG. 1A may have been shaped by optical elements as is known in the art to produce a square-wave pulse. As shown in FIGS. 1A and 1B, a typical solid state pulse shape is well described by its peak power, pulse energy (time integration of the power curve), and pulse width measured at a full-width half-maximum (FWHM) value. Signals from a pulse detector may be used to determine pulse energy and/or peak power. The pulse detector may include a diode coupled to an analog peak capture-and-hold circuit for peak power sensing. The pulse detector may also include an analog integration circuit for pulse energy measurements.

One problem for laser processing is that the results tend to be highly material dependent. For example, one laser type (or set of laser parameters) may be ideal for cutting metals, while a different laser type (or set of laser parameters) may be ideal for cutting glass.

One example of a challenging problem is the singulation of semiconductor devices mounted on die attach film (DAF). This problem is generally addressed in production by using mechanical diamond saws with ultra-thin blades because laser dicing with known processes tend to produce a die with lower mechanical strength compared to that produced by mechanical sawing. Incorporation of fragile low-k dielectric materials into these semiconductor devices along with reduction of the silicon wafer thickness has increased the difficulty for mechanical saw dicing, leading to slower throughputs and more yield losses. Previously attempted solutions include using lasers to scribe the low-k semiconductor layers prior to mechanical saw dicing, combining laser dicing with a post-etch process to strengthen the die, or using a full-cut laser dicing system with two lasers having different pulse widths.

Unlike full-cut laser dicing, laser scribing of copper and/or low-k dielectric devices has generally been adopted by manufacturing. However, increases in scribing throughput are still desired.

SUMMARY OF THE DISCLOSURE

Tailored laser pulse shapes are used for processing workpieces. Laser dicing of semiconductor device wafers on die-attach film (DAF), for example, may use different tailored laser pulse shapes for scribing device layers down to a semiconductor substrate, dicing the semiconductor substrate, cutting the underlying DAF, and/or post processing of the upper die edges to increase die break strength. Different mono-shape laser pulse trains may be used for respective recipe steps or passes of a laser beam over a scribe line. In another embodiment, scribing a semiconductor device wafer includes only a single pass of a laser beam along a scribe line using a mixed-shape laser pulse train that includes at least two laser pulses that are different than one another. In addition, or in other embodiments, one or more tailored pulse shapes may be selected and provided to the workpiece on-the-fly. The selection may be based on sensor feedback.

In one embodiment, a method for laser dicing a workpiece uses a plurality of different temporal pulse profiles that are changed on-the-fly. The workpiece includes one or more device layers formed over a semiconductor substrate. The one or more device layers include a pattern of multiple, mutually spaced apart electronic circuit components separated by one or more streets along which a laser beam can form a kerf defined by side walls. The method includes selecting a first temporal pulse profile shape and a second temporal pulse profile shape, and generating (using a single laser source) a first laser pulse train including a sequence of laser pulses temporally shaped according to the first temporal pulse profile shape and a second laser pulse train including a sequence of laser pulses temporally shaped according to the second temporal pulse profile shape. The method further includes, in a first pass of the laser beam along a street, directing the first laser pulse train to the workpiece to remove at least a first portion of the one or more device layers along the street, and in a second pass of the laser beam along the street, directing the second laser pulse train to the workpiece to cut through the semiconductor wafer along the street.

In another embodiment, a method for laser processing a workpiece includes generating (from a single laser source) a mixed-shape laser pulse train that includes one or more first laser pulses temporally shaped according to a first temporal pulse profile shape, and one or more second laser pulses temporally shaped according to a second temporal pulse profile shape. The method further includes arranging a sequence of the one or more first laser pulses and the one or more second laser pulses in the mixed-shape laser pulse train based on a pulse repetition frequency of the single laser source, a plurality of target locations on or within the workpiece, and a motion profile of a laser beam with respect to the target locations. The method further includes in a single pass of the laser beam along the workpiece according to the motion profile, directing the one or more first laser pulses and the one or more second laser pulses to the respective target locations.

Additional aspects and advantages will be apparent from the following detailed description of preferred embodiments, which proceeds with reference to the accompanying drawings.

DETAILED DESCRIPTION OF PREFERRED EMBODIMENTS

Figure 1A:
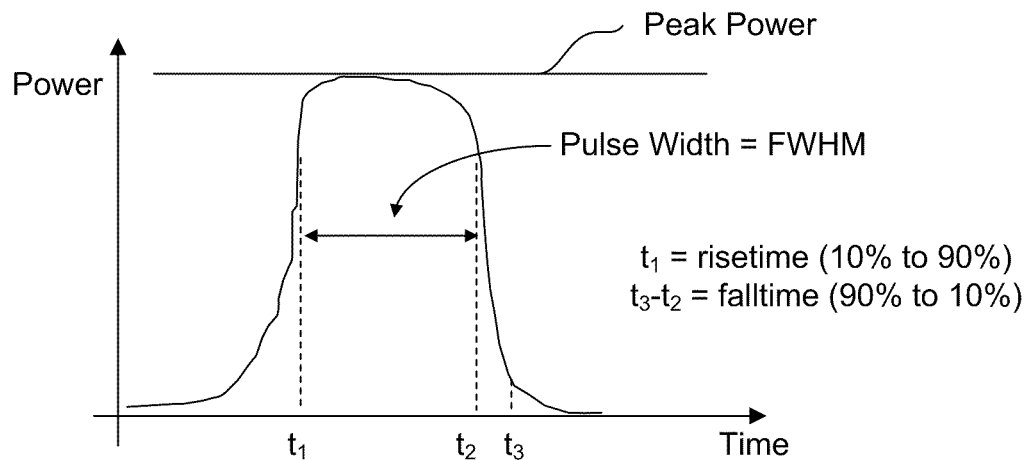
FIGS. 1A and 1B are example temporal pulse shapes of laser pulses generated by typical solid state lasers.

Laser micromachining systems and processes described herein provide high throughput laser micromachining of workpieces with good process results, including fast and efficient removal rates of materials, no chipping or cracking or other mechanical damage to the target material, control of material splash and ejected debris, no significant reduction in the material strength due to thermal damage or micro-cracking, and a process that meets cosmetic requirements (such as a smooth edge, smooth vertical or horizontal surfaces).

The term "tailored laser pulse" (also referred to herein as a shaped "temporal pulse profile") refers to a laser pulse with an adjusted or programmed (shaped) laser power or intensity with respect to time (laser intensity vs. time). Thus, a tailored laser pulse or a shaped temporal pulse profile should not be confused with spatial shaping of laser pulses (such as a top-hat spatial beam shape). Skilled persons will recognize from the disclosure herein, however, that a tailored laser pulse beam may also be spatially shaped, such as using a top-hat spatial shape with a chair-shaped temporal pulse profile for laser scribing applications. Further, as used herein, two laser pulses may be in the same family or class of tailored laser pulses, while having different temporal pulse durations or temporal pulse widths. For example, two different laser pulses may both be chair-shaped or triangle-shaped, but have different temporal pulse durations.

Generally, using tailored laser pulses to process electrically conductive links has involved using a single pre-defined tailored laser pulse shape for each workpiece, and only changing the tailored laser pulse shape (if needed) from workpiece to workpiece. Recent advancements in laser technology, however, have allowed the possibility of changing the tailored laser pulse shape as part of a recipe when processing a single workpiece. A "recipe" laser and beam position parameters such as laser spot size, laser power, repetition rate, focus offset, machining velocity, and other parameters for various steps for processing a particular workpiece. The recipe may also define areas of the workpiece that are processed with the laser energy. Recipe steps may correspond, for example, to each pass of the laser beam over a work surface defined by a galvo (galvanometer) sweep or a translation stage acceleration and/or deceleration step. Recipe steps may also be defined, for example, based on an X-Y position with respect to the work surface, such as processing different areas of a workpiece. Changing tailored laser pulse shapes "on-the-fly" based on the recipe, as disclosed herein, allows the temporal pulse profile to be tailored to different types and classes of materials that may be micromachined on a single laser processing system.

In one embodiment, full-cut laser dicing is disclosed for semiconductor device wafers on die-attach film (DAF). Tailored laser pulse shapes are changed multiple times during the dicing process. Scribing of the semiconductor device layers down to the semiconductor substrate may use a multi-pass scribe methodology with different tailored laser pulse shapes for each scribing pass (e.g., for cutting patterned materials of metals and dielectric materials). In addition, different tailored laser pulse shapes may be used for subsequent recipe steps such as dicing of the semiconductor wafer (e.g., cutting through pure silicon material without excessive thermal damage), cutting the underlying polymer DAF (with reduced melting and splashing of DAF material onto the silicon sidewall or onto the semiconductor device layer), and/or post processing of the upper die edges to increase die break strength. In certain full-cut laser dicing embodiments, different mono-shape laser pulse trains are used for respective recipe steps in a laser micromachining process. In a laser pulse train, laser pulses are delivered to a workpiece in a timed series of 1 to n pulses, where each pulse in the train corresponds to one repetition of the laser. In a mono-shape laser pulse train, each laser pulse has the same tailored laser pulse shape (within the pulse-to-pulse repeatability of the laser) as other laser pulses in the train. Thus, for a mono-shape laser pulse train according to certain embodiments, a first tailored laser pulse shape is used for a first recipe step and a second tailored laser pulse shape is used for a second recipe step.

In another embodiment, scribing of a semiconductor device wafer includes only a single pass of a laser beam along a scribe line. In certain scribing embodiments, a single predetermined family or class of tailored laser pulse shapes is used for the single pass of the laser beam along the scribe line. Different temporal pulse durations may be used for the selected class of tailored laser pulse shapes. The selected class may be based on experimentation to determine an optimal tailored laser pulse shape to process the target materials within the scribe lines of the workpiece. In other scribing embodiments, a mixed-shape laser pulse train is used for the single pass of the laser beam along the scribe line. The mixed-shape laser pulse train includes at least two laser pulses that are different than one another (e.g., a change in the class of tailored laser pulse shapes such as from square-shaped to chair-shaped, and/or a change in peak power (intensity) or temporal pulse duration within the same class of tailored laser pulse shapes). Thus, the workpiece may be scribed using a series of laser pulses with two or more different tailored laser pulse shapes in a single pass of the laser beam. In addition, or in other embodiments, different mixed-shape laser pulse trains may be used during different recipe steps performed on the same workpiece.

In addition, or in other embodiments, this disclosure describes selecting laser pulses with tailored intensity profiles based on target structures, and providing sufficient feedback and control so as to maintain a desired intensity profile. In one embodiment, a laser processing system uses multiple temporal profiles to process workpiece structures on one or more workpieces. The laser processing system may include a pulsed laser such as a fiber laser, a master oscillator fiber power amplifier (MOFPA), a tandem photonic amplifier, or a "sliced" pulse laser that uses an electro-optical modulator with programmable temporal pulse profiles that allow the laser to generate laser pulses in a wide range of shapes. The laser processing system may be configured to select a laser pulse shape on-the-fly when the laser is directed to emit a laser pulse toward a specific workpiece structure.

In certain embodiments, the laser processing system calibrates the energy per pulse and other laser parameters, such as signal propagation delays, which may vary with the programmed temporal profile. The laser processing system may be calibrated to operate reliably over a range of programmed temporal pulse profiles. Thus, in one such embodiment, the laser processing system uses a photoelectronic detection method that digitizes the pulse waveform so as to provide an accurate calibration of the energy per pulse as a function of the programmed pulse shape.

As discussed above, a typical Q-switched solid state pulse shape is well described by its peak power, pulse energy, and pulse width (e.g., FWHM). Generally, however, these metrics are not sufficient for describing the temporal pulse shapes possible with a tailored pulse laser. For example, the peak power of a spike on the power curve does not describe the height of a "seat" on the so-called chair-shaped pulse or the height of a second peak on a double spiked pulse.

Thus, in certain embodiments, the laser processing system includes feedback for parameters that typical laser processing systems do not monitor. By providing such feedback, a number of pulse shape metrics may be logged and correlated with process feedback (e.g., device yield and substrate damage). This provides a valuable tool for developing new processes and new pulse shapes to further enhance the value of the tailored pulse technology. In addition, or in other embodiments, the pulse shape metrics are used to monitor and control the pulse shapes based on the feedback.

Reference is now made to the figures in which like reference numerals refer to like elements. In the following description, numerous specific details are provided for a thorough understanding of the embodiments disclosed herein. However, those skilled in the art will recognize that the embodiments can be practiced without one or more of the specific details, or with other methods, components, or materials. Further, in some cases, well-known structures, materials, or operations are not shown or described in detail in order to avoid obscuring aspects of the embodiments. Furthermore, the described features, structures, or characteristics may be combined in any suitable manner in one or more embodiments.

I. Changing Temporal Pulse Profiles on-the-Fly

As discussed above, recent advances in laser technology have allowed the possibility of changing the tailored laser pulse shape on-the-fly, as needed or desired during laser processing of a workpiece. In certain embodiments, a single tailored laser pulse shape may be selected for an entire workpiece. In another embodiment, different mono-shape laser pulse trains may be selected for different recipe steps performed on the same workpiece. In another embodiment, a mixed-shape laser pulse train uses different tailored laser pulse shapes during a single pass of the laser beam. In another embodiment, pulse-to-pulse on-the-fly delivery of laser pulses with different tailored laser pulse shapes is based on sensor feedback.

A. Example Classes of Tailored Laser Pulse Shapes

Laser pulses with different temporal pulse profile shapes produce different process results depending on the materials being processed and the arrangement of those materials on or within a workpiece. In certain embodiments, a single class of tailored laser pulses may be used to process an entire workpiece, a specific portion of the workpiece, or a specific target material on or within the workpiece. The particular tailored laser pulse shape may be selected, based on experimentation, to determine an optimal shape for processing a target material. In addition to selecting the class of tailored laser pulses, other laser pulse parameters may also be selected for improved processing, such as peak intensity, spatial pulse shape, and/or temporal pulse duration. For example, metal and semiconductor materials can be removed faster using relatively long temporal pulse durations, while relatively shorter temporal pulse durations may be used for reducing a heat affected zone or for producing less splashy laser cuts. If, for example, both metal and dielectrics are processed in the same recipe step, a chair-shaped temporal pulse profile can provide the fast rise time and high peak power needed to cut the dielectric, while providing a long enough pulse to cut the metal. Example classes of temporal pulse profiles are discussed below.

Figure 2A:
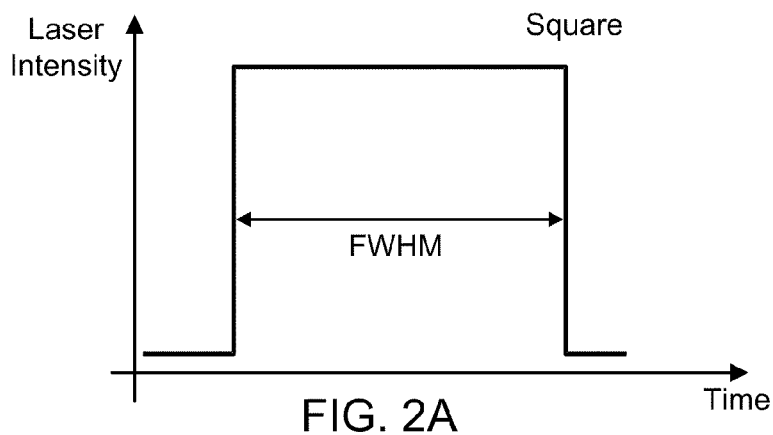
FIGS. 2A and 2B graphically illustrate example square-shaped temporal pulse profiles according to certain embodiments.
Figure 2B:
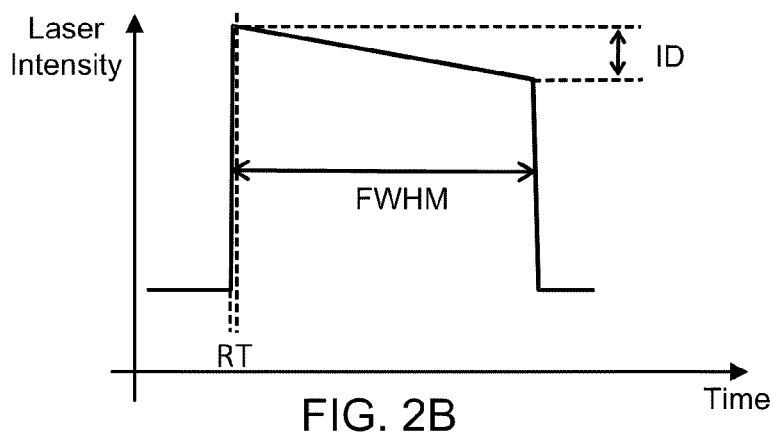

FIGS. 2A and 2B graphically illustrate example square-shaped temporal pulse profiles according to certain embodiments. As discussed above, another square-shaped temporal pulse profile is shown in FIG. 1A. The square-shaped temporal pulse profile shown in FIG. 2A includes a substantially constant peak laser intensity (e.g., the shape is "substantially square"). However, the square-shaped temporal pulse profile shown in FIG. 2B used in certain embodiments includes an intensity decline (ID) such that laser intensity slopes or decreases over time. In other embodiments, the laser intensity may increase over time. The example square-shaped temporal pulse profiles shown in FIGS. 2A and 2B both include a temporal pulse duration that is defined at the full-width half-maximum (FWHM) value. In certain embodiments, the FWHM value of the temporal pulse duration for the square-shaped temporal pulse profile may be selectively adjustable in a range between about 0.5 nanoseconds and about 150 nanoseconds. Although assumed to be substantially zero in FIG. 2A, FIG. 2B illustrates a vertical dashed line to represent a rise time RT (see, also, FIG. 1A showing a rise time $t_1$ as being a period of time where the power is between about 10% and about 90% of the peak power). In certain embodiments, the rise time RT shown in FIG. 2B is selectively adjustable in a range between about 0.1 nanoseconds to about 15 nanoseconds.

Figure 1B:
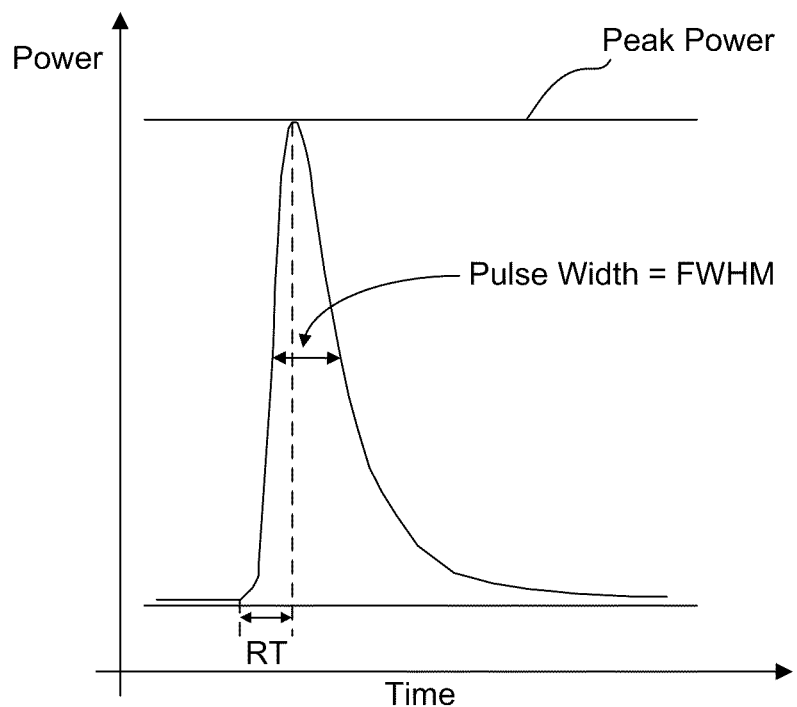

As discussed below, certain embodiments may also use a Gaussian-shaped temporal pulse profile, such as that shown in FIG. 1B. As shown in FIG. 1B, a temporal pulse duration for the Gaussian-shaped temporal pulse profile may be defined at the FWHM value. In certain embodiments disclosed herein, the FWHM value of the temporal pulse duration for the Gaussian-shaped temporal pulse profile may be selectively adjustable in a range between about 0.5 nanoseconds and about 150 nanoseconds. FIG. 1B illustrates a vertical dashed line to represent a rise time RT. In certain embodiments, the rise time RT shown in FIG. 1B is selectively adjustable in a range between about 0.1 nanoseconds to about 15 nanoseconds.

Figure 3:
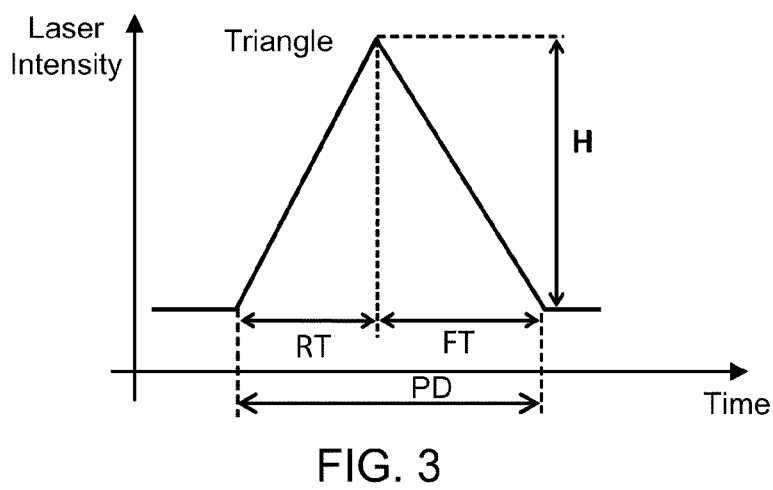
FIG. 3 graphically illustrates an example triangle-shaped temporal pulse profile according to one embodiment.

FIG. 3 graphically illustrates an example triangle-shaped temporal pulse profile according to one embodiment. FIG. 3 shows a peak height H, a rise time RT, a fall time FT, and a temporal pulse width or temporal pulse duration PD for the triangle-shaped temporal pulse profile. In one embodiment, the rise time RT and the fall time FT are selectively and independently adjustable (independently with respect to one another) within a range between about 15 nanoseconds and about 200 nanoseconds, with a substantially constant slope. Thus, the pulse duration PD may be selectively adjusted for such embodiments in a range between about 30 nanoseconds and about 400 nanoseconds. The peak intensity or peak height H depends on the slopes and durations of the rise time RT and the fall time FT.

Figure 4A:
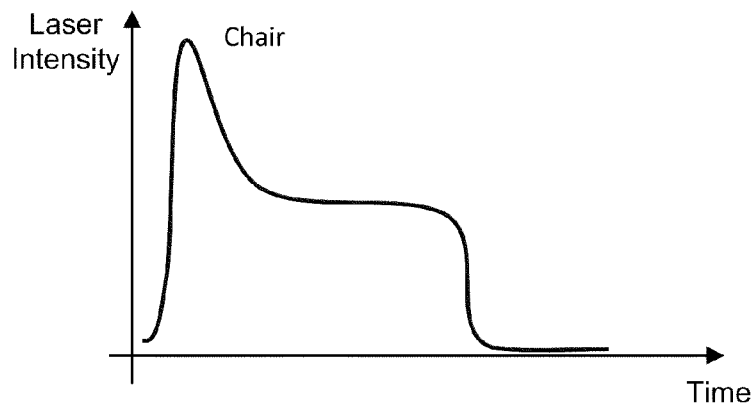
FIG. 4A graphically illustrates an example chair-shaped temporal pulse profile according to one embodiment.

FIG. 4A graphically illustrates an example chair-shaped temporal pulse profile according to one embodiment. The chair-shaped temporal pulse profile includes an initial peak or spike (a "chair back") followed by a plateau (a "chair seat"). The chair back has a fast rise time RT to increase heating efficiency, which leads to a smaller heat affected zone. In addition, faster heating causes the target material to heat faster at the top layers first. The chair seat then provides controlled processing of the underlying material layers. When processing electrically conductive links, for example, the fast rise time RT and high initial peak power pre-heats the electrically conductive link and ruptures an overlying passivation layer. After rupturing the electrically conductive link, the pulse energy is decreased from the chair back height CBh to the chair seat height CSh to clean out the remaining link material while reducing the risk of damaging an underlying semiconductor (e.g., silicon) substrate.

Figure 4B:
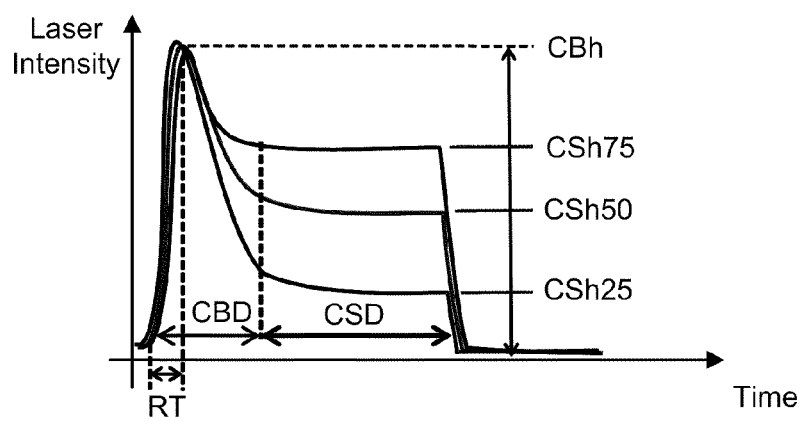
FIGS. 4B, 4C, and 4D graphically illustrate additional examples of temporal pulse profiles according to certain embodiments.
Figure 4C:
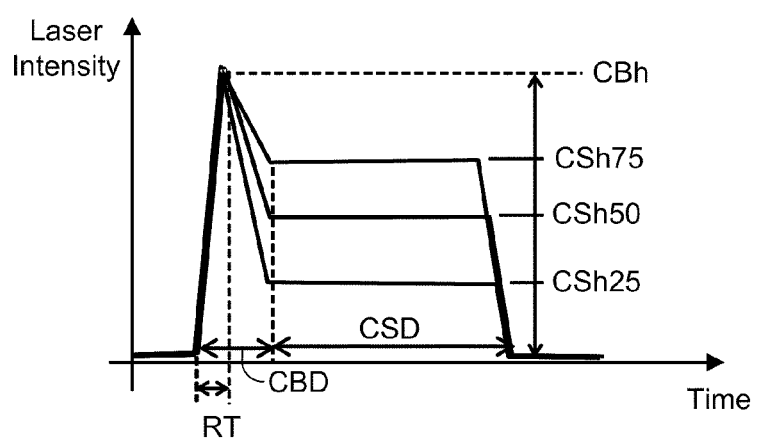
Figure 4D:
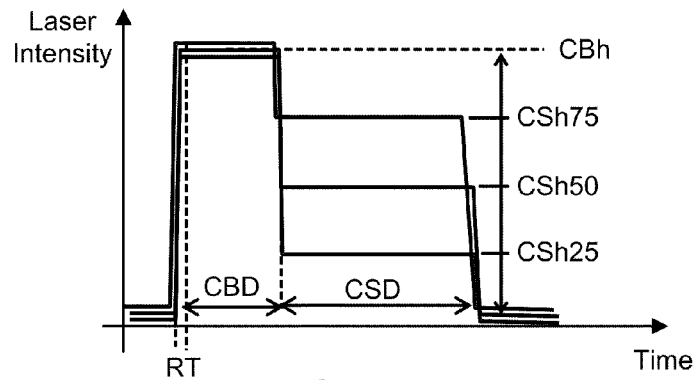

FIGS. 4B, 4C, and 4D graphically illustrate additional examples of temporal pulse profiles according to certain embodiments. FIGS. 4B, 4C, and 4D show a peak laser intensity or chair back height CBh, a plurality of different chair seat height CSh values (shown as either CSh75, CSh50, or CSh25), a rise time RT, a chair back duration CBD, and a chair seat duration CSD with respect to the illustrated chair-shaped temporal pulse profiles. In certain embodiments, each of these parameters is selectively adjustable. For example, FIGS. 4B, 4C, and 4D each show three different temporal pulse profiles, each with a different chair seat height (CSh75 to indicate a chair seat height that is 75% of CBh, CSh50 to indicate a chair seat height that is 50% of CBh, and CSh25 to indicate a chair seat height that is 25% of CBh). Artisans will recognize from the disclosure herein, however, that the chair seat height CSh may be set to any intensity value, and not only the 25%, 50%, or 75% of CBh values shown as CSh25, CSh50, and CSh75, respectively. In FIG. 4B, the chair back has a Gaussian shape. In FIG. 4C, the chair back has a triangle shape. In FIG. 4D, the chair back has a square shape. The temporal pulse duration for the chair-shaped temporal pulse profile is defined by CBD+CSD. Further embodiments and details regarding the chair-shaped temporal pulse profile are discussed below.

Figure 5A:
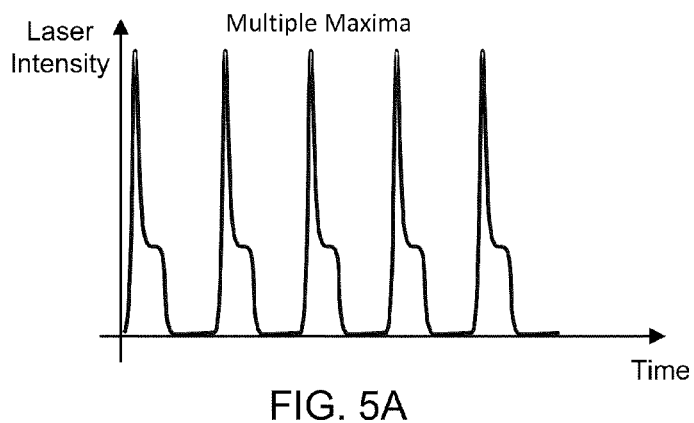
FIG. 5A graphically illustrates an example temporal pulse profile shape that has multiple maxima according to one embodiment.

FIG. 5A graphically illustrates an example temporal pulse profile shape that has multiple maxima according to one embodiment. As shown in FIG. 5A, "multiple maxima" refers to a plurality of peak laser intensity values (five shown) within a single laser pulse, where the laser intensity returns to a zero intensity value between peak laser intensity values. As used herein, a "zero intensity value" is defined as less than about 15% of the maximum peak laser intensity value of the laser pulse. It should be noted that a temporal pulse profile shape having multiple maxima is not a pulse train (discussed elsewhere herein) and does not refer to multiple distinct pulses. Rather, a temporal pulse profile shape with multiple maxima refers to the shape of a single laser pulse generated by a pulsed laser source. In the spatial domain, a laser pulse having a temporal pulse profile shape with multiple maxima illuminates a single laser spot (having a spot size) on a workpiece.

Figure 5B:
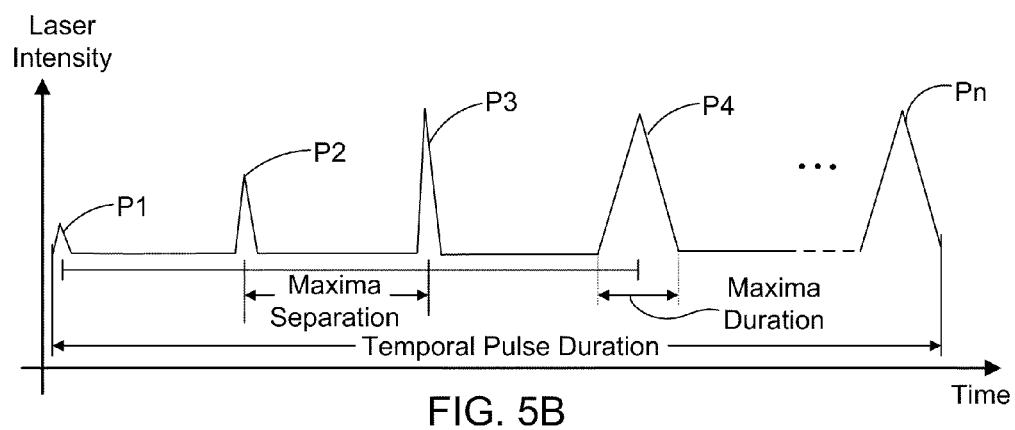
FIG. 5B graphically illustrates an example temporal pulse profile with multiple maxima having a triangle shape according to one embodiment.

In FIG. 5A, each of the illustrated maxima is chair-shaped. However, the plurality of maxima may have any shape. In one embodiment, for any given tailored laser pulse, each of the maxima are the same shape (e.g., all Gaussian-shaped, all square-shaped, all triangle-shaped, or all chair-shaped), but the individual maxima peak intensities, the individual maxima temporal durations, and/or the maxima separation (e.g., the temporal separation between each chair shape in FIG. 5A) may vary within the laser pulse. For example, FIG. 5B graphically illustrates an example temporal pulse profile with multiple maxima having a triangle shape according to one embodiment. In FIG. 5B, the peak intensity, temporal pulse duration, maxima durations, and maxima separations vary between at least two of the illustrated maxima (P1, P2, P3, P4, . . . Pn). The total temporal pulse duration may depend on the capability of the particular laser source. However, in one embodiment, the total temporal duration of a temporal pulse profile with multiple maxima is less than about 500 nanoseconds.

Figure 5C:
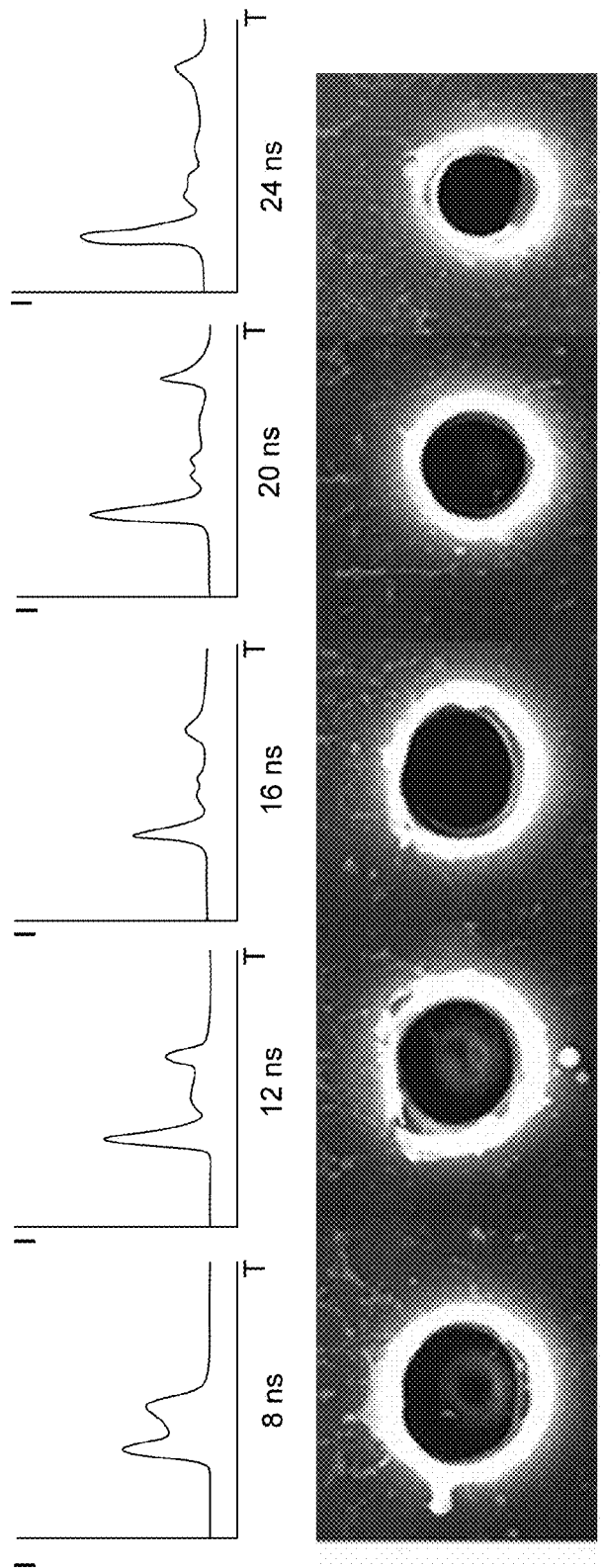
FIG. 5C includes electron micrographs showing a plurality of holes blown in an aluminum probe pad passivated with silicon dioxide by single ultraviolet laser pulses with respective temporal pulse profiles having dual peaks or maxima separated by different amounts of time according to certain embodiments.
Figure 5D:
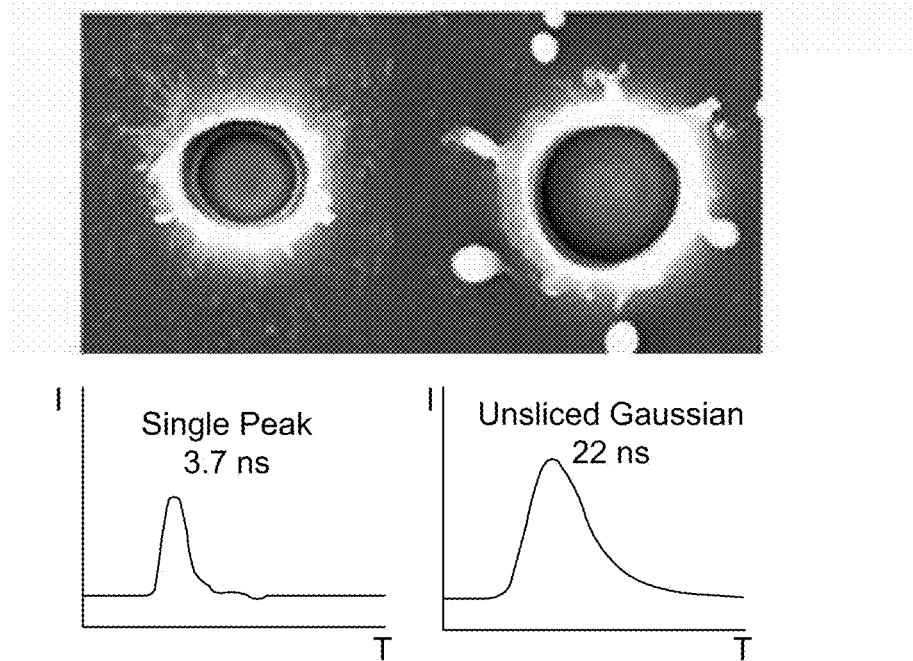
FIG. 5D includes electron micrographs showing holes blown in an aluminum probe pad passivated with silicon dioxide by single ultraviolet laser pulses with respective temporal pulse profiles having single peaks or maxima.
Figure 6A:
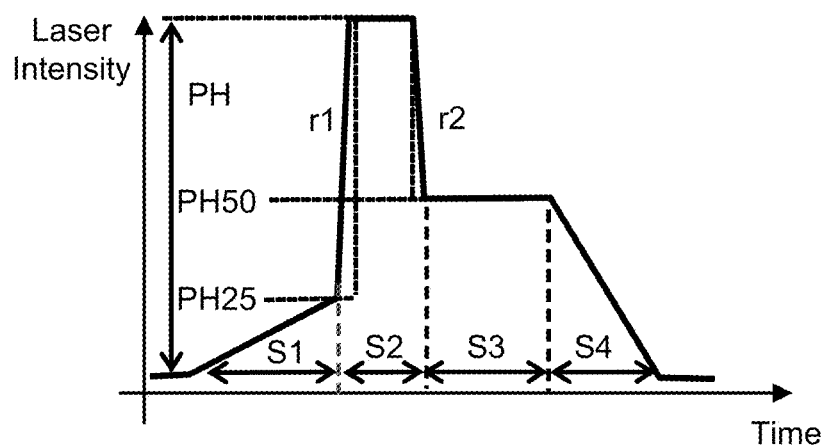
FIGS. 6A, 6B, 6C, and 6D graphically illustrate various four-stage-shaped temporal pulse profiles according to certain embodiments.
Figure 6B:
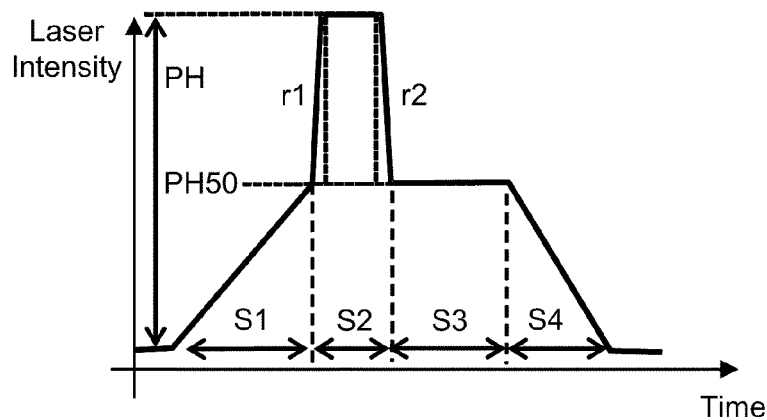
Figure 6C:
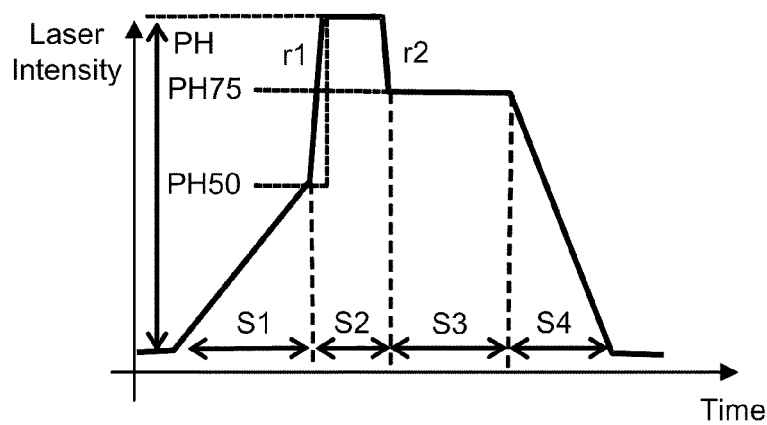
Figure 6D:
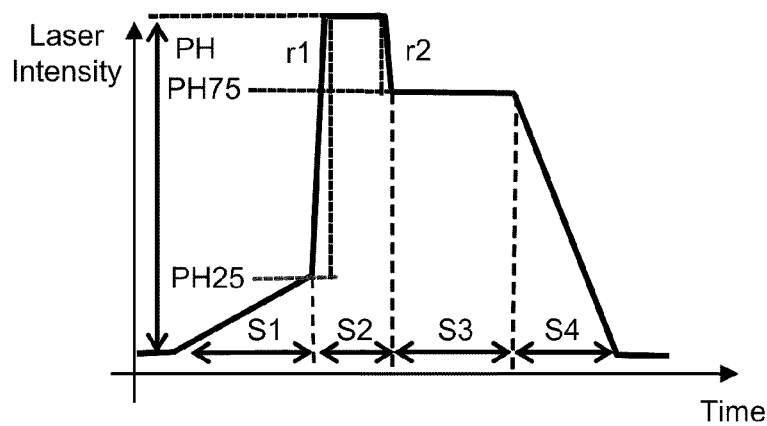

In certain embodiments, the temporal separation between maxima in a temporal pulse profile with multiple maxima is selected based on a desired spot size and/or processing quality. For example, FIG. 5C includes electron micrographs showing a plurality of holes (five shown) blown in an aluminum (Al) probe pad passivated with silicon dioxide ($SiO_2$) by single ultraviolet (UV) laser pulses with respective temporal pulse profiles having dual peaks or maxima separated by different amounts of time (from left to right, 8 nanoseconds separation, 12 nanoseconds separation, 16 nanoseconds separation, 20 nanoseconds separation, and 24 nanoseconds separation). In this example, the silicon dioxide is about 250 nanometers thick. As shown in FIG. 5C, the spot size decreases as the peak separation increases. By way of comparison with the dual peak embodiments shown in FIG. 5C, electronic micrographs in FIG. 5D show holes blown in the same aluminum probe pad passivated by silicon dioxide by single ultraviolet laser pulses with single peaks and Gaussian-shaped temporal pulse profiles with temporal durations (from left to right) of 3.7 nanoseconds and 22 nanoseconds, respectively. As shown by Table 1 below, each of the dual peak embodiments shown in FIG. 5C has a smaller spot size than the single peak embodiments shown in FIG. 5D.

TABLE 1

| Pulse | Spot Size (µm) |
|---|---|
| 8 ns peak separation | 1.9 |
| 12 ns peak separation | 1.8 |
| 16 ns peak separation | 1.8 |
| 20 ns peak separation | 1.7 |
| 24 ns peak separation | 1.6 |
| Single peak at 3 ns pulsewidth | 1.7 |
| Single peak at 22 ns pulsewidth | 2.0 |

FIGS. 6A, 6B, 6C, and 6D graphically illustrate various four-stage-shaped temporal pulse profiles according to certain embodiments. The four-stage shape combines aspects of the chair shape and the triangle shape. A first stage of the temporal pulse profile has a constant-slope rise time duration referred to herein as a "ramp up" S1. The ramp up S1 is followed by stage 2, which is a high peak power portion of the temporal pulse profile (similar to the "chair back" of the chair shape), referred to herein as a "pulse back" S2. Stage 3 is a substantially constant power duration (similar to the "chair seat" of the chair shape), referred to herein as a "pulse seat" S3. Following the pulse seat S3, stage 4 is a constant-slope fall time duration, referred to herein as a "ramp down" S4. The total temporal pulse duration for the four-stage-shaped temporal pulse profiles is defined by the durations of S1+S2+S3+S4.

In one embodiment, a maximum intensity of the ramp up S1 is either 25% (shown at PH25) or 50% (shown at PH50) of a maximum intensity (shown as PH) of the pulse back S2; the height of the pulse seat S3 (and the maximum intensity of the ramp down S4) is either 50% (shown as PH50) or 75% (shown as PH75) of the maximum intensity PH of the pulse back S2; and a rising ramp (shown as r1) and a falling ramp (shown as r2) for the pulse back S2 each has a constant slope.

In one embodiment, the rise time duration of the ramp up S1 is in a range between about 0.1 nanoseconds and about 100 nanoseconds, the high peak power duration of the pulse back S2 is in a range between about 1 nanosecond and about 150 nanoseconds, the duration of the constant rising ramp r1 of the pulse back S2 is in a range between about 0.1 nanoseconds and about 15 nanoseconds, the duration of the constant falling ramp r2 of the pulse back S2 is in a range between about 0.1 nanoseconds and about 15 nanoseconds, the duration of the pulse seat S3 is in a range between about 0.01 nanoseconds and about 300 nanoseconds, and the linear slope fall time duration of the ramp down S4 is in a range between about 0.1 nanoseconds and about 100 nanoseconds.

B. Mono-Shape Laser Pulse Trains

As discussed above, laser pulses in a laser pulse train are delivered to a workpiece in a timed series of 1 to n pulses, where each pulse in the train corresponds to one repetition of the laser. In a mono-shape laser pulse train, each laser pulse has the same tailored laser pulse shape (within the pulse-to-pulse repeatability of the laser) as other laser pulses in the train. For a mono-shape laser pulse train according to certain embodiments, a first tailored laser pulse shape is used for a first recipe step and a second tailored laser pulse shape is used for a second recipe step.

Figure 7A:
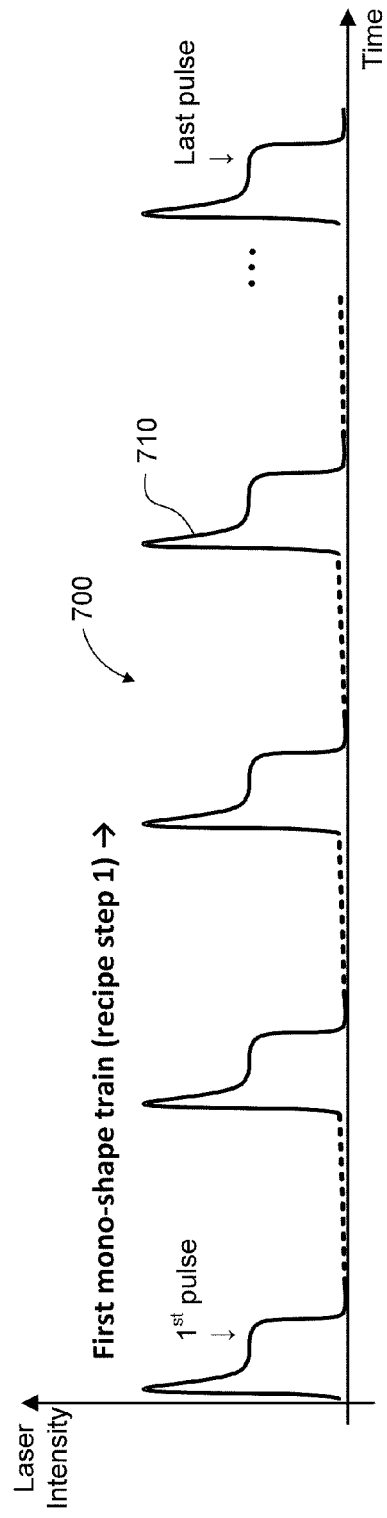
FIGS. 7A and 7B graphically represent example mono-shape laser pulse trains according to certain embodiments.
Figure 7B:
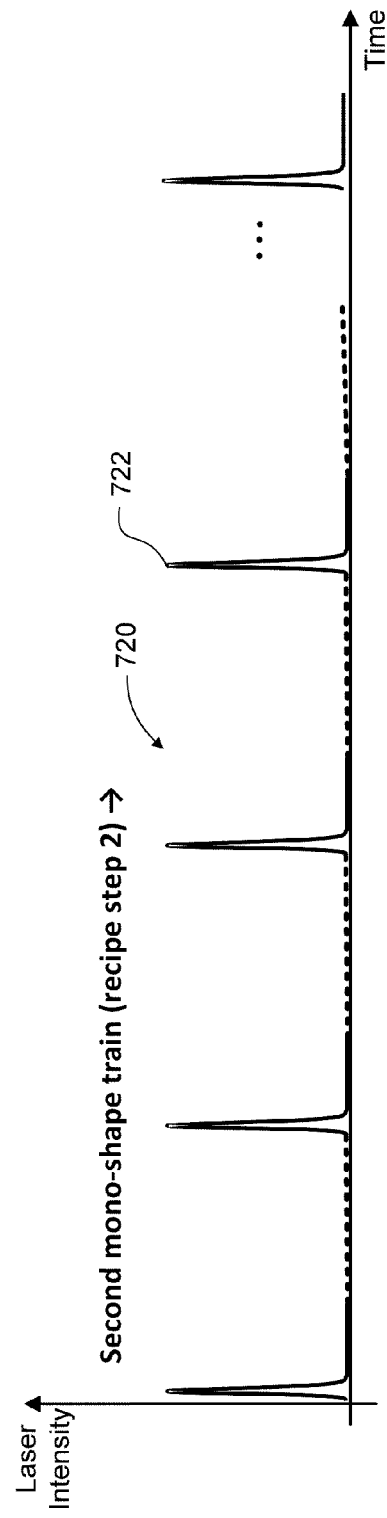

FIGS. 7A and 7B graphically represent example mono-shape laser pulse trains according to certain embodiments. A first mono-shape laser pulse train 700 shown in FIG. 7A includes a plurality of laser pulses 710 (five shown) that each have a chair-shaped temporal pulse profile. The first laser pulses 710 repeat at a selected pulse repetition frequency for the particular laser process or recipe step. The second mono-shape laser pulse train 720 shown in FIG. 7B includes a plurality of laser pulses 722 (five shown) that each have a Gaussian-shaped temporal pulse profile. The laser pulses 722 repeat at a selected pulse repetition frequency for the particular laser process or recipe step.

In certain embodiments, the first mono-shape laser pulse train 700 shown in FIG. 7A is used in a first recipe step when processing a workpiece, and the second mono-shape laser pulse train 720 is used in a second recipe step when processing the workpiece. Although shown as having about the same pulse repetition frequency for both the first recipe step and the second recipe step, in certain embodiments, the pulse repetition frequency of the first mono-shape laser pulse train 700 is different than the pulse repetition frequency of the second mono-shape laser pulse train 720. As shown, the temporal pulse duration of the laser pulses 710 in the first mono-shape laser pulse train 700 may be different than the temporal pulse duration of the pulses 722 in the second mono-shape laser pulse train 720. Other laser pulse parameters may also be different between the pulses 710 in the first mono-shape laser pulse train 700 as compared to the laser pulse parameters of the pulses 722 in the second mono-shape laser pulse train 720, including the spatial shape (e.g., top hat), the peak intensity, and the pulse energy. The selected laser pulse parameters are based on the respective recipe steps associated with the first mono-shape laser pulse train 700 and the second mono-shape laser pulse train 720.

Recipe steps may be defined by each pass of a laser beam over the work surface defined by a galvo sweep or a translation stage acceleration and/or deceleration step. Thus, each recipe step may re-process the same pattern over the same exact area of the material. For, example, the first mono-shape laser pulse train 700 shown in FIG. 7A may be used in the first recipe step to cut a top layer of a scribe line on a semiconductor device without chipping. Then, in the second recipe step, a high peak power and short pulse duration of the second mono-shape laser pulse train 720 shown in FIG. 7B may be used along the same scribe line for fast machining into the bulk of the material with a small heat affected zone.

In another embodiment, recipe steps may be changed based on an X-Y position with respect to the work surface, such as processing different areas of a workpiece. For example, the first mono-shape laser pulse train 700 in FIG. 7A may be used in the first processing step to machine a first area of a workpiece. Then, in the second recipe step, the second mono-shape laser pulse train 720 shown in FIG. 7B may be used to machine a second (e.g., different) part of the workpiece.

1. Example Dicing Using a Plurality of Mono-Shape Laser Pulse Trains

Figure 8:
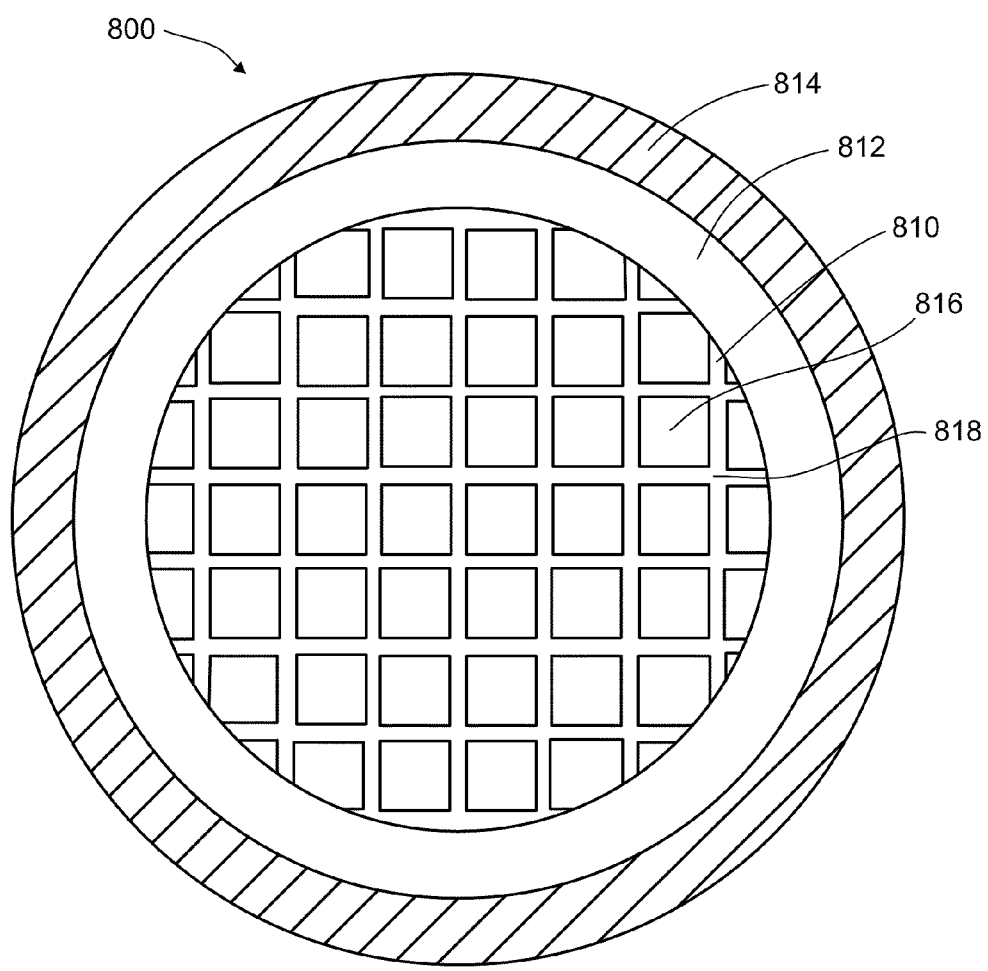
FIG. 8 schematically illustrates a top view of a workpiece processed using a plurality of mono-shape laser pulse trains according to one embodiment.
Figure 9A:
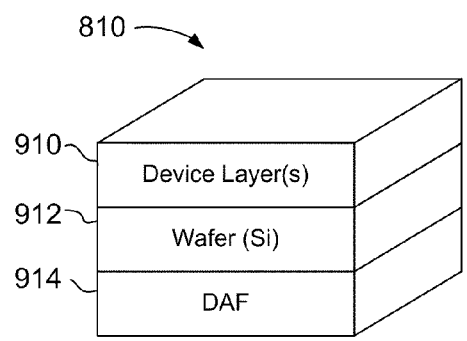
FIGS. 9A, 9B, 9C, and 9D schematically illustrate a side perspective view of the semiconductor wafer shown in FIG. 8 according to one embodiment.

FIG. 8 schematically illustrates a top view of a workpiece 800 processed using a plurality of mono-shape laser pulse trains according to one embodiment. The workpiece 800 includes a semiconductor wafer 810 mounted on a dicing tape 812 disposed in a wafer ring 814. A front side (shown in FIG. 8) of the semiconductor wafer 810 is divided into a plurality of semiconductor chips 816 along scribe lines or streets 818. The semiconductor chips 816 include electronic circuit components formed on or in one or more device layers (see FIG. 9A) of the semiconductor wafer 810. A back side (not shown) of the semiconductor wafer 810 may include a die attach film (DAF) (see FIG. 9A) that serves as an adhesive at the time of mounting the semiconductor chips 816 to a wiring substrate (not shown). The DAF may comprise a polymer. In one embodiment, the DAF comprises a flexible and tough thermoplastic material that has a thermal conductivity of greater than about 6.0 W/m-K and can withstand a temperature of 275 degrees Centigrade. The DAF may be made of a 3.5-10.0 mils thick polyvinyl chloride (PVC) base film that is coated with a 0.3-1.1 mils thick pressure-sensitive epoxy adhesive and protected with a 0.8-1.0 mils thick release film.

FIGS. 9A, 9B, 9C, and 9D schematically illustrate a side perspective view of the semiconductor wafer 810 shown in FIG. 8 according to one embodiment. The semiconductor wafer 810 includes one or more device layers 910 formed over a semiconductor wafer 912 (e.g., silicon). In this example, DAF 914 is affixed to the back surface of the semiconductor wafer 912.

Figure 9B:
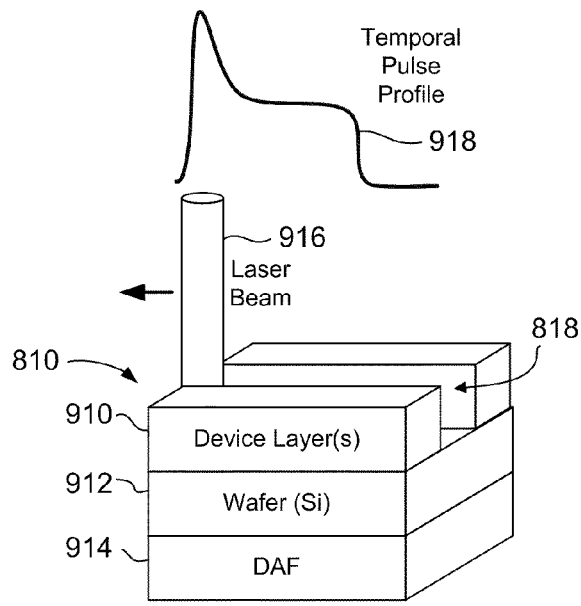
Figure 9C:
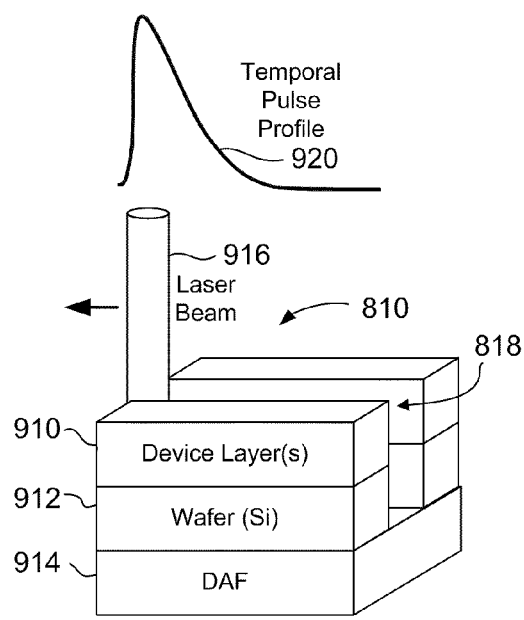
Figure 9D:
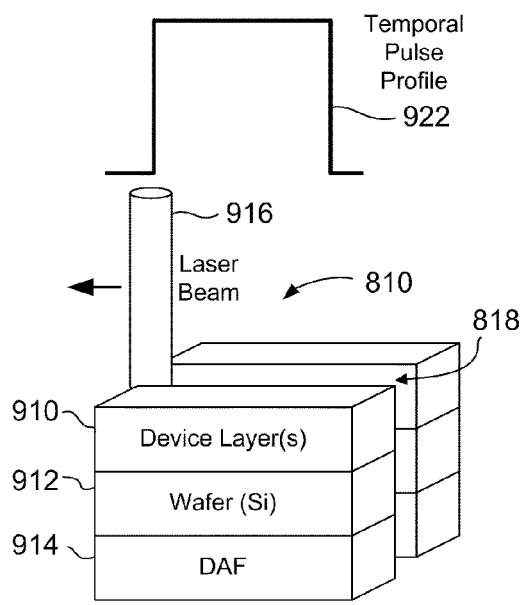

FIGS. 9B, 9C, and 9D illustrate a process for dicing the semiconductor wafer 810 using a plurality of different mono-shape laser pulse trains according to one embodiment. A first recipe step of the dicing process, as shown in FIG. 9B, includes a first pass of a laser beam 916 along a street 818 of the semiconductor wafer 810 (e.g., using an X-Y translation stage that provides relative motion of the laser beam 916 in the direction of the arrow with respect to the street 818). The first pass of the laser beam 916 scribes the semiconductor wafer 810 by removing the one or more device layers 910 so as to expose the underlying semiconductor wafer 912 along the street 818. During the first pass, the laser beam 916 includes a first mono-shape laser pulse train comprising a series of laser pulses that each have a chair-shaped temporal pulse profile 918 (e.g., such as the first mono-shape laser pulse train 700 shown in FIG. 7A). Other shapes may also be used, depending on the materials and processing requirements of the one or more device layers 910. The chair-shaped temporal pulse profile 918 is configured to process a combination of metals (e.g., copper) and low-k dielectrics in the street 818 of the one or more device layers 910. In an example embodiment, a UV or green laser source is used and the temporal pulse duration of each chair-shaped temporal pulse profile in the first mono-shape laser pulse train is in a range between about 12 nanoseconds and about 14 nanoseconds.

A second recipe step of the dicing process, as shown in FIG. 9C, includes a second pass of the laser beam 916 along the street 818 to cut through the semiconductor wafer 912. During the second pass, the laser beam 916 includes a second mono-shape laser pulse train comprising a series of laser pulses that each have a Gaussian-shaped temporal pulse profile 920 (e.g., such as the second mono-shape laser pulse train 720 shown in FIG. 7B). Other shapes (e.g., triangle or square) may also be used, depending on the materials and processing requirements of the semiconductor wafer 912. The Gaussian-shaped temporal pulse profile 920 is configured to cut through the semiconductor wafer 912 to reduce or eliminate melt and splash of the semiconductor material and to produce side walls with high die break strengths. In an example embodiment, the UV or green laser source provides a temporal pulse duration of each Gaussian-shaped temporal pulse profile in the second mono-shape laser pulse train in a range between about 1 nanoseconds and about 3 nanoseconds.

A third recipe step of the dicing process, as shown in FIG. 9D, includes a third pass of the laser beam 916 along the street 818 to cut through the DAF 914. During the third pass, the laser beam 916 includes a third mono-shape laser pulse train comprising a series of laser pulses that each have a square-shaped temporal pulse profile 922. Other shapes (e.g., triangle or Gaussian) may also be used. In an example embodiment, the UV or green laser source provides a temporal pulse duration of each square-shaped temporal pulse profile in the third mono-shape laser pulse train in a range between about 40 nanoseconds and about 1 millisecond. In another example embodiment, the UV or green laser source provides a temporal pulse duration of each square-shaped temporal pulse profile in the third mono-shape laser pulse train in a range between about 40 nanoseconds and about 400 nanoseconds.

Although not shown, other recipe steps may also use different or additional temporal pulse profile shapes. For example, a fourth recipe step of the dicing process may include a fourth pass of the laser beam 916 along the street 818 to anneal the die sidewalls to further increase the die break strength. During the fourth pass, the laser beam 916 may include a fourth mono-shape laser pulse train that is different than that used in any of the previous steps. In other embodiments, the fourth mono-shape laser pulse train may be the same as that used in one of the previous steps. In one embodiment, each laser pulse in the fourth mono-shape laser pulse is Gaussian-shaped and has a temporal pulse duration in a range between about 60 nanoseconds and about 70 nanoseconds. In another embodiment, each laser pulse in the fourth mono-shape laser pulse is either Gaussian-shaped, square-shaped, or triangle-shaped and has a temporal pulse duration in a range between about 50 nanoseconds and about 100 nanoseconds.

2. Example Scribing Using a Plurality of Mono-Shape Laser Pulse Trains

As discussed above with respect to FIG. 9B, the first recipe step includes the first pass of the laser beam 916 to scribe the semiconductor wafer 810 so as to remove the one or more device layers 910 and expose the underlying semiconductor wafer 912 along the street 818. In other embodiments, the scribing may include a plurality of recipe steps that each use a respective mono-shape laser pulse train.

Figure 10:
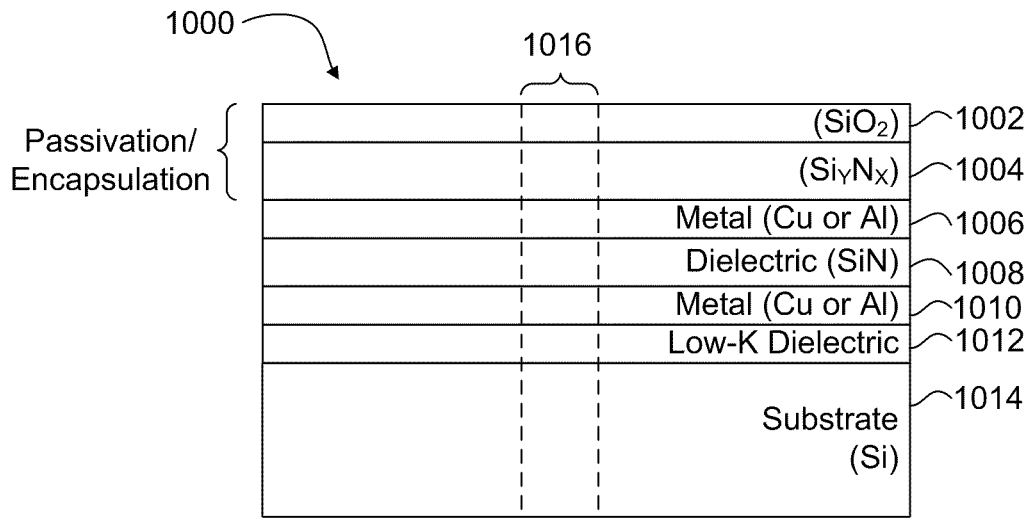
FIG. 10 is a side view schematic of an example workpiece that is scribed using a plurality of different temporal pulse profiles according to certain embodiments.

For example, FIG. 10 is a side view schematic of an example workpiece 1000 that is scribed using a plurality of different temporal pulse profiles according to certain embodiments. The workpiece 1000 includes a first layer 1002, a second layer 1004, a third layer 1006, a fourth layer 1008, a fifth layer 1010, and a sixth layer 1012 formed over a substrate 1014. As an artisan will recognize, the layers 1002, 1004, 1006, 1008, 1010, 1012 may include interconnect layers separated by insulation layers, including low-k dielectrics, to form electronic circuitry. In this example, the top two layers 1002, 1004 form a passivation and encapsulation layer. The first layer 1002 may include, for example, silicon dioxide ($SiO_2$) and the second layer 1004 may include a silicon-nitride ($Si_yN_x$). For example, the second layer 1004 may include $Si_4N_3$. An artisan will recognize that other materials can be used to form passivation and/or encapsulation layers.

In this example, the third layer 1006 comprises a metal (e.g., Cu or Al), the fourth layer 1008 comprises a dielectric (e.g., SiN), the fifth layer 1010 comprises a metal (e.g., Cu or Al), and the sixth layer 1012 comprises a low-k dielectric. Low-k dielectric materials may include, for example, an inorganic material such as SiOF or SiOB or an organic material such as polymide-based or parylene-based polymer. An artisan will recognize that the materials discussed for the layers 1006, 1008, 1010, 1012 are for example only and that other types of materials could also be used. Further, an artisan will recognize that more layers or less layers can be used for particular integrated circuits. As shown, the substrate 1014 comprises silicon (Si). However, an artisan will also recognize that other materials useful in integrated circuit manufacture can be used for the substrate 1014 including, for example, glasses, polymers, metals, composites, semiconductors, and other materials. For example, the substrate 1014 may include FR4.

As discussed above, the layers 1002, 1004, 1006, 1008, 1010, 1012 form electronic circuitry. Individual circuits are separated from each other by a scribing lane or street 1016 (shown in FIG. 10 as two vertical dashed lines). To create individual integrated circuits, the workpiece 1000 is scribed, throughcut, or both, along the street 1016.

In one embodiment, a first mono-shape laser pulse train with laser pulses having a first temporal pulse profile shape is used to remove the passivation and encapsulation layers 1002, 1004 along the street 1016, and a second mono-shape laser pulse train with laser pulses having a second temporal pulse profile shape is used to remove the layers 1006, 1008, 1010, 1012, 1014. In another embodiment, two or more different mono-shape laser pulse trains are used to remove respective layers 1006, 1008, 1010, 1012, 1014 along the street 1016. For example, one temporal pulse profile shape may be used to process the metal layers 1006, 1010, and another temporal pulse profile shape may be used to process one or both of the dielectric layers 1008, 1012. The laser scribing process discussed herein creates a clean kerf with substantially uniform side walls in the region of the street 1016 with little or no cracking or chipping in regions outside the street 1016 that are common with typical laser scribing processes.

C. Mixed-Shape Laser Pulse Trains

A mixed-shape laser pulse train includes at least two laser pulses that are different than one another (e.g., a change in the class of tailored laser pulse shapes such as from square-shaped to chair-shaped, and/or a change in peak power (intensity) or temporal pulse duration within the same class of tailored laser pulse shapes). Thus, the workpiece may be scribed using a series of laser pulses with two or more different tailored laser pulse shapes in a single pass of the laser beam. In addition, or in other embodiments, different mixed-shape laser pulse trains may be used during different recipe steps performed on the same workpiece.

Figure 11:
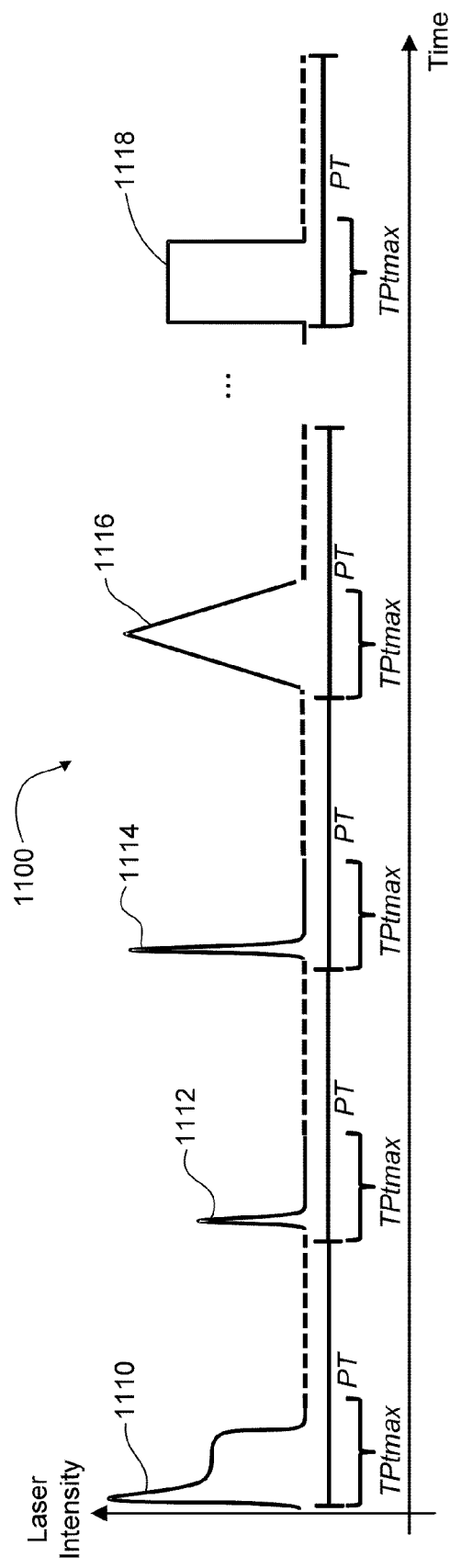
FIG. 11 graphically represents a mixed-shape laser pulse train according to one embodiment.

FIG. 11 graphically represents a mixed-shape laser pulse train 1100 according to one embodiment. In the displayed example, the mixed-shape laser pulse train 1100 includes a chair-shaped temporal pulse profile 1110, a first Gaussian-shaped temporal pulse profile 1112, a second Gaussian-shaped temporal pulse profile 1114, a triangle-shaped temporal pulse profile 1116, and a square-shaped temporal pulse profile 1118. In one embodiment, the mixed-shape laser pulse train 1100 is generated by a single laser source. The mixed-shape laser pulse train 1100 may include fewer or more laser pulses than those displayed in FIG. 11. The selection and sequence of the particular temporal pulse profiles within the mixed-shape laser pulse train 1100 is based on a pulse repetition frequency of the single laser source, a plurality of target locations on or within the workpiece, and a motion profile of a laser beam with respect to the target locations.

FIG. 11 shows a pulse time PT and a maximum tailored pulse duration TPtmax for each shaped temporal pulse profile 1110, 1112, 1114, 1116, 1118. The pulse time PT is the inverse of the laser's pulse repetition frequency. For certain embodiments, the pulse repetition frequency is in the range between about 10 kHz and about 10 MHz, which provides a pulse time PT in a range between about 100 milliseconds and about 0.1 milliseconds. An artisan will recognize that laser energy can only be delivered during a fraction of the pulse time PT, as some time is required for the laser to build up the next pulse.

Figure 12:
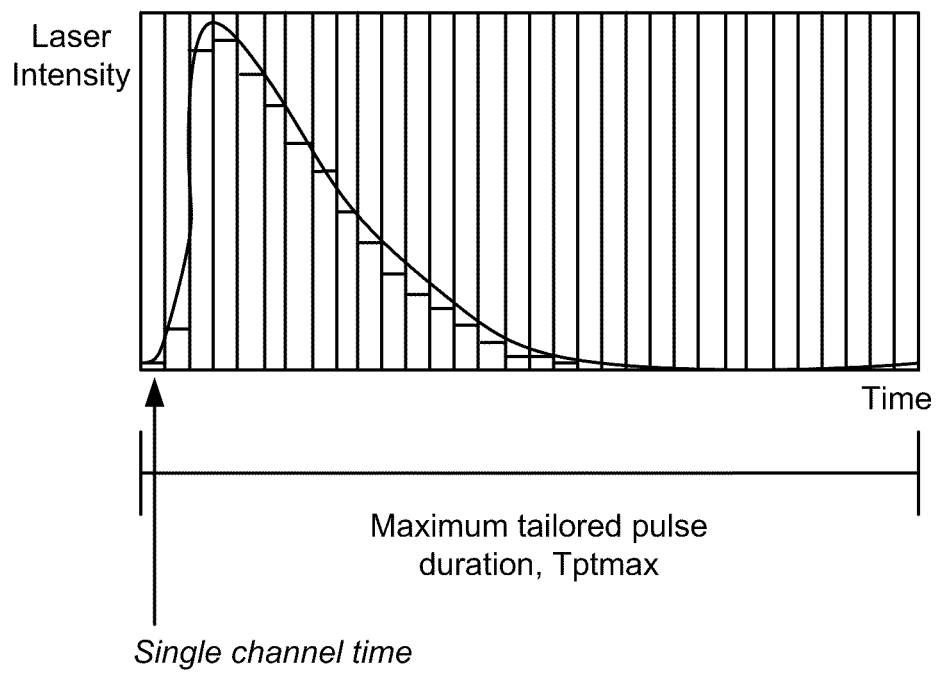
FIG. 12 graphically represents a temporal pulse profile sub-divided into a series of time channels according to one embodiment.

As shown in FIG. 12, the maximum tailored pulse duration TPtmax according to certain embodiments is sub-divided into a series of time channels (shown between vertical lines in FIG. 12) that can be programmed with a selected laser intensity value (which includes a value of zero for no intensity). A minimum tailored pulse duration often (but not always) corresponds the single channel time shown in FIG. 12. This is the shortest possible pulse time TP duration that can be delivered by the laser according to certain embodiments. For example, one embodiment of a tailored pulse laser delivers temporally shaped pulses with a minimum tailored pulse duration of about 2.5 nanoseconds and a maximum tailored pulse duration TPtmax of about 40 nanoseconds programmable in 2.5 nanosecond single channel times. Other embodiments of tailored pulse lasers have over 1,000 channels, with maximum tailored pulse durations TPtmax of more than 1 millisecond, and/or minimum tailored pulse durations down to 0.1 nanosecond. Of course, embodiments for generating tailored pulses such as using Pockels cells or multiple lasers do not have programmable channels, but the minimum and maximum tailored pulse durations are defined by the laser, optics, and hardware limitations.

The example mixed-shape laser pulse train 1100 shown in FIG. 11 may be used for laser processing based on a position in 3D space. For example, when drilling a via or a trench in a material, the temporal pulse profile shape may be changed from edge to center or top to bottom of the feature. When processing a patterned material (such as a semiconductor device) the temporal pulse profile shape may be varied depending on the material (such as using shorter temporal pulse durations to process the dielectric portions of the device, and longer temporal pulse durations for the metal portions).

The flexibility of tailored pulse lasers provides an opportunity to provide superior laser processing results by varying the temporal pulse profile shape during different portions of a motion profile of a machining operation. In one example embodiment described below, a machining operation includes dithering the laser beam back and forth while it progresses down a die street in a scribing or singulation operation. One temporal pulse profile shape is delivered when the laser beam is located near the edge of the cut to make a clean sidewall, and a different temporal pulse profile shape is delivered when the pulses are being delivered to the center of the cut for faster bulk material removal. In another example embodiment described below, different temporal pulse profile shapes are synchronized with different features found upon the material being processed. For example, one temporal pulse profile shape may be delivered when scribing across silicon in a street and a different temporal pulse profile shape may be delivered when scribing across metallic features in the street.

In certain embodiments, at least one of the temporal pulse profile shape, pulse energy or height, and the pulse repetition frequency may be changed within a mixed-shape laser pulse train for different processing characteristics based on at least one of the motion profile parameters (e.g., commanded or measured position, velocity, or acceleration), motion parameters (e.g., commanded or measured position, velocity, or acceleration) of an actuation device (e.g., an acousto-optic deflector (AOD), Galvo, XY stage, Z stage, tertiary beam positioner, fast steering mirror (FSM), or other beam steering device), coordinated motion parameters of a combination of actuation devices, processing areas where there may be a greater or lesser degree of spot overlap due to motion characteristics, position error characteristics (e.g., XY or Z stage position error), varying features found upon an article being processed, varying material composition of an article being processed, different process results desired at different locations of an article being processed, the start or end of a motion segment (e.g., a first or last pulse in a processing segment that provides different processing due to a different amount of overlapped pulses), a different thermal state in the material being processed, a different laser state (e.g., different thermal state), and a portion of a laser processing segment that may overlap or intersect another processing segment (e.g., "stitching together" or combining the ends of process fields or where processing segments cross).

The following examples illustrate synchronizing temporal pulse profile shapes within a mixed-shape laser pulse train with motion profiles or features located in different areas of a workpiece. In FIGS. 13, 14, 15, 16, 17, and 18, laser pulses, generated according to temporal pulse profile shapes defined for a mixed-shape laser pulse train, are spatially represented by respective laser spots on or within a workpiece. In other words, the examples describe changes in temporal pulse profile shapes based on processing target materials at different locations on or within a workpiece.

1. Example Dithering Using a Mixed-Shape Laser Pulse Train

Figure 13:
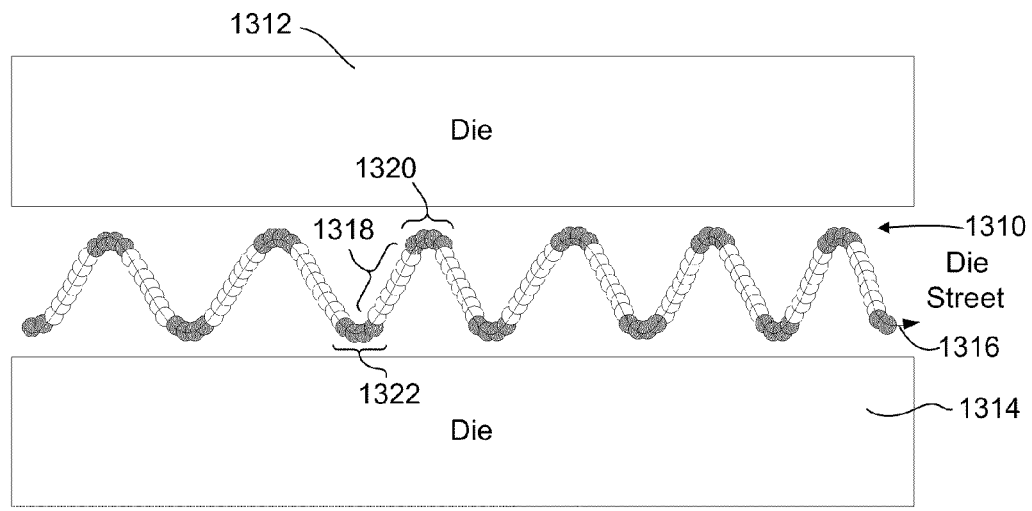
FIG. 13 schematically illustrates dithering a laser beam back and forth in a street between a first die and a second die on workpiece according to one embodiment.

FIG. 13 schematically illustrates dithering a laser beam back and forth in a street 1310 between a first die 1312 and a second die 1314 on workpiece according to one embodiment. Dithering the laser beam along a beam path 1316 while the laser beam transverses along the street 1310 between the first die 1312 and the second die 1314 allows the laser beam to create a wider kerf (as compared to the spot size of the individual laser pulses) for a scribing or dicing application. In this example embodiment, laser pulses 1318 near the center of the street 1310 have a temporal pulse profile shape configured for bulk material removal without regard for the quality of the remaining material. However, laser pulses 1320 delivered near the edge of the first die 1312 and laser pulses 1322 delivered near the edge of the second die 1314 have a temporal pulse profile shape that may not be as efficient in bulk material removal (as compared to that of the pulses 1318), yet create at least one of a cleaner sidewall, a steeper sidewall, less of a heat affected zone, less die edge cracking, and increased die break strength as compared to the temporal pulse profile used for the pulses 1318.

Figure 14:
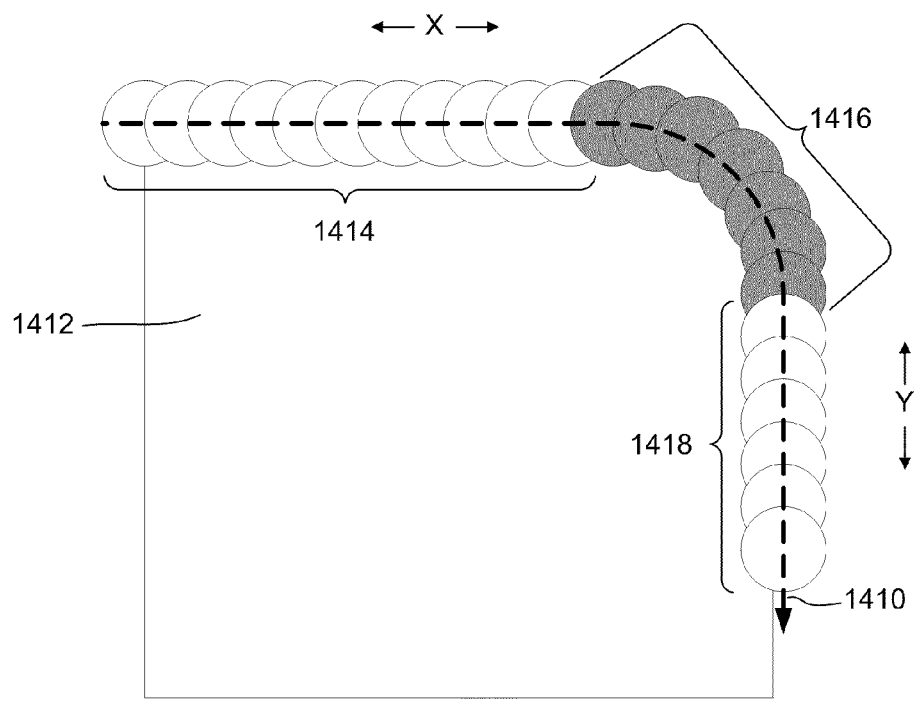
FIG. 14 schematically illustrates a laser beam path that turns a corner on a workpiece according to one embodiment.

2. Example Processing Using Mixed-Shape Laser Pulse Trains Based on Motion Profile Parameters FIG. 14 schematically illustrates a laser beam path that turns a corner on a workpiece 1412 according to one embodiment. When the laser beam path 1410 changes direction (e.g., from the X direction to the Y direction), motion profile parameters for the particular scribing or dicing process may specify a change in velocity and/or accelerations. The temporal pulse profile shapes in a mixed shape laser pulse train are synchronized with the changes in motion profile parameters to improve the scribing or dicing process. In a first portion of the laser beam path 1410 along the X direction, the laser pulses 1414 comprise a first temporal pulse profile shape corresponding to the motion profile parameters. In a second portion of the laser beam path 1410 including a curve around a corner from the X direction to the Y direction, the laser pulses 1416 comprise a second temporal pulse profile shape configured to change the amount of energy delivered per pulse based on the change in velocity and/or acceleration. In a third portion of the laser beam path 1410 along the Y direction, the laser pulses 1418 comprise a third temporal pulse profile shape. In one embodiment, the third temporal pulse profile shape is the same as the first temporal pulse profile shape, as the motion profile parameters and target material are the same along the X direction and the Y direction.

Figure 15:
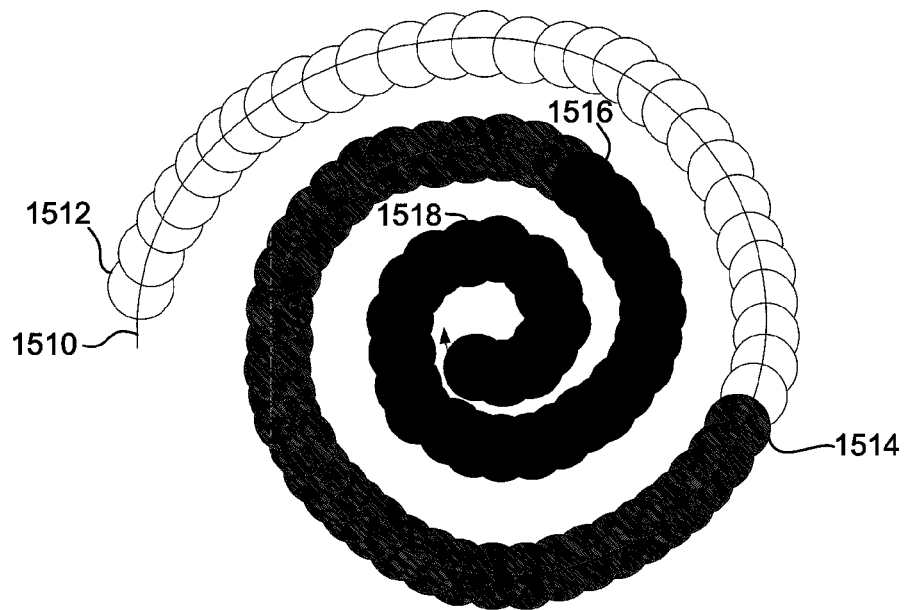
FIG. 15 schematically illustrates a laser beam path used for trepanning a hole or via through a workpiece according to one embodiment.

FIG. 15 schematically illustrates a laser beam path 1510 used for trepanning a hole or via through a workpiece according to one embodiment. Trepanning the laser beam along the beam path 1510 allows the laser beam to create a wider via, as compared to the spot size of the individual laser pulses. As shown in FIG. 15, the laser beam path 1510 comprises curved segments of different radii. In certain embodiments, the velocity and/or acceleration of the laser beam with respect to the workpiece changes as the radii of the curved segments become smaller toward the center of the via. To account for the changes in velocity and/or acceleration, a mixed-shape laser pulse train for the example shown in FIG. 15 uses a first temporal pulse profile shape starting with pulse 1512, a second temporal pulse profile shape starting with pulse 1514, a third temporal pulse profile shape starting with pulse 1516, and a fourth temporal pulse profile shape starting with pulse 1518, as indicated by the different gray scale values of the respective laser spots. An artisan will recognize from the disclosure herein, that more or fewer temporal pulse profile shapes may be used, depending on the particular application.

Figure 16:
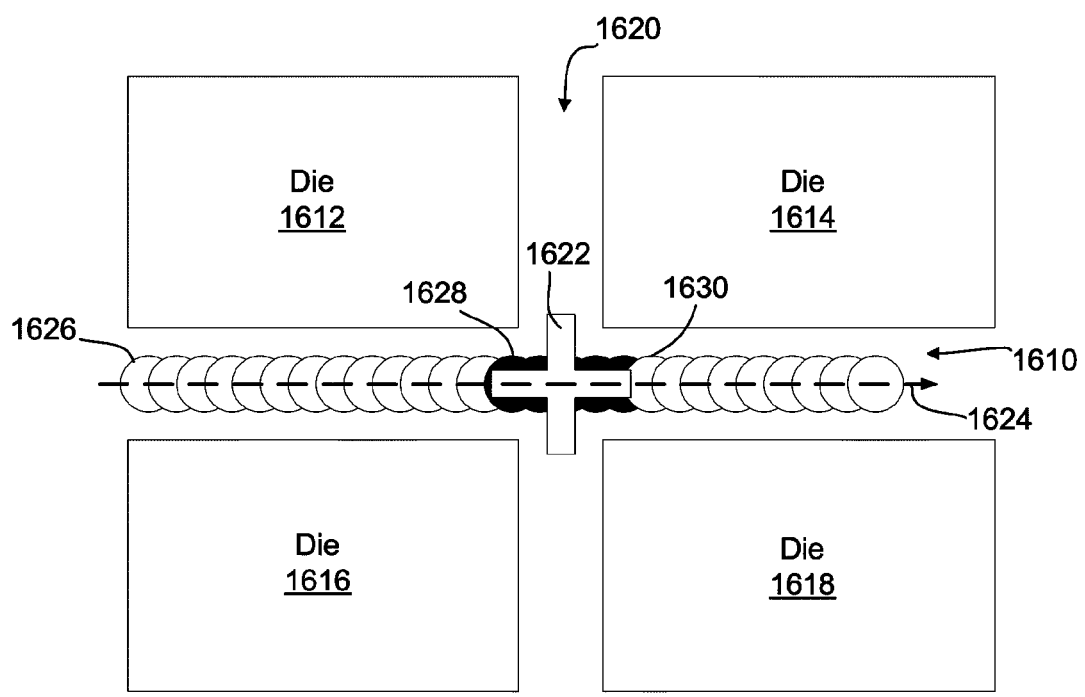
FIG. 16 schematically illustrates processing different target materials in a street of a workpiece according to one embodiment.

3. Example Processing Using Mixed-Shape Laser Pulse Trains Based on Target Materials FIG. 16 schematically illustrates processing different target materials in a first street 1610 of a workpiece according to one embodiment. Separation on the workpiece between a first die 1612, a second die 1614, a third die 1616, and a fourth die 1618 defines an intersection between the first street 1610 and a second street 1620. In this example, the first street 1610 and the second street 1620 comprise dielectric materials. However, a metallic feature 1622 is also included at the intersection of the first street 1610 and the second street 1620 (e.g., used for testing the integrated circuits formed in the workpiece before scribing or dicing). Artisans will recognize from the disclosure herein that the metallic feature 1622 may be located other than at the intersection.

As shown in FIG. 16, as a laser beam path 1624 passes along the first street 1610, a first temporal pulse profile shape may be used before (e.g., starting at pulse 1626) and after (e.g., starting at pulse 1630) the metallic feature 1622. As the laser beam path 1624 passes over the metallic feature 1622 (e.g., starting at pulse 1628), a second temporal pulse profile shape is used.

Although not shown, another example of change temporal pulse profile shapes based on target material is that of applying different temporal pulse shapes during the scribing and dicing of substrates containing light emitting diodes (LEDs). Application of a different temporal pulse profile shape when the laser spot is closer to the active area of the die may minimize damage such as light loss.

Figure 17:
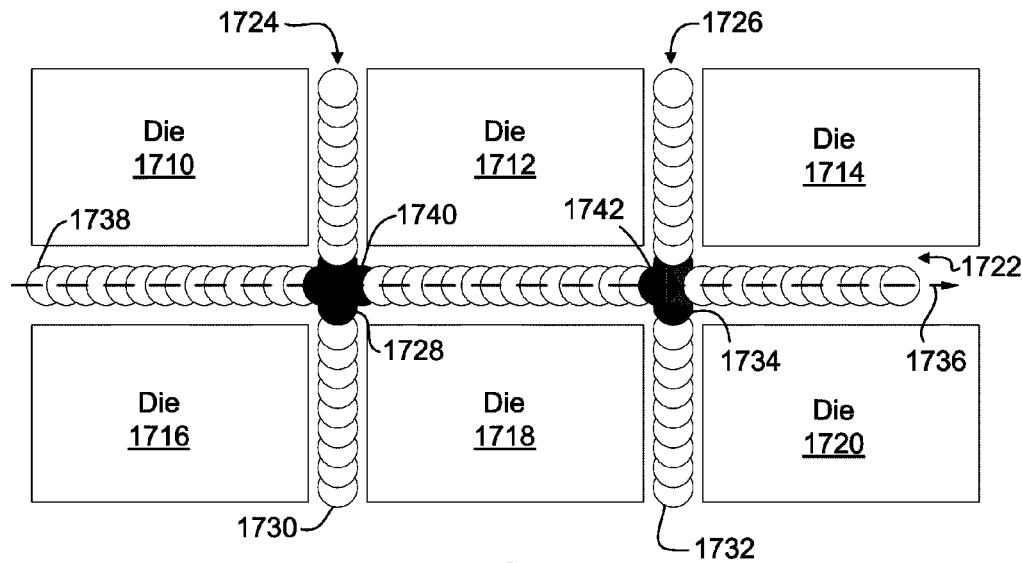
FIG. 17 schematically illustrates laser processing intersecting streets according to one embodiment.

4. Example Processing Using Mixed-Shape Laser Pulse Trains Based on Processed Features FIG. 17 schematically illustrates laser processing intersecting streets according to one embodiment. As represented by the differently shaded laser spots at the street intersections, different temporal pulse profile shapes are used at locations where two kerfs or scribes intersect or stitch together. In this example, separation between a first die 1710, a second die 1712, a third die 1714, a fourth die 1716, a fifth die 1718, and a sixth die 1720 defines intersections of a first street 1722 with a second street 1724 and a third street 1726. Each street 1722, 1724, 1726 is processed with a respective mixed-shape laser pulse train.

The mixed-shape laser pulse train used to process the second street 1724 includes a first temporal pulse profile shape for laser pulses at the intersection (e.g., pulse 1728) and a second temporal pulse shape for laser pulses that are not at the intersection (e.g., laser pulse 1730). The mixed-shape laser pulse train used to process the third street 1726 may also use the second temporal pulse profile shape to process locations that are not at the intersection with the first street 1722 (e.g., pulse 1732), and may use a third temporal pulse profile shape for laser pulses used at the intersection (e.g., pulse 1734). FIG. 17 shows a laser beam path 1736 along the first street 1722 after the second street 1724 and the third street 1726 have been processed. The mixed-laser pulse train used to process the first street 1722 may also include the second temporal pulse profile shape in non-intersection areas (e.g., pulse 1738), and a fourth temporal pulse profile shape at the intersections with the second street (e.g., pulse 1740) and the third street (e.g., pulse 1742).

Figure 18:
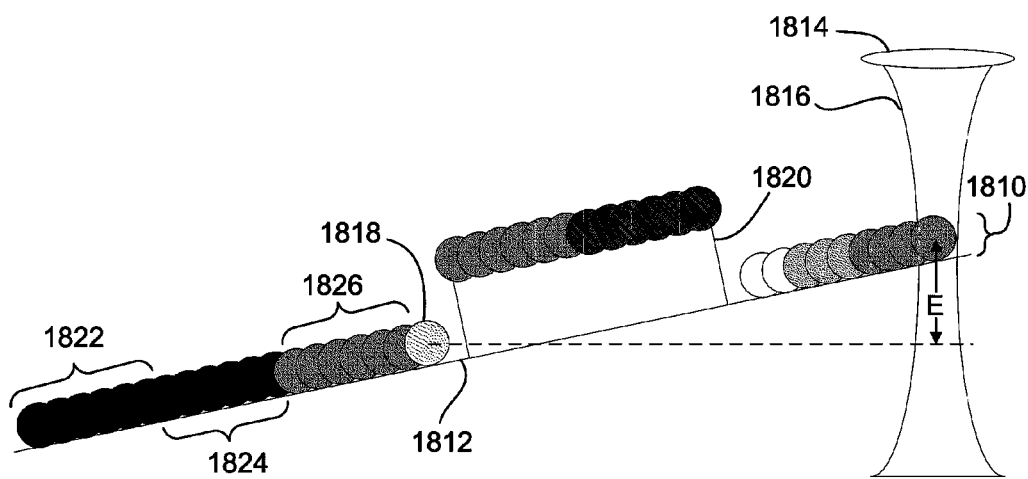
FIG. 18 schematically illustrates a beam focus location with respect to a target work surface according to one embodiment.

5. Example Processing Using Mixed-Shape Laser Pulse Trains Based on Z Position or Depth FIG. 18 schematically illustrates a beam focus location 1810 with respect to a target work surface 1812 according to one embodiment. As shown, a lens 1814 is used to focus a laser beam 1816 at the beam focus location 1810, which corresponds to the beam waist. The beam focus location 1810 may be located above or below the target work surface 1812 due to stage position errors. For example, a laser pulse 1818 at a location shown in FIG. 18 corresponds to an error E, as represented by the dashed line. In this example, the error characteristic is a focusing error that may cause changes in the processing spot size. The errors may result from dynamic servo tracking errors or having a known Z topology (such as tilt) of the workpiece being processed that is not tracked by the stages. For example, if processing a small field with a galvo or an AOD, it may be difficult or impossible for the Z stage to compensate for topology changes due to speed and bandwidth limitations. Similarly, the target work surface 1812 being processed could undergo a rapid change in Z height due to device features (such as feature 1820) or previous processing. In these cases, it may be found that one temporal pulse profile shape works better in focus, while different temporal pulse profile shapes may process better if the beam waist is located above or below the ideal focus location.

The changing grayscale in FIG. 18 indicates a changing temporal pulse profile shape depending upon the vertical beam focus location 1810 of the laser beam relative to the target work surface 1812. For example, a first set of laser pulses 1822 may have a first temporal pulse profile shape, a second set of laser pulses 1824 may have a second temporal pulse profile shape, a third set of laser pulses 1826 may have a third temporal pulse profile shape, and so forth. The different temporal pulse profile shapes provide for laser processing with different temporal characteristics such as energy to achieve an improved process with different degrees of focus error.

D. Pulse-to-Pulse on-the-Fly Delivery of Laser Pulses with Different Tailored Laser Pulse Shapes Certain embodiments disclosed herein select temporal pulse profile shapes based on predetermined recipe steps. In addition, or in other embodiments, the temporal pulse profile shape of one or more laser pulses may be determined on-the-fly based on a calculated or detected need for a certain type of processing. For example, feedback may be given to the laser source to request a specific temporal pulse profile shape. In one embodiment, a thickness sensor determines that the laser is approaching a thicker material. In response, a processor controls the laser source to change the temporal pulse profile shape so as to provide more effective cutting of the thicker material.

Figure 19:
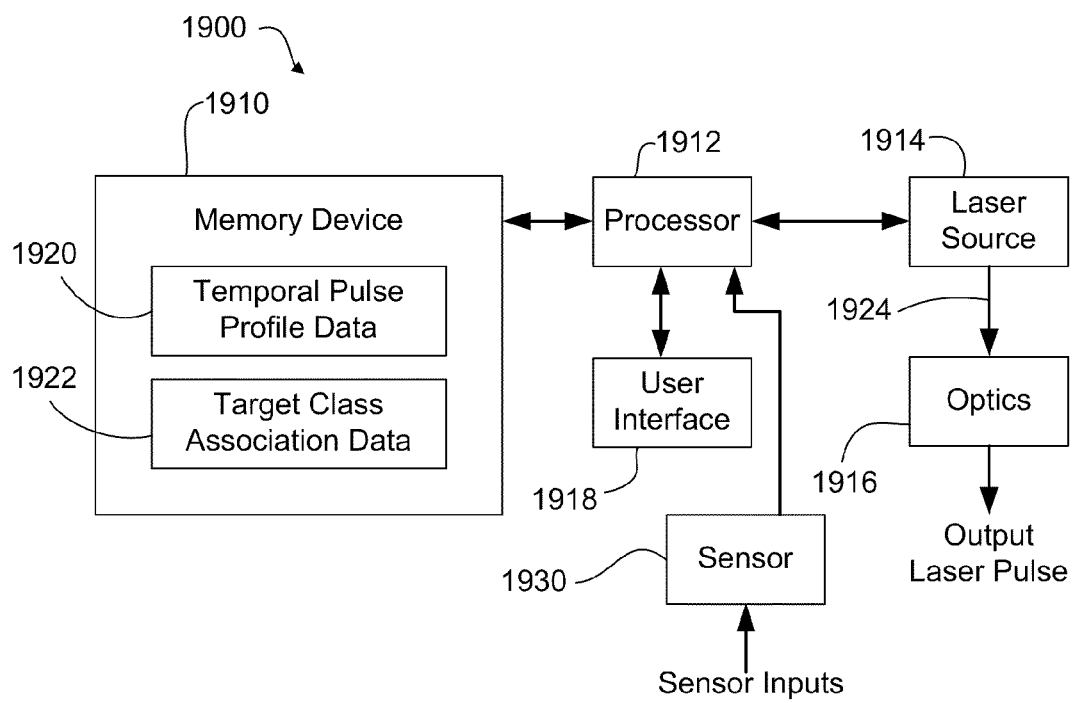
FIG. 19 is a simplified block diagram of a laser processing system according to one embodiment.

FIG. 19 is a simplified block diagram of a laser processing system 1900 according to one embodiment. The laser processing system 1900 includes a memory device 1910, a processor 1912, a laser source 1914, optics 1916, and a user interface 1918. The laser processing system 1900 may also include a sensor 1930 configured to provide feedback used by the processor 1912 to select a temporal pulse profile shape on-the-fly.

The processor 1912 may be a general-purpose or special-purpose computer (or other electronic device) configured to execute computer-readable instructions (e.g., stored in the memory device 1910 or another computer-readable storage medium) to perform the processes described herein. The processor 1912 may be embodied as a microprocessor, a microcontroller, a digital signal processor (DSP), or other device known in the art.

The memory device 1910 may store temporal pulse profile data 1920 that defines a plurality of different temporal pulse profile shapes that the laser source 1914 is capable of generating. The temporal pulse profile data 1920 may define, for example, one or more of the temporal pulse profile shapes shown in FIGS. 1A, 1B, 2A, 2B, 3, 4A, 4B, 4C, 4D, 5A, 5B, 6A, 6B, 6C, 6D, and/or any of the other types of temporal pulse profiles described herein. In some embodiments, a user may interact with the processor 1912 through the user interface 1918 to define custom temporal pulse profiles or to alter the parameters (e.g., pulse duration, power amplitude, symmetry, and other parameters defining shape) of predetermined or default temporal pulse profiles stored in the memory device 1910 as temporal pulse profile data 1920.

The memory device 1910 may also store target class association data 1922. The target class association data 1922 associates one or more of the temporal pulse profiles defined by the temporal pulse profile data 1920 with corresponding target class structures. For example, the target class association data 1922 may associate a particular temporal pulse profile with a particular material or structure on or within a workpiece. In some embodiments, a user may interact with the processor 1912 through the user interface 1918 to define new target class associations or to modify predetermined or default settings in the target class association data 1922.

During operation, the processor 1912 selects a target material or structure on or within a workpiece (not shown) for processing. Based on the target class association data 1922, the processor 1912 selects the temporal pulse profile data 1920 corresponding to the selected target material or structure. The laser source 1914 then generates a laser pulse 1924 based on the selected temporal pulse profile data 1920. Examples of how the laser source 1914 generates desired pulse shapes are provided below. The optics 1916 then direct the generated laser pulse 1924 to the workpiece so as to process the selected structure. The optics 1916 may include, for example, mirrors, focusing lenses, electro-optic or acousto-optic deflectors and/or modulators, fast-steering mirrors, galvanometer-driven mirrors, and other optical devices that may be coordinated with translation stages (e.g., X, Y, and/or Z stages) to provide the generated pulse to the selected structure.

In certain embodiments, the processor 1912 selects the temporal pulse profile data 1920 based on a particular recipe step. In addition, or in other embodiments, the processor 1912 selects the temporal pulse profile data 1920 based on feedback from the sensor 1930. For example, in one embodiment, the sensor 1930 comprises a thickness sensor that detects a thickness of the target material along a laser beam path. The sensor 1930 provides material thickness measurements to the processor 1912, which responds by selecting a temporal pulse profile shape configured to effectively process the detected thickness of the material. In one embodiment, the sensor 1930 includes a laser-based reflection position sensors such as sold by Keyence Corporation of Osaka, Japan. In another embodiment, the sensor 1930 includes a contact-type sensor (e.g., where a sensor tip is lowered until it contacts the sample, and the height difference between the sample and chuck and determined). In another embodiment, the sensor 1930 includes an optical microscope (e.g., that is initially focused on the chuck, then focused on the sample surface, and wherein thickness is calculated based on the difference in focus height).

II. Programmable Temporal Pulse Profiles

In one embodiment, a laser processing system is configured to select a first temporal pulse profile for a first type of structure on a workpiece and a second temporal pulse profile for a second type of structure on the workpiece. A temporal pulse profile used for processing a particular integrated circuit feature, such as a link on a semiconductor memory device, may be inefficient or ineffective for performing a separate laser processing operation on the same device. Thus, the laser processing system provides on-the-fly selection of appropriate temporal pulse profiles based on the type of target structure being processed.

Figure 20A:
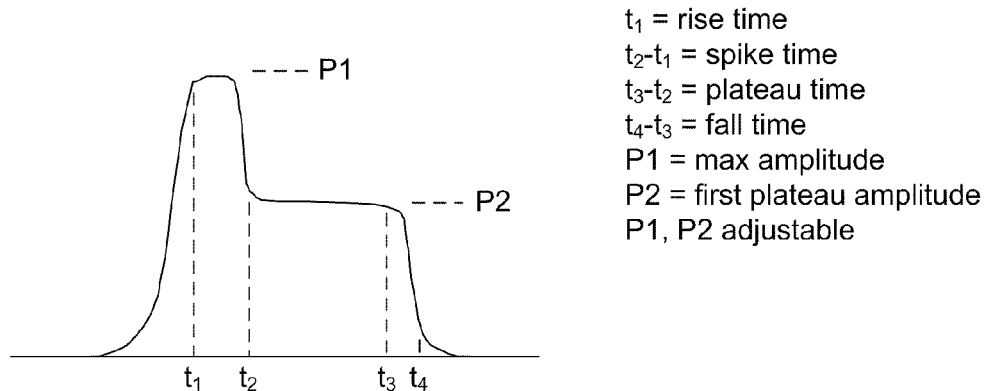
FIGS. 20A and 20B are example temporal pulse shapes of tailored laser pulses generated by a dynamic laser pulse shaper and power amplifier according to one embodiment.
Figure 21:
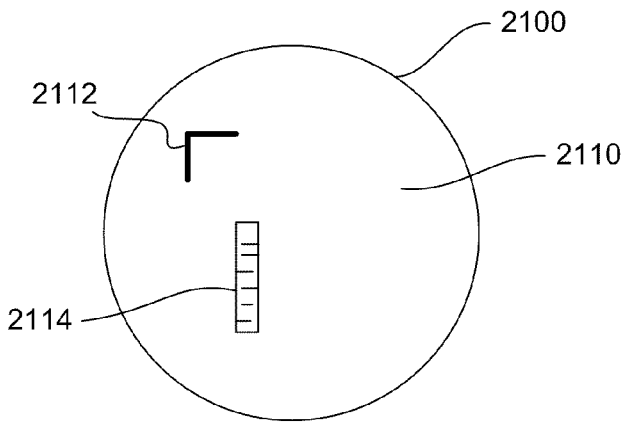
FIG. 21 is a schematic diagram illustrating a semiconductor wafer having on its work surface a target alignment feature and electrically conductive link structures according to one embodiment.

For example, FIG. 21 is a schematic diagram illustrating a semiconductor wafer 2100 having on its work surface 2110 a target alignment feature 2112 and electrically conductive link structures 2114 according to one embodiment. A shaped laser pulse with a high pulse energy and a high peak power resulting from a leading edge spike (e.g., see FIG. 20A) may be useful for selectively blowing one or more of the link structures 2114. However, the high pulse energy and/or high peak power may cause damage to the target alignment feature 2112 during alignment scans, which may then result in erroneous position information derived from such scans. Thus, the laser processing system may be operated in a first temporal pulse profile mode that produces pulses with relatively lower pulse energy and peak power for target scans, and a second temporal pulse profile mode that produces pulses with relatively higher pulse energy and peak power for blowing the link structures 2114.

As those skilled in the art will appreciate, a wide range of peak powers, pulse energies, and temporal profiles may be attractive for laser processing of structures on a workpiece. A tailored pulse shape may be employed, for example, to sever electrically conductive link structures in a wide array of semiconductor memory devices, including DRAM, SRAM, and flash memory; to produce laser drilled micro-vias in flexible circuits, such as copper/polyamide layered materials, and in integrated circuit (IC) packages; to accomplish laser processing or micromachining of semiconductors, such as laser scribing or dicing of semiconductor integrated circuits, silicon wafers, and solar cells; and to accomplish laser micromachining of metals, dielectrics, polymeric materials, and plastics. One skilled in the art will recognize that many other types of workpieces and/or workpiece structures may be processed according to the embodiments disclosed herein.

Figure 22:
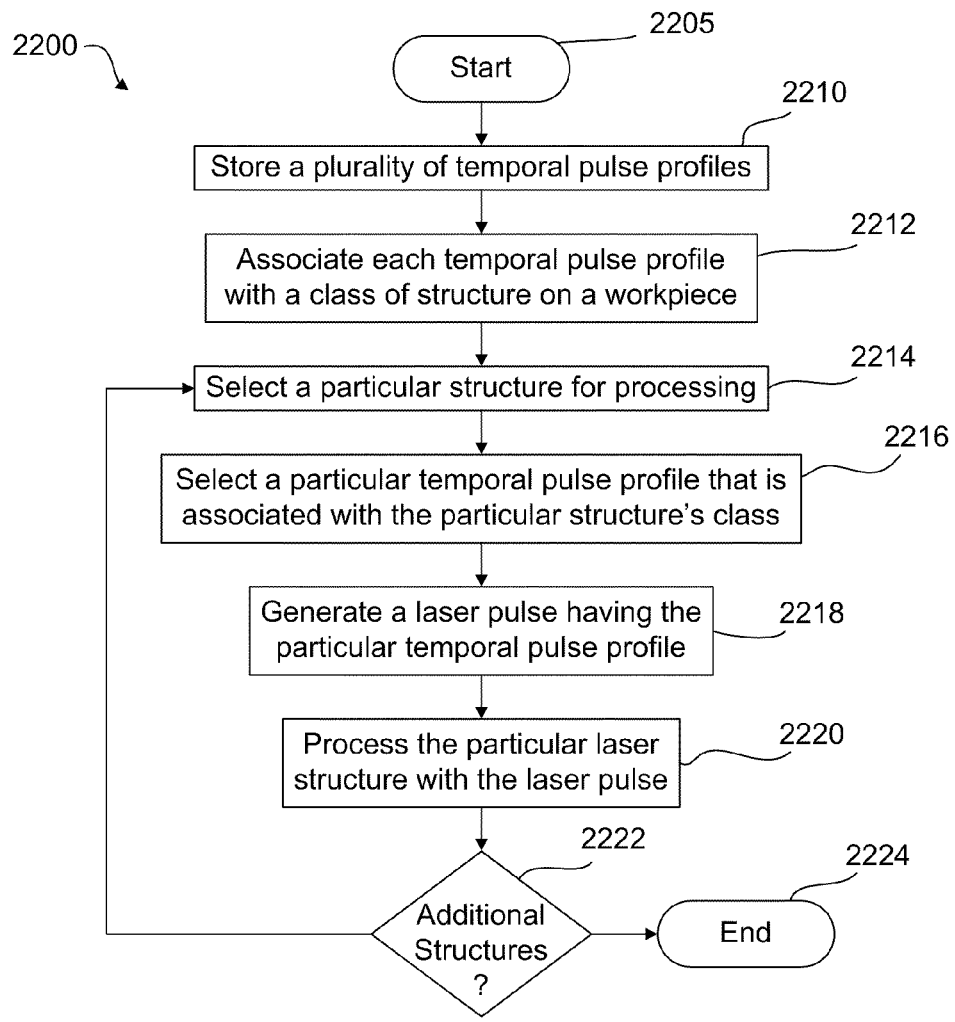
FIG. 22 is a flow chart of a method for laser processing of structures on or in a workpiece according to one embodiment.

Thus, in one embodiment, the laser processing system allows a user to program a temporal pulse profile for processing a specific type or class of structures. For example, FIG. 22 is a flow chart of a method 2200 for laser processing of structures on or in a workpiece according to one embodiment. After starting 2205, the method 2200 includes storing 2210 a plurality of user-defined temporal pulse profiles, and associating 2212 each of the temporal pulse profiles with a type or class of structure on a workpiece or group of workpieces. The class of structures may include, for example, alignment structures, electrically conductive links, and resistors or other discrete components. In some embodiments, the class may also include, for example, a scribe line or kerf cut into the workpiece with the laser.

When processing workpieces, the method 2200 includes selecting 2214 a particular structure on or within a workpiece for processing, and selecting 2216 a particular temporal pulse profile from the plurality of temporal pulse profiles that is associated with the particular structure's class. The method 2200 also includes generating 2218 a laser pulse having the particular temporal pulse profile, and processing 2220 the particular structure with the generated laser pulse. An artisan will recognize from the disclosure herein that instead of using a single pulse to process the particular structure, the laser processing system may direct multiple pulses to the particular structure. Further, each of the pulses directed to the particular structure may have the same temporal pulse profile, or at least one of the pulses may have a different temporal pulse profile.

The method 2200 then queries 2222 whether the workpiece includes additional structures to process. If there are additional structures to process, the method 2200 then selects 2214 another particular structure for processing. Thus, the method 2200 provides on-the-fly processing of structures using a plurality of different temporal pulse profiles based on the type of structure. If there are no additional structures to process, the method 2200 ends 2224.

III. Example Laser Processing System

Figure 23:
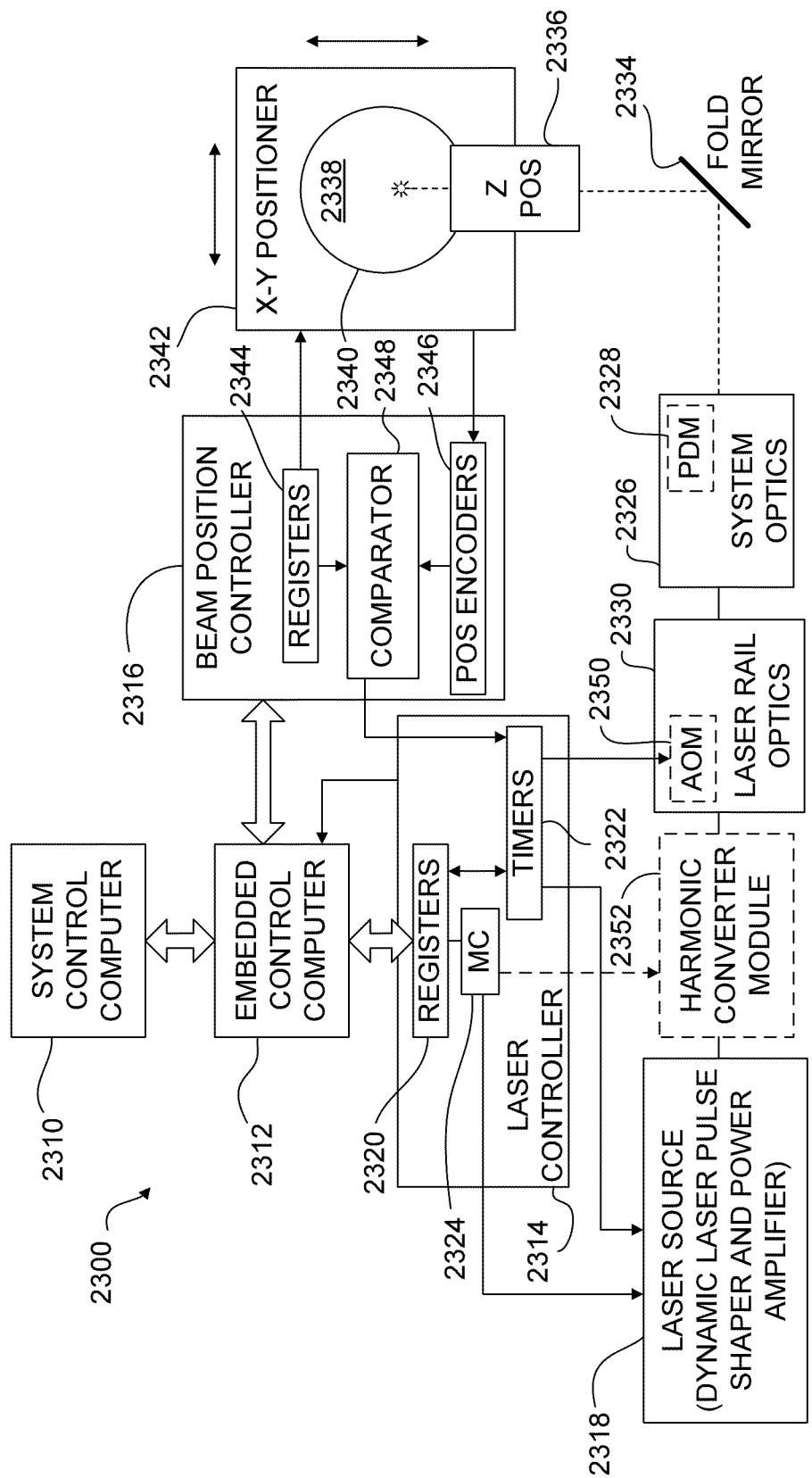
FIG. 23 is an example laser processing system for generating and monitoring laser pulses with different temporal pulse profiles according to one embodiment.

FIG. 23 is an example laser processing system 2300 for generating and monitoring laser pulses with different temporal pulse profiles according to one embodiment. The system 2300 includes a system control computer 2310 to provide an embedded control computer (ECC) 2312 overall system operational commands to which a laser controller 2314 and a beam position controller (BPC) 2316 respond. The system 2300 also includes a laser source 2318 that is controlled by the laser controller 2314, which includes command and data registers 2320 and timers 2322 that directly or indirectly communicate with the ECC 2312 and the BPC 2316. As discussed in detail below, in one embodiment, the laser source 2318 includes a dynamic laser pulse shaper and fiber power amplifier. In another embodiment, the laser source 2318 includes a tandem amplifier. In yet another embodiment, the laser source 2318 includes a "sliced" pulse laser that uses an electro-optical modulator (see the description herein related to FIGS. 36 and 37).

Figure 20B:
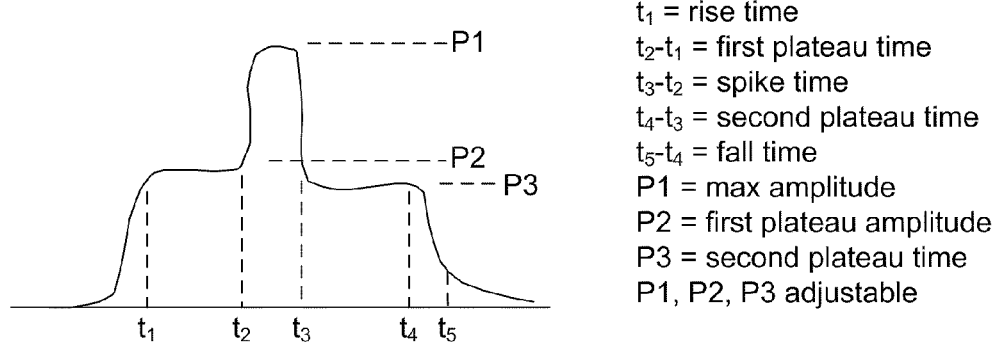

The laser controller 2314 receives commands from the ECC 2312 and signals from the BPC 2316. The laser controller 2314 provides commands to the laser source 2318 for pulse emission (through external trigger commands) and pulse shape control. In one embodiment, the laser controller 2314 receives commands from the ECC 2312, and responds to the commands by issuing external trigger commands to the laser source 2318 from a modulator controller (MC) 2324 in coordination with the BPC 2316 based on workpiece feature position data. The MC 2324 controls the times of emission and shapes of pulses emitted by laser source 2318. Alternatively, the laser source 2318 emits pulses with an interpulse time that is communicated to the laser controller 2314, the ECC 2312, or both. In one embodiment, depending on the type of workpiece feature on which the emitted laser pulse will be incident, the laser source 2318 is commanded by the ECC 2312 to produce a specific temporal pulse profile. Illustrative examples of such temporal profiles are shown in FIGS. 20A and 20B.

To provide programmable temporal pulse profiles, according to one embodiment, the system 2300 provides instrumentation for satisfactory measurement and calibration of a range of pertinent laser process parameters, such as temporal profile, energy per pulse, focused beam propagation attributes, and other parameters discussed below. As shown in FIG. 23, system optics 2326 may include a photodetection module 2328, which may be employed for the detection of incident laser output and of laser output reflected from the work surface. In one embodiment, the photodetection module 2328 includes a photodetector circuit capable of fine digitization of the detected light signals, such as the incident and reflected laser output signals, thereby allowing for the incident and reflected pulse waveforms to be effectively digitized. Thus, the system 2300 allows for satisfactory measurement of the incident and reflected laser waveforms, allowing calculation and calibration of the temporal profile, temporal profile variation, pulse amplitude stability, pulse energy stability, and the energy per pulse. As those skilled in the art will recognize, scanning the laser beam across a target area of sharply varying reflectivity at the laser wavelength provides a method for measurement and calculation of the focused spot size attributes of the laser beam.

Figure 24:
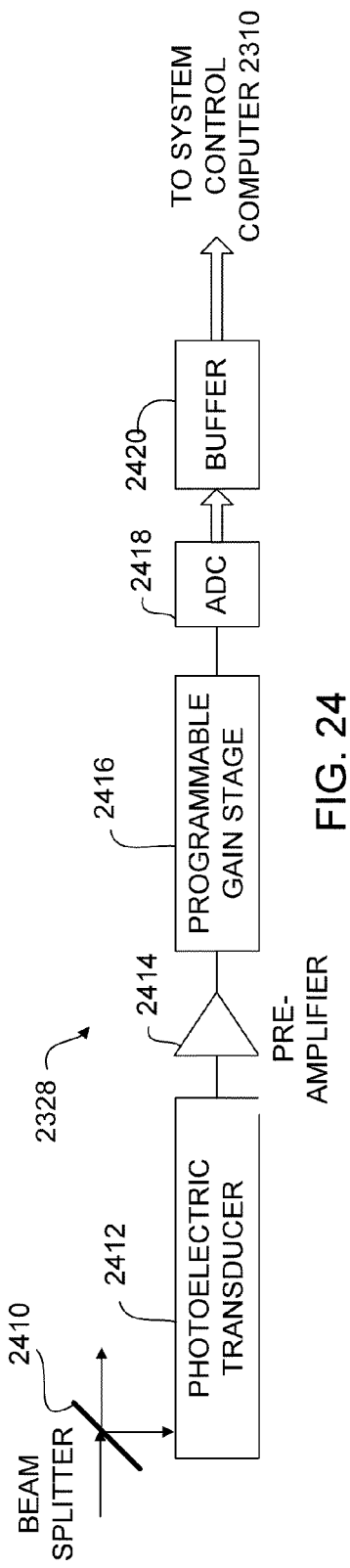
FIG. 24 is a block diagram of an example photodetection module according to one embodiment.

FIG. 24 is a block diagram of an example photodetection module 2328 according to one embodiment. The photodetection module 2328 includes an optical beam splitter 2410 to split off a portion of the output from laser rail optics 2330 shown in FIG. 23 onto a photoelectric transducer 2412 connected to a signal conditioning pre-amplifier 2414. The pre-amplifier 2414 is connected to a programmable gain stage 2416, which feeds into a high-speed analog-to-digital converter (ADC) 2418. The digitized output of the ADC 2418 is buffered by a circular buffer 2420 for later transfer to the system control computer 2310 shown in FIG. 23.

The photoelectric transducer 2412 may be chosen for sensitivity to a particular laser wavelength, for a temporal response characteristic that is consistent with the temporal profile of the shaped laser pulses, and/or for a dynamic range consistent with the anticipated range of intensities of optical radiation to which it will be exposed. The programmable gain stage 2416 serves to compensate for the variable optical attenuation implemented in the laser rail optics 2330 if the attenuation is implemented prior to the point where the beam is sampled by the photoelectric transducer 2412. Attenuating the beam to reduce power at the work surface would also reduce the amount of power incident on the photoelectric transducer 2412. The programmable gain stage 2416 electrically restores the signal level to maximize the resolution of the signal as sampled by the ADC 2418.

The ADC 2418 may be chosen for a sample rate and slew rate sufficiently high so as to resolve the anticipated pulse profiles. A flash converter architecture may be used, but because the function may be continuously sampling data, pipelining and/or successive approximation technologies are also suitable and may provide better performance metrics. The conversion width of the ADC (e.g., 8-bit, 12-bit, 16-bit or more) may be chosen based on the desired resolution and dynamic range capabilities of the system 2300.

The digitized samples of the detected signal are continuously transferred into the circular buffer 2420. The circular buffer 2420 may be sufficiently sized so as to store the entire pulse from start to finish with at least enough excess capacity to account for latency in analysis of the data by pulse detection logic. In real time, a pulse detector logic function analyzes the digitized pulse waveform to detect the presence of a pulse in the buffer 2420. When the pulse is detected and determined to be complete, this function stops the action of continuing to update the buffer 2420 and holds the buffer 2420 for later upload to the system control computer 2310. The digitization and storage function may later be "re-armed" by a subsequent command from the system control computer 2310. The pulse detector logic function may be implemented using a digital signal processor (DSP), a field programmable gate array (FPGA), or other computational engine. An FPGA implementation may include both DSP and buffer memory elements in a single device.

Once a complete pulse has been stored in the circular buffer 2420, it can be uploaded to the system control computer 2310 for analysis. Analysis may include, for example, determination of peak height, determination of pulse energy by integrating the profile of the pulse, determination of pulse width, and characterization of pulse profile as discussed in detail below.

In addition, or in another embodiment, the DSP, FPGA, or other computation engine might also implement a combination of the pulse characterization metric computations. In such an embodiment, the system 2300 may choose not to upload the raw digitized pulse data to the system control computer 2310, but instead only upload some subset of the pulse characterization metrics. An advantage of this embodiment is to reduce bandwidth requirements of the connection between the photodetection module 2328 and the system control computer 2310, which allows more measurements to be made faster while maintaining a relatively simple electrical interface.

Returning to FIG. 23, in one embodiment of the laser processing system 2300, the output from the laser source 2318 is applied to the laser rail optics 2330 and the system optics 2326. Output from the system optics 2326 is directed by a fold mirror 2334 toward a Z-positioning mechanism 2336, which may incorporate a lens assembly, for subsequent delivery to a work surface 2338 of a target specimen 2340 for laser processing of workpiece features (e.g., the target alignment feature 2112 and the link structures 2114 shown in FIG. 21). The BPC 2316 provides X-Y coordinate positioning signals to direct an X-Y positioning mechanism 2342 to a location where the output from the Z-positioning mechanism 2336 can process a desired target feature. The X-Y positioning mechanism 2342 receives command position signals from registers 2344 of the BCP 2316 and directs actual position signals to position encoders 2346 of the BCP 2316, which includes a comparator module 2348 that determines a position difference value and sends it to the timers 2322. The timers 2322 respond by sending a trigger signal appropriately timed to operate in the laser rail optics 2330 an acousto-optic modulator (AOM) 2350 that modulates the output from the laser source 2318. Those skilled in the art will recognize that the pulse output from laser source 2318 may be directed into a harmonic conversion module 2352 and subsequently delivered by way of the laser rail optics 2330 and the system optics 2326 to the work surface 2338 for harmonic laser processing of workpiece features.

Those skilled in the art will recognize that alternative arrangements of laser processing system elements may be employed and a wide variety of workpieces may be processed by the laser processing system 2300.

Figure 25A:
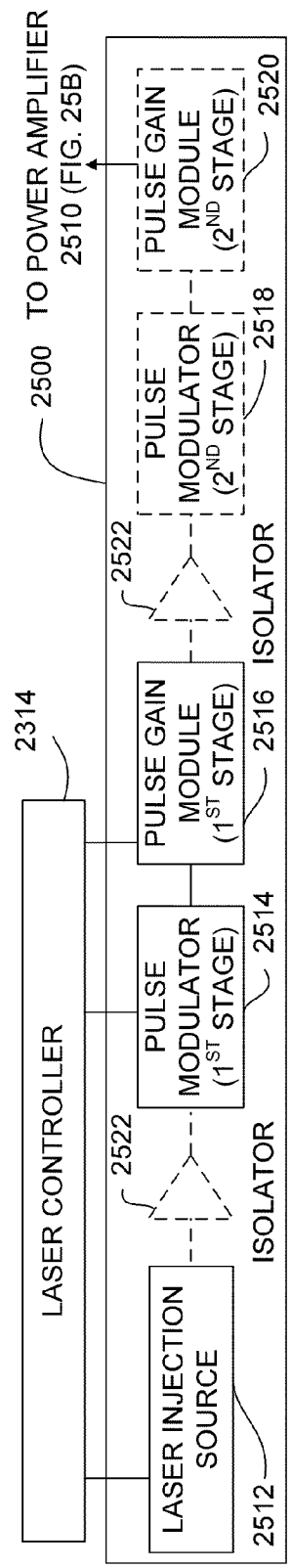
FIGS. 25A and 25B are block diagrams illustrating the laser source shown in FIG. 23 according to one embodiment.
Figure 25B:
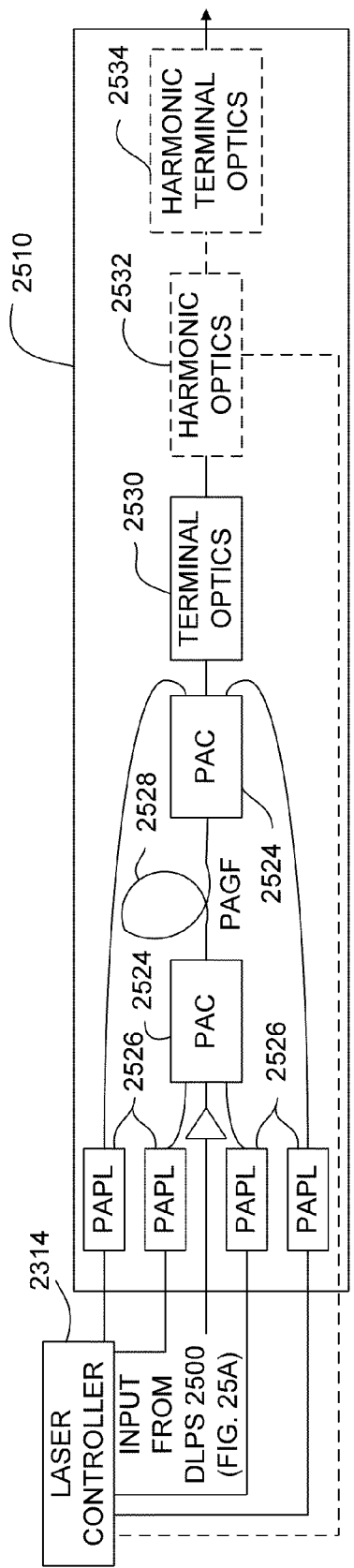

FIGS. 25A and 25B are block diagrams illustrating the laser source 2318 shown in FIG. 23 according to one embodiment. A similar laser source is described in detail in U.S. Patent Application Pub. No. 2006-0159138, titled "Pulsed Laser Light Source," by Deladurantaye et al. FIG. 25A illustrates a dynamic laser pulse shaper (DLPS) 2500, and FIG. 25B illustrates a fiber power amplifier (FPA) 2510. As shown in FIG. 25A, the DLPS 2500 includes a laser injection source 2512, a first pulse modulator 2514, and a first pulse gain module 2516. In some embodiments, the DLPS 2500 also includes a second pulse modulator 2518 and a second pulse gain module 2520. The DLPS 2500 may also include one or more isolators 2522 (two shown) between elements. As those skilled in the art will appreciate, several alternative arrangements of the modulator and gain elements may be advantageously employed.

The laser injection source 2512 emits a continuous wave (CW) output that is then modulated by the first pulse modulator 2514 to produce a suitable first laser pulse profile as commanded by the laser controller 2314. In another embodiment, the laser injection source 2512 may produce a pulsed output. The first pulse modulator 2514 may be an electro-optic modulator, an acousto-optic modulator, or other optical modulator. The laser pulse produced by the first pulse modulator 2514 is then transformed by the first pulse gain module 2516 to produce a transformed temporal pulse output that is suitable for amplification and subsequent delivery through the laser rail optics 2330 and system optics 2326 to the work surface 2338 for laser processing of workpiece features.

The laser controller 2314 may be programmed with a matrix of command signals for input to the first pulse modulator 2514 to produce a range of laser pulse profiles that, when subsequently input to the first pulse gain module 2516, result in the production of transformed laser pulse profiles desired as output from the DLPS 2500. Accordingly, the system control computer 2310 may then select the temporal pulse profile output from the DLPS 2500 as a function of a workpiece feature to be processed through commands issued to the ECC 2312, which in turn issues commands to the laser controller 2314. As shown in FIG. 25A, the DLPS 2500 may, in some embodiments, include the second pulse modulator 2518 and the second pulse gain module 2520 to provide additional or more complex shaping of the temporal pulse profile output from the DLPS 2500.

In one embodiment, the transformed pulse output from the DLPS 2500 is injected into the FPA 2510 shown in FIG. 25B. The FPA 2510 includes power amplifier couplers (PACs) 2524 (two shown) that allow injection of the DLPS's output and output from power amplifier pump lasers (PAPLs) 2526 (four shown) into a power amplifier gain fiber (PAGF) 2528. The laser controller 2314 is connected to the PAPLs 2526 and may, for example, control the PAPLs' current (e.g., through a diode laser or a semiconductor laser), control the PAPLs' temperature (e.g., through a thermo-electrical cooler), and/or monitor the PAPLs' power (e.g., through a photodiode). The PACs 2524 may be placed at either or both ends of the fiber. Multiple additional PACs may be spliced into the length of the PAGF 2528. The PAGF 2528 is preferably a large mode area (LMA) polarization maintaining fiber. The PAGF 2528 may include frequency selecting structures. The PAGF 2528 in one embodiment is a waveguide device with a silica fiber core doped with rare earth ions and clad with one or more concentric sheaths of optical material. The PAGF 2528 in another embodiment includes concentric cladding sheaths that have regions doped with rare earth ions. The PAGF 2528 in yet another embodiment is a photonic crystal fiber in which the cladding sheath or sheaths include a highly periodic distribution of air holes. In another embodiment, the PAGF 2528 is a single-mode polarization maintaining fiber. Those skilled in the art will recognize that the number of PAPLs 2526 used is determined by the type and length of the PAGF 2528 and the desired optical pulse output characteristics from the FPA 2510. The output from the PAGF 2528 may be collimated and polarized, as may be required by terminal optics 2530.

In one embodiment, output pulses from the FPA 2510 are provided through the terminal optics 2530, harmonic optics module 2532, and optional harmonic terminal optics 2534. The harmonic optics module 2532 includes nonlinear crystals for the conversion of the incident output pulse to a higher harmonic frequency through the well-known method of harmonic conversion. In an example embodiment, for harmonic conversion of 1064 nm output from the FPA 2510 to 355 nm, the harmonic optics module 2532 includes Type I non-critically phase-matched lithium triborate (LBO) crystal for second harmonic generation (SHG) conversion followed by a Type II, sum frequency generation LBO crystal cut for 1064 nm plus 532 nm to 355 nm harmonic conversion. In another example embodiment, for conversion to 266 nm, the THG LBO crystal may be replaced by a critically phase-matched Beta-Barium Borate (BBO) crystal. In yet another example embodiment, for fourth harmonic generation (FHG) conversion to 266 nm, cesium lithium borate (CLBO) may be used. One skilled in the art will recognize from the disclosure herein that the harmonic optics module 2532 may also include focusing lens elements. The elements in the harmonic optics module 2532 may be placed into temperature controlled mounts that has a temperature set and controlled by the laser controller 2314 using active and/or passive feedback loops so as to precisely control phase-matching temperatures.

IV. Pulse Shape Feedback and Control

As discussed above, tailored pulse profiles are generally not adequately described by peak power, pulse energy, and pulse width metrics. Thus, certain embodiments described in detail below provide pulse shape feedback (e.g., sensing) and control. The embodiments include specific types of feedback and example feedback methods. Pulse shape control and control algorithms are also described.

When processing workpieces with tailored laser pulses, it may be desirable to reproduce pulse shapes from one link processing system to another, to maintain pulse shapes over time, and to provide pulse-shape related statistical feedback suitable for correlating with process trends. Thus, in one embodiment, a laser processing system provides pulse-shape feedback that goes beyond the typical peak height, pulse energy, and pulse-width solution generally used for solid state lasers. In one embodiment, the laser processing system includes an inline pulse profiler that is configured to monitor the pulse shape at runtime. Data collected by the pulse profiler are processed through a set of predetermined algorithms to compute metrics on the pulse shape and/or deviation from a nominal pulse shape. The data and statistical results are available for creating and maintaining reproducible pulse shapes and statistical analysis of pulse shapes. The data and statistical results may also be available for pulse shape control, as described below.

A. Feedback Metrics

The following example metrics may be used to specify and analyze temporal pulse profiles. Temporal pulse profiles may be defined as a combination of several parameters corresponding to pulse features such as spikes, plateaus, and slopes. For example, a chair-shaped pulse includes an initial peak or spike followed by a plateau. An artisan will recognize from the disclosure herein that additional features may also be defined.

While it may be desirable to specify all aspects of the pulse shape, a limited set of parameters are controlled in certain embodiments to generate tailored pulses. For example, in one embodiment, there are about twelve variables that may be adjusted to generate pulse shapes, and several of these parameters may not be used when specifying shorter pulses. The number of controlled parameters may depend on the laser's ability to respond to the parameters.

In one embodiment, temporal pulse profiles are defined by general parameters such as rise time and pulse duration. These parameters fall into two different categories consisting of overall pulse parameters and feature defining parameters. Overall pulse parameters are metrics that apply to the whole pulse shape such as rise time, total pulse duration, and overall peak time. Feature defining parameters are metrics that apply to portions of the pulse shape such as the time, height, and width of peaks or the start, stop, and height of plateaus.

1. Overall Pulse Parameters

The following example feedback metrics apply to an overall pulse shape.

(i) Peak Pulse Power

Figure 26:
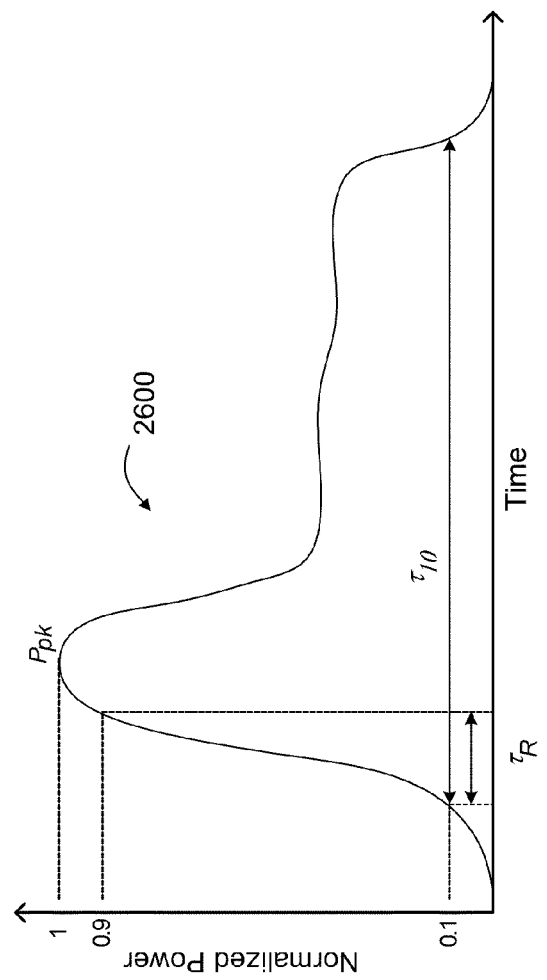
FIG. 26 graphically illustrates a normalized tailored laser pulse characterized, at least in part, by a peak pulse power according to one embodiment.

FIG. 26 graphically illustrates a normalized tailored laser pulse 2600 characterized, at least in part, by a peak pulse power $P_{pk}$ according to one embodiment. Pulse shapes may be normalized relative to a peak pulse power to ease amplitude specifications for peaks and plateaus. The peak pulse power $P_{pk}$ is defined as the maximum power any time during the pulse. The peak pulse power may be specified with a tolerance for analysis of multiple pulses with the same normalization scaling.

(ii) Pulse Start Time

Generally, feedback metrics are defined such that they may be measured. However, there is often some ambiguity as to the exact moment that a measured pulse commences. Thus, the timing of specific pulse features may be specified relative to a pulse start time that does not have a precisely identifiable time value. For the purpose of measurement and verification, the pulse start time $T_{start}$, which is used to define the timing of pulse features, has no absolute definition. When comparing specifications and measured shapes according to certain embodiments, the start time may be advanced or retarded in order to make the measured shape features best comply with pulse feature specifications.

(iii) Pulse Rise Time

As shown in FIG. 26, a pulse rise time $\tau_R$ according to one embodiment is defined as the time interval to transition from approximately 10% to approximately 90% of the difference between a lower level and an upper level of the normalized power profile. In certain embodiments, the lower level corresponds to zero pulse energy and the upper level corresponds to the height of an initial spike that includes the highest power level of the pulse 2600.

(iv) 10% Pulse Duration

As shown in FIG. 26, a 10% pulse duration $\tau_{10}$ according to one embodiment is defined as the maximum time interval between the first and the last point in time that attains 1/10 of the peak pulse power. This definition allows a pulse to drop below 10% of the peak power without defining additional 10% pulse duration sections. This definition is used because peaks and plateaus generally include temporal power variations that may drop below 10%. An artisan will recognize from the disclosure herein that other percentages may also be used depending on the particular application.

(v) Time Integral Squared Pulse Duration

A single tailored pulse may be measured using an oscilloscope with a suitable photodetector. One way to describe the resulting power versus time curve is by the peak height and FWHM values. As discussed above, however, FWHM is not an effective method to compare pulses with significantly different temporal profiles, such as those generated by tailored pulse technology. Rather, what is needed is a way to describe the pulse width of a peak in relation to the resulting effects that will be observed in the material that is to be processed.

Figure 27A:
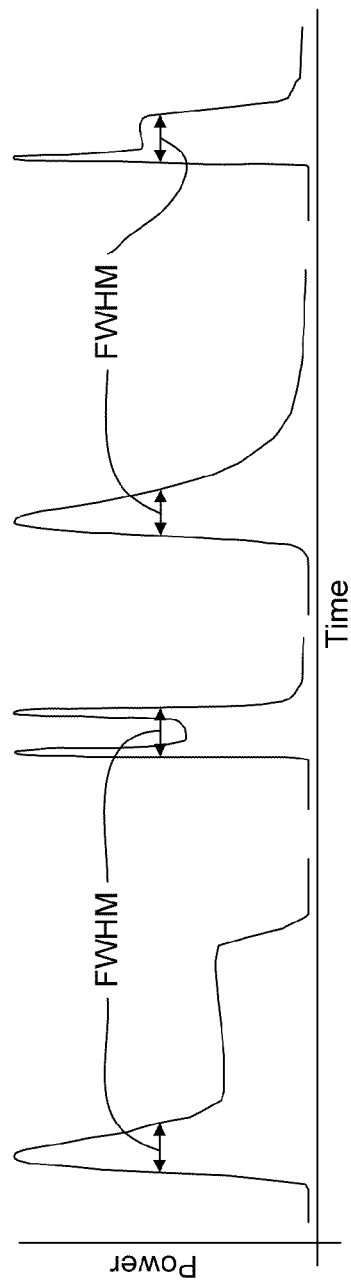
FIGS. 27A and 27B illustrate a problem stemming from using peak power and FWHM to characterize tailored laser pulses.
Figure 27B:
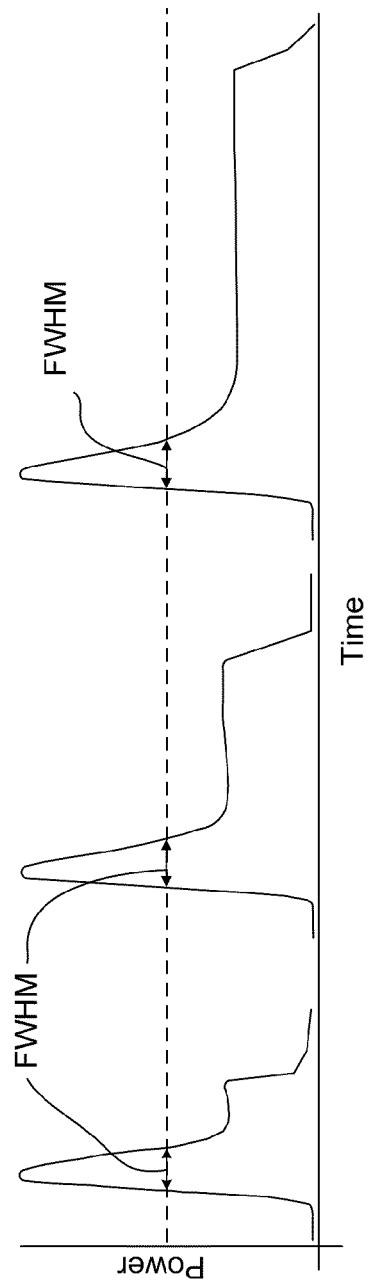

FIGS. 27A and 27B illustrate a problem stemming from using peak power and FWHM to characterize tailored laser pulses. FIGS. 27A and 27B each illustrates multiple different temporal pulse shapes generated by, for example, a fiber laser or MOFPA according to certain embodiments (four temporal pulse shapes are shown in FIG. 27A and three temporal pulse shapes are shown in FIG. 27B). Although the peak heights and FWHM values of the four pulses in FIG. 27A are identical, these four pulse shapes yield significantly different results when used for laser processing of electrically conductive links.

FIG. 27B provides another example for shaped pulses with different length "chairs." When the chair height is below the half-maximum value, a significant amount of pulse energy may be added to the pulse (e.g., the length of the "chair" portion of the pulse may be extended out indefinitely) without any change in the FWHM value.

Another accepted industry standard characterization of pulse width, the time integral squared ($T_{IS}$) method, overcomes the limitations of the FWHM method. Thus, in certain embodiments, the feedback metric for tailored pulses includes determining a $T_{IS}$ pulse duration or width, instead of using the common FWHM method. The following equation defines the $T_{IS}$ pulse width:

$$T_{IS} = \frac{\left(\int I(t)dt\right)^2}{\int I^2(t)dt},$$

where I(t) is the pulse curve in power versus time.

The $T_{IS}$ method has been used with 193 nm lithography systems. Pulse shapes of excimer lasers used for 193 nm lithography are oscillatory and may be described as several overlapping peaks that vary in relative intensity over the operating condition of the laser. Because damage to fused silica is a concern at 193 nm, a relevant method was sought to correlate the unusual shape of the 193 nm pulses to the anticipated damage to the silica. The $T_{IS}$ was proven to be effective for predicting compaction of fused silica and is an accepted standard in 193 nm lithography applications.

The $T_{IS}$ value correlates well with other pulse parameters such as energy density, pulse length, and peak power. The $T_{IS}$ method is useful because it captures the relevant characteristics of the pulse much better than does FWHM and allows correlation to the established damage models for fused silica.

Figure 28:
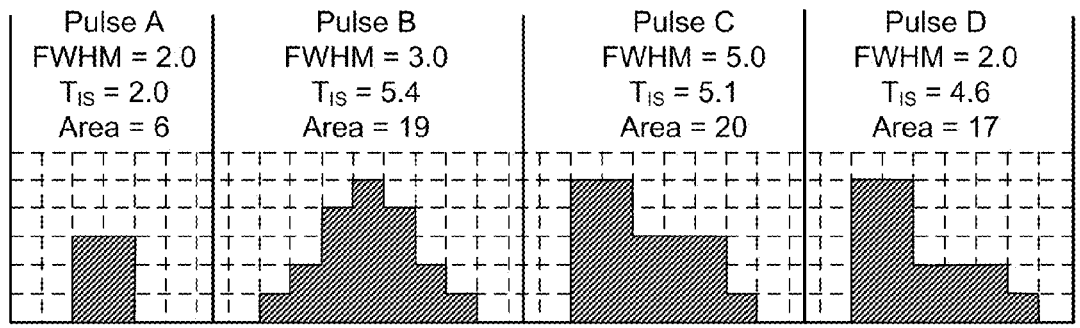
FIG. 28 illustrates four simplified pulse shapes (pulses A-D) and corresponding comparisons between FWHM and $T_{IS}$ pulse width values according to one embodiment.

FIG. 28 illustrates four simplified pulse shapes (pulses A-D) and corresponding comparisons between FWHM and $T_{IS}$ pulse width values. Pulse A shows that for any square pulse, the $T_{IS}$ value is approximately equal to the FWHM value. Pulse B shows that for more Gaussian-like shapes, the $T_{IS}$ is larger than the FWHM value (in this case, the FWHM value is 3.0 units while the resulting $T_{IS}$ pulse width is 5.4 units). Pulses C and D show simplified versions of chair-shaped tailored pulse with the chair height adjusted above and below the half-max power, respectively. For Peak C, the FWHM value and the $T_{IS}$ value are both approximately 5.0 units. Dropping the height of the chair power for Peak D provides a FWHM value of 2.0 units and a $T_{IS}$ value of 4.6 units, suggesting that $T_{IS}$ is a more effective method to capture the materials processing ability of the pulse.

Figure 29:
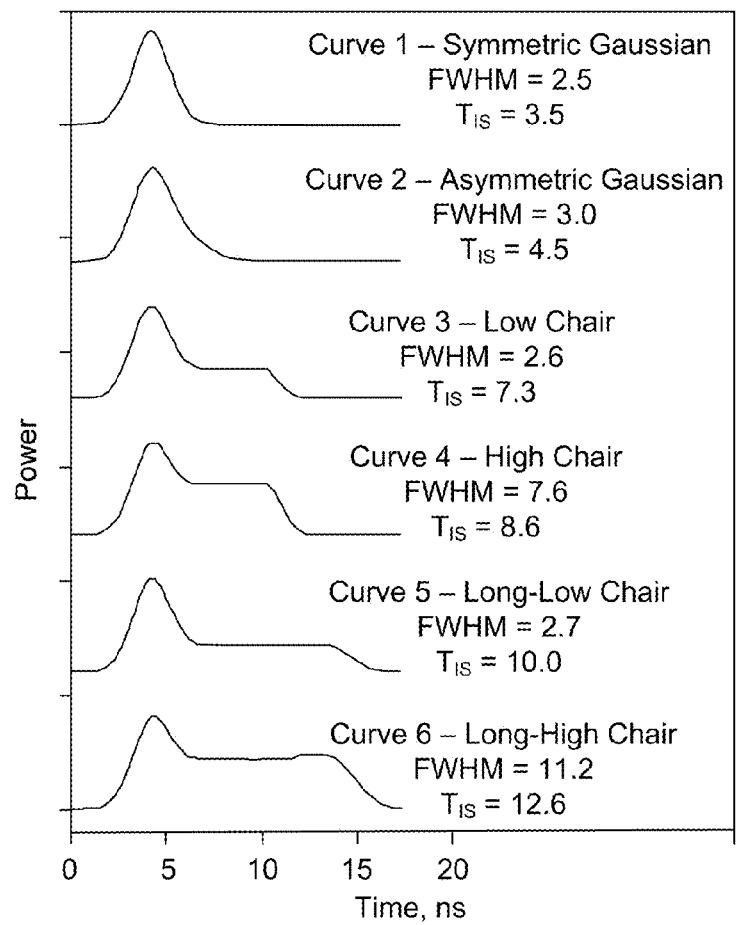
FIG. 29 illustrates six laser pulse shapes (curves 1-6) and corresponding comparisons between FWHM and $T_{IS}$ pulse width values according to one embodiment.

FIG. 29 illustrates six laser pulse shapes (curves 1-6) and corresponding comparisons between FWHM and $T_{IS}$ pulse width values. Curve 1 is a Gaussian shaped pulse with a FWHM value (2.5 ns) that is less than the $T_{IS}$ value (3.5 ns). Curve 2 shows that introducing a slight asymmetry into the pulse trailing edge yields a slightly larger value for $T_{IS}$ (4.5 ns) over that of FWHM (3.0 ns). Curves 3 through 6 are examples of the chair-shaped tailored pulse and demonstrate the advantage of using the $T_{IS}$ method over the FWHM method. This advantage is very apparent when the power of the chair height falls below the half-maximum. Comparing curves 3 and 4 shows that the FWHM value changes from 2.6 ns to 7.6 ns, while the $T_{IS}$ method provides a more reasonable value comparison of 7.3 ns to 8.6 ns, respectively. The same trend is observed for curves 5 and 6. Comparison of curves 3, 4, 5, and 6 also reveals that the $T_{IS}$ pulse width has a more reasonable trend that follows the actual pulse area and more closely relates to the results for laser-materials processing. Thus, in one embodiment, the feedback metric includes determining the $T_{IS}$ value of the generated pulse shape.

(vi) Comparison to a Stored Pulse Shape

In one embodiment, the feedback metric includes a determination of the standard deviation of the generated pulse shape from a stored nominal pulse shape.

(vii) Comparison to a Time Derivative of a Stored Pulse Shape

In another embodiment, the feedback metric includes a determination of the standard deviation of the time derivative of the generated pulse shape from the time derivative of the nominal pulse shape. A comparison of the time derivatives is useful, for example, for analyzing whether the measured pulse shape has a desired rise time. Other statistical metrics that may be used include, but are not limited to, using a root-mean-square (RMS), or an integral of an absolute error.

2. Feature Defining Parameters

The following example feedback metrics apply to specific portions or features of a pulse. In one embodiment, pulses are defined as a combination of characterized spikes, plateaus, and slopes.

(i) Spike Characterization

Figure 30:
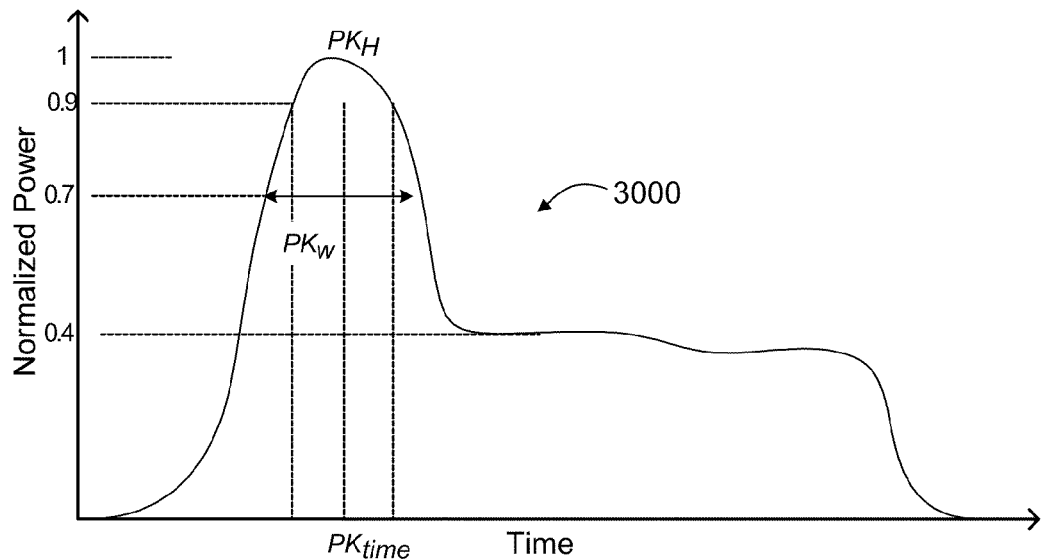
FIG. 30 graphically illustrates a normalized tailored laser pulse having a spike characterized by a peak height, a peak width, and a peak time according to one embodiment.

FIG. 30 graphically illustrates a normalized tailored laser pulse 3000 having a spike characterized by a peak height $PK_H$, a peak width $PK_w$, and a peak time $PK_{time}$ according to one embodiment. The peak height $PK_H$ is defined as the maximum power attained during a time interval containing the spike and no other features (e.g., no other spikes or plateaus). Because a pulse may include multiple spikes, a particular peak height $PK_H$ may differ from the overall pulse height or peak pulse power $P_{pk}$ discussed above in relation to FIG. 26.

The peak width $PK_w$ is defined as the width of the spike from the first time to the last time the spike obtains an amplitude that is mid-way between the peak height $PK_H$ and the amplitude of the highest feature (e.g., plateau) that precedes or succeeds the spike. The peak time $PK_{time}$ is the average of the first and last times that the peak power achieves 90% of the maximum value for that spike. Because it is an average of two times, the peak time $PK_{time}$ does not necessarily occur at the instant that the spike achieves its maximum power.

(ii) Plateau Characterization

Figure 31:
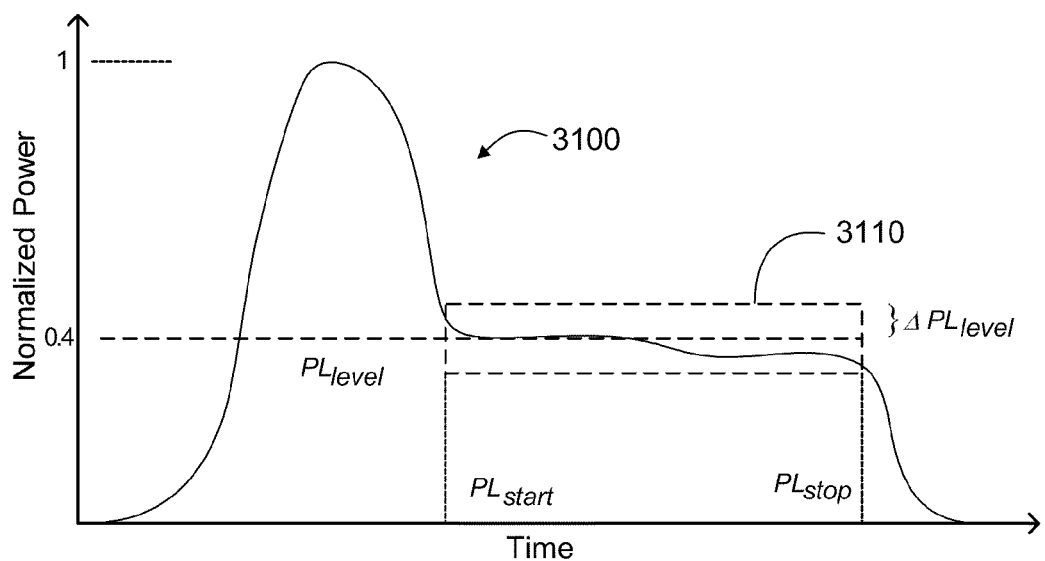
FIG. 31 graphically illustrates a normalized tailored laser pulse having a plateau characterized by a start time, a stop time, and a level associated with a tolerance according to one embodiment.

FIG. 31 graphically illustrates a normalized tailored laser pulse 3100 having a plateau characterized by a start time $PL_{start}$, a stop time $PL_{stop}$, and a level $PL_{level}$ associated with a tolerance $\Delta PL_{level}$ according to one embodiment. The start time $PL_{start}$ and stop time $PL_{stop}$ specify, respectively, the start and stop of the plateau relative to the pulse start time. The start time $PL_{start}$ and stop time $PL_{stop}$ parameters may be specified without tolerances. The plateau level $PL_{level}$ is the expected amplitude. Between the start time $PL_{start}$ and the stop time $PL_{stop}$, the amplitude remains inside of a box 3110 (shown with dashed lines) that is within a specified tolerance $+/-\Delta PL_{level}$ of the plateau.

(iii) Slope Characterization

Figure 32:
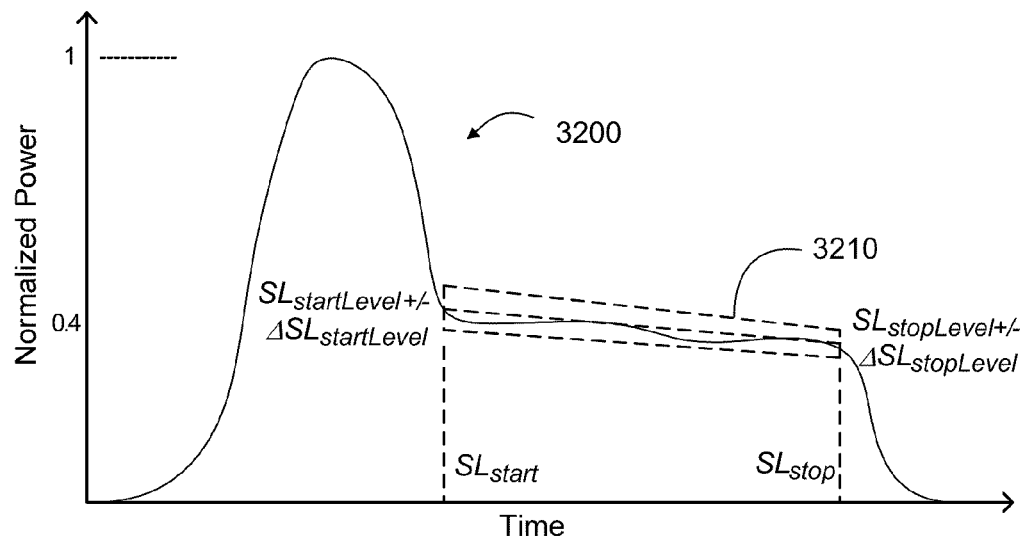
FIG. 32 graphically illustrates a normalized tailored laser pulse having a sloped or tilted plateau characterized by a start time, a stop time, a starting level associated with first a tolerance, and a stopping level associated with a second tolerance according to one embodiment.

FIG. 32 graphically illustrates a normalized tailored laser pulse 3200 having a sloped or tilted plateau characterized by a start time $SL_{start}$, a stop time $SL_{stop}$, a starting level $SL_{startLevel}$ associated with a tolerance $\Delta SL_{startLevel}$, and a stopping level $SL_{stopLevel}$ associated with a tolerance $\Delta SL_{stopLevel}$ according to one embodiment.

The start time $SL_{start}$ and stop time $SL_{stop}$ specify the start and stop of the plateau relative to the pulse start time. These parameters may be specified without tolerances. The start level $SL_{startLevel}+/-\Delta SL_{startLevel}$ is the expected starting amplitude and the stop level $SL_{stopLevel}+/-\Delta SL_{stopLevel}$ is the expected final amplitude. Between the start time $SL_{start}$ and the stop time $SL_{stop}$, the amplitude remains inside of a box 3210 (e.g., trapezoid shown with dashed lines) with end points identified by the starting and finishing level and tolerances.

(iv) Peak Power by Pulse Section

In one embodiment, the feedback metric includes measuring the peak height (power) of various sections of the generated pulse shape. For example, the peaks (e.g., maximum power levels) of the "back" and the "seat" of a chair-shaped pulse may be measured separately and compared to predetermined values for each. As another example, the power of each spike in a multi-spiked pulse may be measured separately and compared to predetermined values for each.

(v) Energy by Pulse Section

In one embodiment, the feedback metric includes measuring the energy of various sections of the generated pulse shape. For example, the energy of the "back" and the "seat" of a chair-shaped pulse may be measured separately and compared to predetermined values for each. As another example, the energy of each spike in a multi-spiked pulse may be measured separately and compared to predetermined values for each.

(vi) Characterization by Binned Shape Information

In one embodiment, the feedback metric includes determining binned shape information. For example, the laser system may have control over twelve time bins that are each approximately 2.5 ns wide. In such embodiments, the feedback includes shape information (e.g., power and energy) that corresponds to the same twelve bins for ease of adjustment.

3. Example Pulse Shape Characterization

Figure 33A:
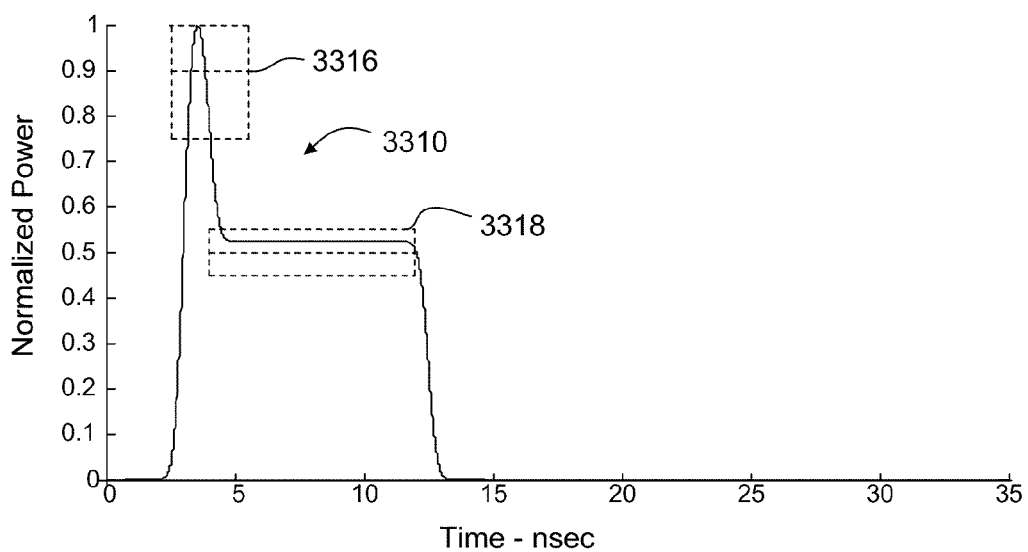
FIGS. 33A, 33B and 33C graphically illustrate example tailored laser pulses having various peaks, plateaus, and slopes characterized by the parameters described herein according to certain embodiments.
Figure 33B:
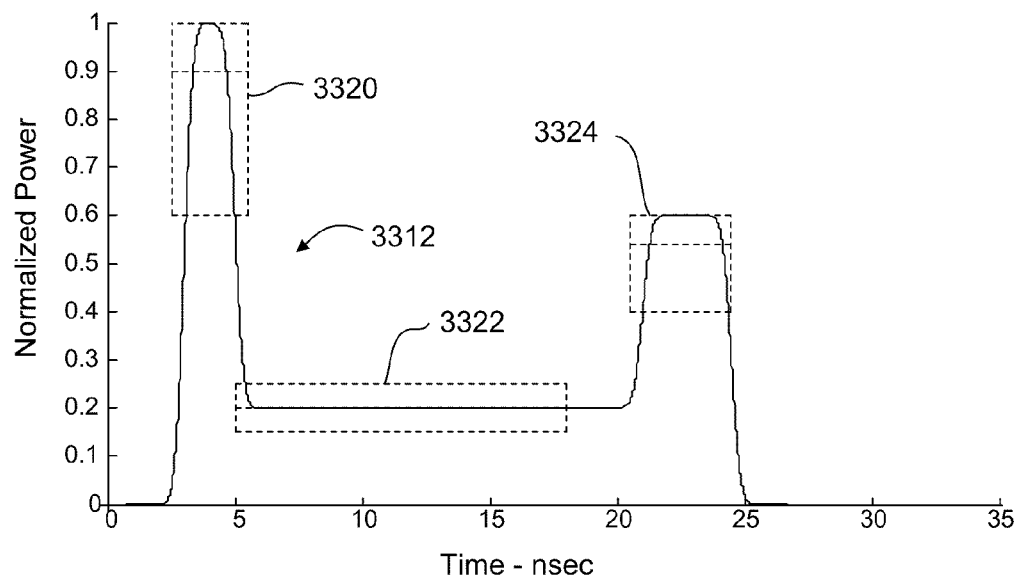
Figure 33C:
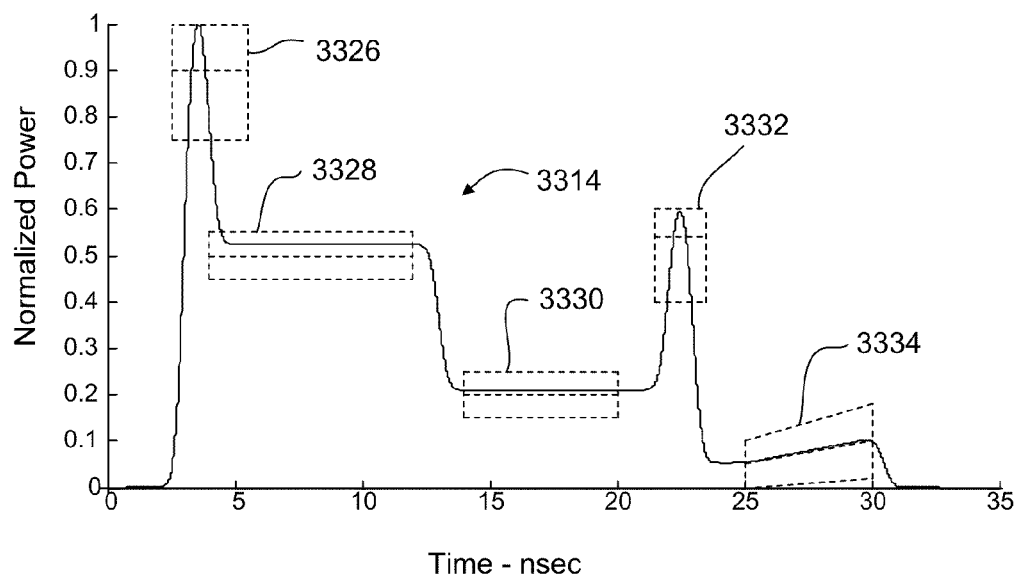

FIGS. 33A, 33B, and 33C graphically illustrate example tailored pulses 3310, 3312, 3314 having various spikes, plateaus, and slopes characterized by the parameters described herein according to certain embodiments. In FIG. 33A, a spike is defined as being within a set of parameters/tolerances represented by a first box 3316 and a plateau is defined as being within a set of parameters/tolerances represented by a second box 3318. Similarly, in FIG. 33B, a first spike is defined as being within a set of parameters/tolerances represented by a first box 3320, a plateau is defined as being within a set of parameters/tolerances represented by a second box 3322, and a second spike is defined as being within a set of parameters/tolerances defined by a third box 3324.

In FIG. 33C, a first spike is defined as being within a set of parameters/tolerances represented by a first box 3326, a first plateau is defined as being within a set of parameters/tolerances represented by a second box 3328, a second plateau is defined as being within a set of parameters/tolerances represented by a third box 3330, a second spike is defined as being within a set of parameters/tolerances defined by a fourth box 3332, and a sloping plateau is defined as being within a set of parameters/tolerances defined by a fifth box (e.g., trapezoid) 3334. An artisan will understand from the disclosure herein that the pulses illustrated in FIGS. 33A, 33B, and 33C are provided by way of example only and that methods described herein for characterizing pulses may be applied to pulses of any shape or having any number of spikes, plateaus and/or slopes.

Table 2 provides an example set of parameters that define a chair-shaped pulse according to one embodiment. An artisan will understand from the disclosure herein that the values listed in Table 2 for the various parameters are provided by way of example only, and not by limitation.

TABLE 2

| Parameter | Specified Value | Tolerance (+/−) | Units |
|---|---|---|---|
| Peak Time | 4 | 1 | nsec |
| Peak Width | 3.5 | 1 | nsec |
| Peak Height | 1 | 0.05 | normalized power |
| Plateau Start | 7 | — | nsec |
| Plateau Stop | W − 1 | — | nsec |
| Plateau Height | 0.6 | 0.05 | normalized power |
| Rise Time | 2 | 1 | nsec |
| 10% Duration | W − 2 | 2 | nsec |
| Peak Power | 1 | 0.05 | normalized power |

Figure 34A:
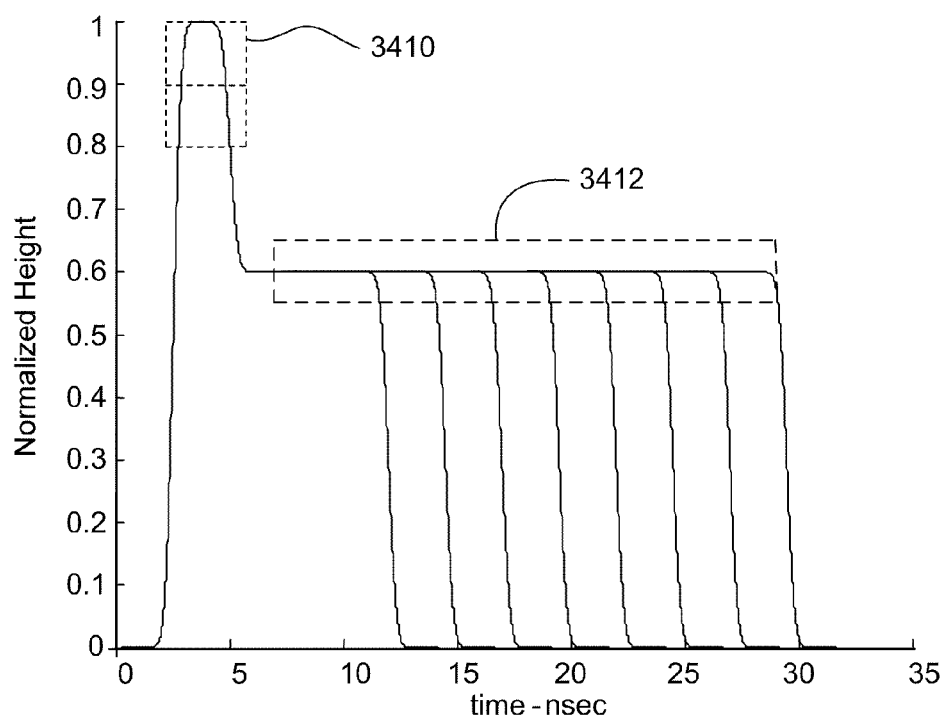
FIG. 34A graphically illustrates a plurality of tailored laser pulses as specified according to Table 2 according to one embodiment.
Figure 34B:
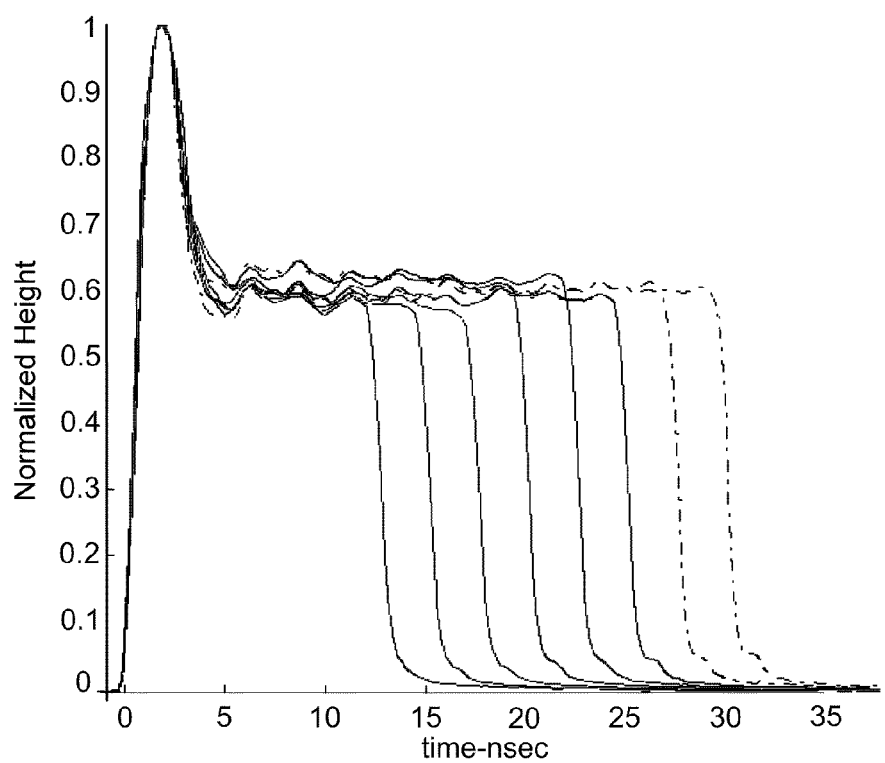
FIGS. 34B and 34C illustrate additional examples of tailored laser pulses according to certain embodiments.
Figure 34C:
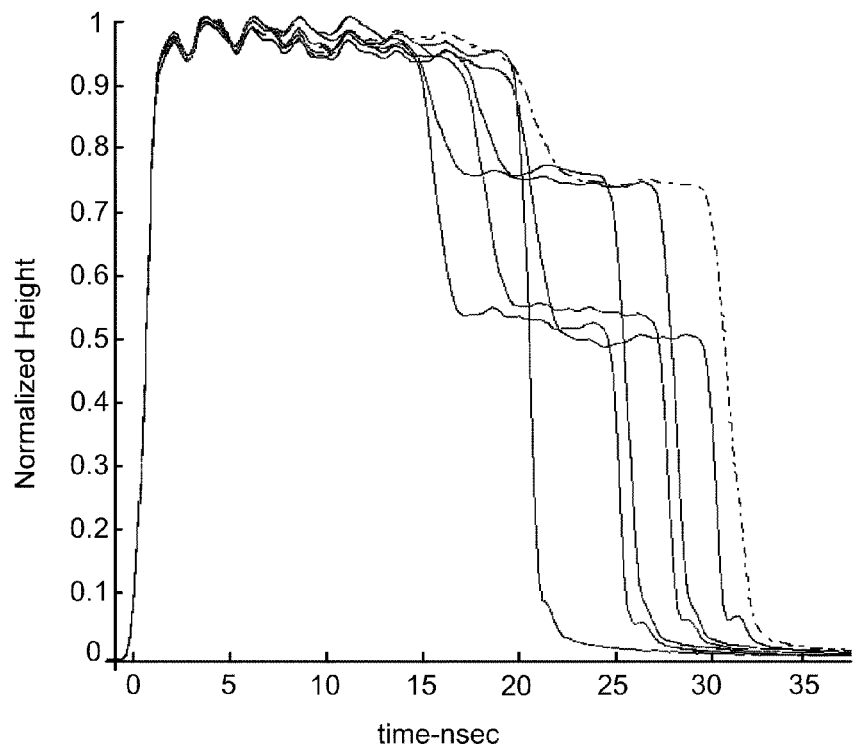

In Table 2, W is the chair width and may be varied to define a set of pulse shapes with different chair widths. For example, FIG. 34A graphically illustrates a plurality of tailored pulses (eight shown) as specified according to Table 2 with respective widths W=12.5, 15, 17.5, 20, 22.5, 25, 27.5, and 30. The values and tolerances shown in Table 2 define the characteristics of a spike within a first box 3410 and a plateau (with respective lengths W) within a second box 3412. FIGS. 34B and 34C illustrate additional examples of tailored laser pulses generated by a laser system according to certain embodiments.

4. Example Pulse Profiler

Figure 35:
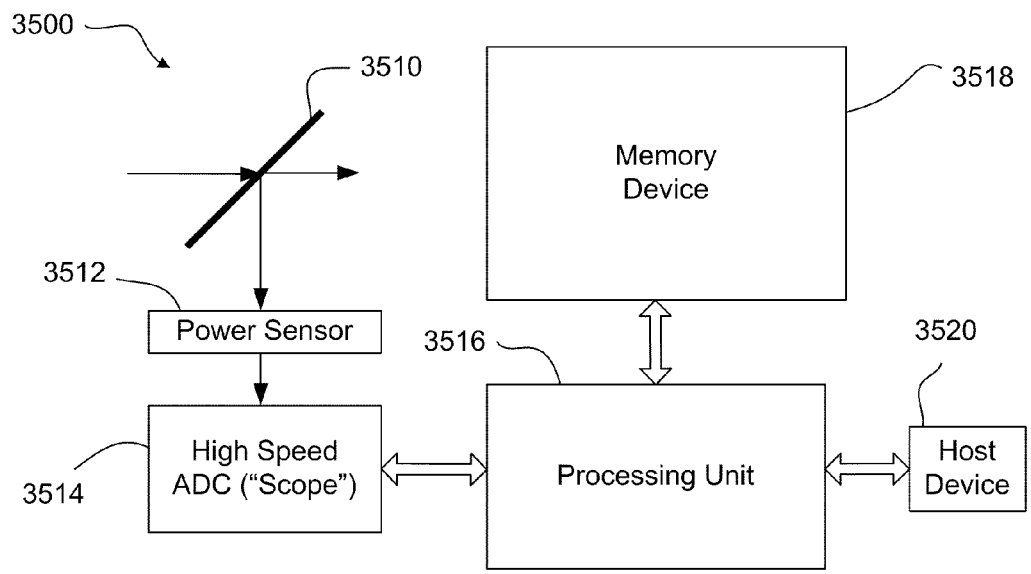
FIG. 35 is a block diagram of an example pulse profiler configured to provide feedback metrics of pulse shapes according to one embodiment.

FIG. 35 is a block diagram of an example pulse profiler 3500 configured to provide feedback metrics of pulse shapes according to one embodiment. The example pulse profiler 3500 includes an optical splitter 3510, a power sensor 3512, a high speed analog-to-digital converter (ADC) 3514 or "scope," a processing unit 3516, and a memory device 3518. In one embodiment, the processing unit 3516 is in communication with a host device 3520.

The optical splitter 3510 is configured to receive a laser pulse before it is delivered to a work surface, and to direct a portion of the laser pulse to the power sensor 3512. The analog output of the power sensor 3512 is provided to the high speed ADC 3514 to be properly conditioned and digitized. The power sensor 3512 and/or the high speed ADC 3514 may include appropriate logic to handle triggering on the relatively fast pulse shape (e.g., total temporal width of approximately 50 ns), which in some embodiments is received at a pulse repetition rate of approximately 100 kHz.

The high speed ADC 3514 provides data to the processing unit 3516 corresponding to the individual pulses. The processing unit 3516 filters the data and uses the filtered data to compute one or more of the metrics described above. The processing unit 3516 may send the computed metrics to the host device 3520 for process monitoring and, in some embodiments, process control. The memory device 3518 is configured to record the data corresponding to the temporal pulse shapes and/or the corresponding computed metrics. In one embodiment, the data corresponding to the temporal pulse shapes are loaded into a circular buffer (not shown) and retrieved offline for study of the actual pulse shapes as opposed to runtime monitoring of the pulse shape metrics.

The pulse profiler 3500 may periodically or continuously compute the feedback metrics through either an automatic procedure or in response to a user command. The pulse profiler 3500 may compute the feedback metrics on every generated laser pulse, a large fraction of the generated laser pulses, or a small fraction of the generated laser pulses. The pulse profiler 3500 may also compute the feedback metrics when an external metric, such as a fixed-to-attempted ratio deviates from a normal or expected value.

When analysis of pulse shape data using the feedback metrics described above indicates that a pulse shape is nonoptimal or is not within specified tolerances, the system may perform one or more corrective actions. For example, the system may display a warning to indicate that a pulse shape calibration is desired. In addition, or in another embodiment, the system may interrupt processing, prompt a user (e.g., a service engineer) to adjust the pulse shape, and restart processing.

In another embodiment, as discussed below, the system may automatically calculate one or more laser system input parameters to produce an improved pulse shape. The system may automatically implement these reconfigured parameters. In addition, or in another embodiment, the system may prompt a user (e.g., an operator or service engineer) to implement the automatically calculated system input parameters.

B. Pulse Shape Control

As discussed above, the information provided from pulse shape feedback may be used in many different ways with respect to pulse shape control. When providing multiple laser processing systems to a particular user, the process developed on one system may be reproduced on the other systems. Thus, according to one embodiment, each system is configured to reproduce the same nominal pulse shapes. The feedback provided by the various systems may be used to adjust the respective lasers as required during laser processing of a material or during a pulse shape setup procedure configured to provide this reproduction.

The information may also be used to provide pulse shape stability over time. For fiber laser or MOFPA based tailored pulse systems, for example, the pulse shape may distort as a function of the laser power available from the laser head. Or, the distortion may be due to degradation of laser system components, such as pump diodes or gain modules. Thus, runtime feedback is used in certain embodiments to adjust the pulse shapes periodically to maintain stability over time.

In one embodiment, an iterative learning method is used for pulse shape control. In the iterative learning algorithm, a waveform that is expected to repeat is compared to a nominal waveform and small adjustments are made to the appropriate control parameters until the measured shape converges to the nominal shape. The iterative learning algorithm is very effective at reproducing waveforms in non-linear environments and is particularly well suited to adjusting control parameters of tailored pulse shapes.

In certain embodiments, repetitive control techniques may be used to generate laser pulses with desired pulse shapes. Repetitive control/repetitive feed forward (FF) control uses an adaptive, evolving, or learning element to produce a desired outcome (e.g., pulse shape) from an input signal (e.g., a voltage applied to an acousto-optic deflector, an acousto-optic modulator, an electro-optic defector, or an electro-optic modulator) that can be changed to provide different pulse temporal profiles. Input parameters may also be controlled to program a laser power supply that is configured to receive amplitude commands in different bin command signals. Repetitive control may achieve a desired outcome even if the relationship between input and output is nonlinear.

In certain embodiments, a user is allowed to input a desired pulse shape, repetitive control techniques converge on the proper input signals to achieve this pulse shape, and a laser is appropriately configured. In addition, or in other embodiments, through application of repetitive control, system-to-system and laser-to-laser variability may be reduced or eliminated. Further, long-term/mid-term transient effects such as thermal shifts or degradation effects may be tuned out through application of repetitive control techniques. This type of tuning technique may be applied to any laser in which the output is shaped in terms of amplitude and/or time. The tuning technique may also be applied to fiber lasers, MOFPAs, or other types of lasers. The tuning technique may be applied in an occasional calibration step or continuously during system operation.

V. Example "Sliced" Pulse Laser

Figure 36:
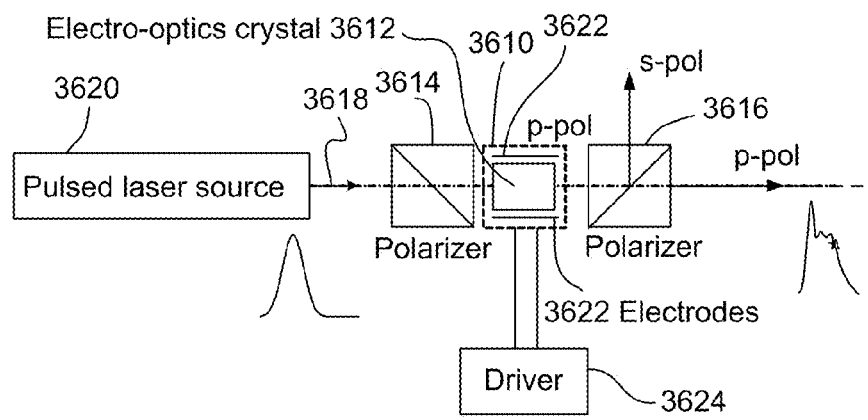
FIG. 36 is a simplified block diagram of an electro-optical modulator operating as a laser pulse slicing device in the production of tailored laser pulse output according to one embodiment.

FIG. 36 shows an electro-optical modulator 3610 that may be implemented in laser pulse "slicing" systems according to certain embodiments to produce tailored laser pulse output. The electro-optical modulator 3610 includes an electro-optical crystal cell 3612 that is positioned between light polarizing devices (polarizers) 3614, 3616 and receives a beam of laser pulses 3618 emitted by a pulsed laser source 3620. The electro-optical crystal cell 3612 has electrodes 3622 to which drive output signals of driver circuitry 3624 are applied to contribute to shaping of incident laser pulses 3618. The pulsed laser source 3620 can be any pulsed laser emitting a laser pulse of a pulse width within a range of a few nanoseconds to 100 ns. The electro-optical crystal cell 3612 can be made of KDP, KD*P, ADP, AD*P, RTP, RTA, BBO, $LiNbO_3$, or other electro-optical materials. One example of a suitable electro-optical crystal cell 3612 is a LightGate 4 BBO Pockels cell manufactured by Cleveland Crystals, Inc., of Highland Heights, Ohio. The LightGate 4 cell can operate at 100 KHz, and its geometry minimizes the drive voltage to about 1.3 KV quarter-wave retardation at 355 nm. The LightGate 4 cell has only 4 pf capacitance, which provides a possibility of less than 2 ns rise and fall optical response times. One example of suitable driver circuitry 3624 is a high-voltage, fast switching time Pockels cell driver that is available from Bergmann Messegeraete Entwicklung, KG, Murnau, Germany.

A BBO based electro-optical modulator 3610 operates as a quarter-wave rotator in response to a quarter-wave drive voltage applied to electrodes 3622 of the electro-optic crystal cell 3612. The pulsed laser beam 3618 passes through the polarizer 3614 to become p-polarized (p-pol) as shown. The laser beam 3618 travels once through the BBO crystal cell 3612. When no drive voltage is applied to the electrodes 3622 of the BBO crystal cell 3612, the laser pulses remain in the p-pol state and pass through the polarizer 3616. When a quarter-wave drive voltage at the laser wavelength is applied to electrodes 3622 of the BBO crystal cell 3612, the polarization direction of the beam rotates 90 degrees and become s-polarized (s-pol). When a drive voltage applied to electrodes 3622 of BBO crystal cell 3612 is between 0 and the quarter-wave voltage, the portion of polarized laser beam 3618 transmitted from polarizer 3616 is approximately expressed as $$T=\sin^2[(\pi/2)(V/V_{1/2})],$$

where T is the transmission of the laser beam from the polarizer 3616, V is the voltage applied to the electrodes 3622 of the electro-optical crystal cell 3612, and $V_{1/2}$ is the half-wave voltage.

Figure 37:
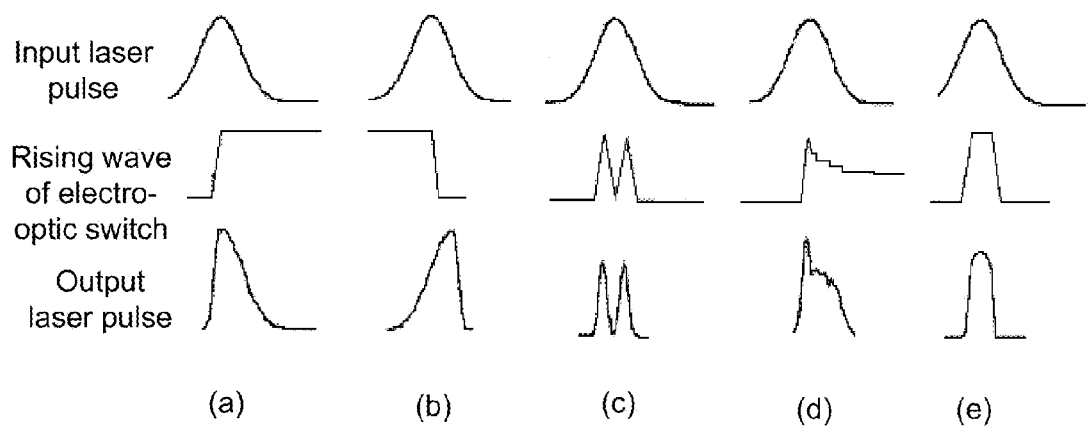
FIG. 37 shows in columns (a), (b), (c), (d), and (e) examples of five possible laser pulse shape formations produced by the laser pulse slicing device of FIG. 36.

Based on the above expression, the controllable transmission, T, of the electro-optical modulator 3610 provides a laser pulse shaping function. Theoretically, the transmission of the electro-optical crystal cell 3612 and the polarizers 3614, 3616 can be about 0%-100%. FIG. 37 shows five examples of possible laser pulse shapes. FIG. 37 shows as column (a) one example of pulse shaping, in which the transmission changes from 0% to 100% with less than a 2 ns rise time for the laser pulse to reach its peak and thereby provide a fast rising leading edge of the laser pulse. Skilled persons will recognize that in an alternative arrangement, known in the art as a double-pass configuration, a quarter-wave voltage may be employed to achieve a desired level of polarization rotation, but that this improved efficiency is gained at the expense of greater optical alignment complexity.

Rise and fall times are related to the voltage and capacitance of the electro-optical cell, the switching time of drive circuit transistors, the repetition rates, and overall electrical power consumption. Lower voltage and capacitance of the electro-optical cell contribute to its fast response time; therefore, selection of a proper material for the electro-optical cell is important. Skilled persons will recognize that BBO and RTP exhibit useful material characteristics for implementation in electro-optical modulators. Koechner, Solid-State Laser Engineering, Springer-Verlag states, for a longitudinal electro-optical cell in which the electric field is applied parallel to the crystal optic axis and in the same direction as the incident light, that phase difference, δ, is related to the applied voltage in a crystal of length, l, by $$\delta=(2\pi/\lambda)n_0^3 r_{63} V_z,$$

where $V_z=E_z l$.

To obtain half-wave retardation, a Pockels cell produces a phase difference $\delta=\pi$. In this case, for linearly polarized light incident on the Pockels cell, the output beam is also linearly polarized but with a plane of polarization rotated by 90 degrees. By incorporation of polarizing optics well known in the art, the Pockels cell can function as a voltage-controlled optical modulator. Koechner expresses the transmission, T, dependence of such a device as:

$$T=\sin^2[(\pi/2)(V/V_{1/2})],$$

where the half-wave voltage is given by $V_{1/2}=\lambda/2n_0^3 r_{63}$.

For a transverse electro-optical crystal cell, in which the electric field is applied perpendicularly to the direction of the beam, the half-wave voltage is given by $$V_{1/2}=\lambda d/2n_0^3 r_{63} l.$$

This type of electro-optical crystal cell has the useful attribute that the half-wave voltage depends on the ratio of crystal thickness to length and, by proper selection of these parameters, electro-optical crystal cells may be designed that operate at lower applied voltages than those applied to longitudinal electro-optical crystal cells to achieve a given phase difference.

Skilled persons will recognize that the term $r_{63}$ in the above equations represents the electro-optic coefficient for phosphates of the KDP family. RTP crystal is an important member of this family and is a preferred electro-optical crystal material for the preferred embodiments described for use with 1064 nm laser input. BBO crystal is preferably used with 355 nm laser input.

RTP crystal has a low voltage requirement (about 1.6 KV for π or half-wave retardation and a 3.5 mm aperture) for 1064 nm laser input and can operate to a 10 MHz repetition rate. RTP crystal cannot perform well when the average power is generally more than 10 W or is not suitable for UV applications because of transparency restrictions. For these latter applications as noted above, BBO is preferred. In practice, it is difficult to drive BBO at 100 KHz for 1064 nm laser because of the high voltage requirement (about 6 KV at half-wave retardation). Therefore, the RTP electro-optical crystal cell is the currently preferred choice for a 1064 nm laser, and the BBO electro-optical crystal cell is preferred for 355 nm laser (about 1.3 KV at half-wave retardation for a LightGate 4 BBO Pockels cell). Other electro-optical materials, such as KDP, RTA, and ADP, have main limitations on use at high repetition rates and pulse modulation because of piezo-electric (PE) resonances. Faster rise and fall times result in higher frequency components, so there is a greater chance that one of these frequency components will fall into the principal resonance frequencies. This is especially true of a fast rise time tailored pulse, which contains many frequency components that extend in frequency well above the fundamental repetition rate.

To generate tailored pulse shapes, the embodiments are implemented with a "fast multi-state" (FMS) electro-optical modulator that is designed to avoid PE resonances. For 1064 nm laser output, this is accomplished by using an electro-optical cell made of RTP crystal material and short electrical pulses, which do not generate significant PE resonances. Pulse lengths on the order of nanoseconds result in relatively low PE resonances. For example, an RTP electro-optical crystal cell can reach a repetition rate of 10 MHz for 5% duty cycle pulses.

Another concern of obtaining fast rising and falling time is the design of the electro-optical modulator driver. There is no actual limitation of an electro-optical crystal cell preventing it from producing sub-nanosecond or picosecond switching times; therefore, a fast switching time depends mainly on the electrical driver. Skilled persons recognize that there are two principal types of electrical switchers: avalanche transistor and MOSFET. The transistors operate within a very limited voltage range to attain the fastest switching time. A stack of 7 to 10 transistors may be used to operate in the 1.6 KV range. Avalanche transistors can achieve a 2 ns switching time, but their repetition rates are limited to less than 10 KHz. For higher repetition rates, MOSFETs are currently preferred, because, generally, they have a 1 ns response time and maximum 1 KV operating voltage. A stack of at least 2 to 3 MOSFETs is used to operate in the 1.6 KV range.

The selection of MOSFETs and circuit design are, therefore, germane to accomplish FMS pulse modulation. In particular, the driver circuit power consumption is of concern because it is proportional to the square of the peak operating voltage. For example, a BBO electro-optical cell operating at about 6 KV requires approximately 3,614 times as much power consumption as that of an RTP electro-optical cell operating at 1.6 KV to achieve a comparable phase shift at a given repetition rate. Skilled persons will recognize that lowering the operating voltage reduces the power consumption. It is possible to reduce the number of MOSFETs, which in turn provides better performance of FMS pulse modulation through judicious choice of the aperture size and resulting drive voltage. In one embodiment of a transverse electro-optical modulator, a reduction in the apertures of RTP and BBO electro-optical crystal cells to about 2 mm gives corresponding reductions in half-wave retardation voltages to about 2600 V and 4 KV at 1064 nm, for RTP and BBO electro-optical crystal cells, respectively.

An FMS electro-optical modulator is capable of multiple programmable steps of modulation, in which each step has a rise time of less than about 4 ns and a fall time of less than about 4 ns, and more preferably, in which each step has a rise time of less than about 2 ns and a fall time of less than about 2 ns. An operational advantage of the disclosed embodiments is that they provide a tailored pulse shape that may be programmed to have more than one amplitude value. Another such operational advantage is the capability of providing programmable tailored pulse shapes with discrete amplitude and time duration components. Such capability is particularly useful in the production of tailored pulse output with a pulse shape of the type shown at (a) in FIG. 37. This pulse shape has, with respect to the first amplitude maximum, a total fall time that is substantially longer than the rise time to the first amplitude maximum.

Embodiments may be implemented with one or more electro-optical modulators receiving drive signals that selectively change the amount of incident pulsed laser emission to form a tailored pulse output. Triggering the drive signal from the pulsed laser emission suppresses jitter associated with other stages of the system and substantially removes jitter associated with pulsed laser emission build-up time. The tailored pulses can be power-scaled for harmonic generation to shorter wavelengths.

It will be understood by those having skill in the art that many changes may be made to the details of the above-described embodiments without departing from the underlying principles of the invention. The scope of the present invention should, therefore, be determined only by the following claims.

The invention claimed is:

1. A method for laser dicing a workpiece using a plurality of different temporal pulse profiles that are changed on-the-fly, the workpiece including one or more device layers formed over a semiconductor substrate, the one or more device layers including a pattern of multiple, mutually spaced apart electronic circuit components separated by one or more streets along which a laser beam can form a kerf defined by side walls, the method comprising:

selecting a first temporal pulse profile shape and a second temporal pulse profile shape;

generating, using a single laser source, a first laser pulse train including a sequence of laser pulses temporally shaped according to the first temporal pulse profile shape and a second laser pulse train including a sequence of laser pulses temporally shaped according to the second temporal pulse profile shape;

in a first pass of the laser beam along a street, directing the first laser pulse train to the workpiece to remove at least a first portion of the one or more device layers along the street; and in a second pass of the laser beam along the street, directing the second laser pulse train to the workpiece to cut through the semiconductor wafer along the street.

2. The method of claim 1, wherein the first temporal pulse profile shape comprises a chair-shaped temporal pulse profile.

3. The method of claim 2, wherein the first temporal pulse profile shape comprises a temporal pulse duration in a range between about 12 nanoseconds and about 14 nanoseconds.

4. The method of claim 3, wherein the second temporal pulse profile shape is selected from a group comprising a Gaussian-shaped temporal pulse profile, a square-shaped temporal pulse profile, and a triangle-shaped temporal pulse profile.

5. The method of claim 1, wherein the second temporal pulse profile shape comprises a temporal pulse duration in a range between about 1 nanosecond and about 3 nanoseconds.

6. The method of claim 1, wherein the workpiece is mounted on a die attach film (DAF), the method further comprising:

selecting a third temporal pulse profile shape;

generating, using the single laser source, a third laser pulse train including a sequence of laser pulses temporally shaped according to the third temporal pulse profile shape; and in a third pass of the laser beam along the street, directing the third laser pulse train to the workpiece to cut through the DAF along the street.

7. The method of claim 6, wherein the third temporal pulse profile shape comprises a temporal pulse duration in a range between about 40 nanoseconds and about 400 nanoseconds, and wherein the third temporal pulse profile shape is selected from a group comprising a Gaussian-shaped temporal pulse profile and a square-shaped temporal pulse profile.

8. The method of claim 7, the method further comprising:

selecting a fourth temporal pulse profile shape;

generating, using the single laser source, a fourth laser pulse train including a sequence of laser pulses temporally shaped according to the fourth temporal pulse profile shape; and in a fourth pass of the laser beam along the street, directing the third laser pulse train to the workpiece to anneal side walls of a kerf cut along the street to increase die break strength.

9. The method of claim 8, wherein the fourth temporal pulse profile shape comprises a temporal pulse duration in a range between about 50 nanoseconds and about 100 nanoseconds, and wherein the fourth temporal pulse profile shape is selected from a group comprising a Gaussian-shaped temporal pulse profile and a square-shaped temporal pulse profile.

10. The method of claim 1, further comprising:

spatially shaping the sequence of laser pulses in at least one of the first laser pulse train and the second laser pulse train.

11. The method of claim 1, further comprising:

changing a peak intensity of a first laser pulse with respect to a second laser pulse in the sequence of laser pulses in at least one of the first laser pulse train and the second laser pulse train.

12. The method of claim 1, wherein the first laser pulse train comprises a mono-shape laser pulse train, the method further comprising:

selecting a third temporal pulse profile shape;

generating, using the single laser source, a third laser pulse train including a sequence of laser pulses temporally shaped according to the third temporal pulse profile shape; and in a third pass of the laser beam along the street, the third pass occurring between the first pass and the second pass, directing the third laser pulse train to the workpiece to remove at least a second portion of the one or more device layers along the street.

13. The method of claim 1, wherein the first laser pulse train comprises a mixed-shape laser pulse train, the method further comprising:
selecting a third temporal pulse profile shape, wherein generating the first laser pulse train further comprises generating at least one laser pulse shaped according to the third temporal pulse profile shape;
associating the first temporal pulse profile shape with a first class of structure within the one or more device layers;
associating the third temporal pulse profile shape with a second class of structure within the one or more device layers; and
in the first pass of the laser beam along the street, directing the at least one laser pulse shaped according to the third temporal pulse profile shape to a structure on or within the one or more device layers associated with the second class of structure.

14. The method of claim 1, wherein the first laser pulse train comprises a mixed-shape laser pulse train, the method further comprising:
selecting a third temporal pulse profile shape, wherein generating the first laser pulse train further comprises generating a plurality of laser pulses shaped according to the third temporal pulse profile shape;
in the first pass of the laser beam along the street, dithering the laser beam back and forth between opposite side walls of a kerf formed by application of the laser beam to the one or more device layers;
as a path of the laser beam passes through a central location between the opposite side walls during the dithering, directing one or more pulses of the first laser pulse train shaped according to the first temporal pulse profile shape to the workpiece; and
as the path of the laser beam passes proximate to each of the opposite side walls during the dithering, directing one or more pulses of the first laser pulse train shaped according to the third temporal pulse profile shape to the workpiece.

15. The method of claim 1, wherein the first laser pulse train comprises a mixed-shape laser pulse train, the method further comprising:
selecting a third temporal pulse profile shape, wherein generating the first laser pulse train further comprises generating a plurality of laser pulses shaped according to the third temporal pulse profile shape;
in the first pass of the laser beam along the street, changing at least one of a velocity and an acceleration of the laser beam with respect to the workpiece;
before changing at least one of the velocity and the acceleration, directing one or more pulses of the first laser pulse train shaped according to the first temporal pulse profile shape to the workpiece; and
during the change in at least one of the velocity and the acceleration, directing one or more pulses of the first laser pulse train shaped according to the third temporal pulse profile shape to the workpiece.

16. The method of claim 1, wherein the first laser pulse train comprises a mixed-shape laser pulse train, the method further comprising:
selecting a third temporal pulse profile shape, wherein generating the first laser pulse train further comprises generating a plurality of laser pulses shaped according to the third temporal pulse profile shape, and
wherein during the first pass of the laser beam along the street, a focused beam waist of the laser beam changes depth with respect to a surface of the one or more device layers;
at a first depth of the focused beam waist with respect to the surface of the one or more device layers, directing one or more pulses of the first laser pulse train shaped according to the first temporal pulse profile shape to the workpiece; and
at a second depth of the focused beam waist with respect to the surface of the one or more device layers, directing one or more pulses of the first laser pulse train shaped according to the third temporal pulse profile shape to the workpiece.

17. A method for laser processing a workpiece using a plurality of different temporal pulse profiles that are changed on-the-fly, the method comprising:
generating, from a single laser source, a mixed-shape laser pulse train comprising:
one or more first laser pulses temporally shaped according to a first temporal pulse profile shape; and
one or more second laser pulses temporally shaped according to a second temporal pulse profile shape;
arranging a sequence of the one or more first laser pulses and the one or more second laser pulses in the mixed-shape laser pulse train based on a pulse repetition frequency of the single laser source, a plurality of target locations on or within the workpiece, and a motion profile of a laser beam with respect to the target locations; and
in a single pass of the laser beam along the workpiece according to the motion profile, directing the one or more first laser pulses and the one or more second laser pulses to the respective target locations.

18. The method of claim 17, wherein the sequence is further based on:
directing the one or more first laser pulses shaped according to the first temporal pulse profile shape to a first class of structure at a first target location; and
directing the one or more second laser pulses shaped according to the second temporal pulse profile shape to a second class of structure at a second target location.

19. The method of claim 18, wherein the first class of structure comprises a dielectric, and wherein the second class of structure comprises a metal.

20. The method of claim 18, wherein the first class of structure comprises a non-intersecting region corresponding to a single feature of the workpiece, and wherein the second class of structure comprises an intersecting region corresponding to two or more overlapping features.

21. The method of claim 20, wherein the two or more overlapping features comprise an intersection of two scribe lines.

22. The method of claim 17, wherein the sequence is further based on processing a particular portion on or within a target structure.

23. The method of claim 22, wherein the motion profile corresponds to dithering the laser beam back and forth between opposite side walls of a kerf formed by application of the laser beam to the workpiece, and wherein the sequence is selected such that:
as a path of the laser beam passes through a central location between the opposite side walls during the dithering, the one or more first laser pulses are directed to the workpiece; and as the path of the laser beam passes proximate to each of the opposite side walls during the dithering, the one or more second laser pulses are directed to the workpiece.

24. The method of claim 22, wherein the motion profile corresponds to forming a via in the workpiece, and wherein the sequence is selected such that:
- at a first depth of the via, the one or more first laser pulses are directed to the workpiece; and
- at a second depth of the via, the one or more second laser pulses are directed to the workpiece.

25. The method of claim 17, wherein the motion profile includes changing at least one of a velocity and an acceleration of the laser beam with respect to the workpiece, and wherein the sequence is further based on:
- before changing at least one of the velocity and the acceleration, directing the one or more first laser pulses to the workpiece; and
- during the change in at least one of the velocity and the acceleration, directing the one or more second laser pulses to the workpiece.

26. The method of claim 17, wherein a focused beam waist of the laser beam changes depth with respect to a surface of the workpiece, and wherein the sequence is further based on:
- at a first depth of the focused beam waist with respect to the surface of the workpiece, directing the one or more first laser pulses to the workpiece; and
- at a second depth of the focused beam waist with respect to the surface of the workpiece, directing the one or more second laser pulses to the workpiece.

27. The method of claim 26, wherein arranging the sequence is based at least in part on a focusing error corresponding to the changes in the depth of the focus beam waist with respect to the surface of the workpiece.

* * * * *